(12) United States Patent
Yeo et al.

(10) Patent No.: US 12,300,559 B2
(45) Date of Patent: May 13, 2025

(54) SEMICONDUCTOR PACKAGES AND METHODS FOR MANUFACTURING THEREOF

(71) Applicant: Infineon Technologies AG, Neubiberg (DE)

(72) Inventors: Si Hao Vincent Yeo, Melaka (MY); Chan Lam Cha, Melaka (MY); Ying Dieh Cheong, Melaka (MY); Chau Fatt Chiang, Melaka (MY); Cher Hau Danny Koh, Malacca (MY); Wern Ken Daryl Wee, Melaka (MY); Swee Kat Lee, Melaka (MY); Desmond Jenn Yong Loo, Melaka (MY); Fortunato Lopez, Unterhaching (DE); Norliza Morban, Melaka (MY); Khay Chwan Andrew Saw, Melaka (MY); Sock Chien Tey, Melaka (MY); Mei Yong Wang, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 215 days.

(21) Appl. No.: 17/552,914

(22) Filed: Dec. 16, 2021

(65) Prior Publication Data
US 2022/0199478 A1    Jun. 23, 2022

(30) Foreign Application Priority Data
Dec. 17, 2020  (DE) .......................... 102020134031.1
Nov. 15, 2021  (DE) .......................... 102021129753.2

(51) Int. Cl.
  *H01L 23/31*    (2006.01)
  *H01L 21/56*    (2006.01)
  *H01L 23/495*   (2006.01)

(52) U.S. Cl.
  CPC .......... *H01L 23/3114* (2013.01); *H01L 21/56* (2013.01); *H01L 23/49503* (2013.01)

(58) Field of Classification Search
  CPC ... H01L 23/3114; H01L 21/56; H01L 21/561; H01L 2924/181; H01L 23/49503; H01L 23/3144
  See application file for complete search history.

(56) References Cited

U.S. PATENT DOCUMENTS

| | | | |
|---|---|---|---|
| 5,208,188 A * | 5/1993 | Newman | H01L 23/49527 257/E23.035 |
| 2005/0167791 A1 | 8/2005 | Youn et al. | |
| 2006/0014326 A1 | 1/2006 | Auburger et al. | |
| 2006/0267162 A1 | 11/2006 | Kunie | |
| 2008/0009097 A1 | 1/2008 | Lim | |
| 2008/0160658 A1 | 7/2008 | Wang et al. | |

(Continued)

FOREIGN PATENT DOCUMENTS

| | | | |
|---|---|---|---|
| JP | 2013214738 A | 10/2013 | |
| WO | WO-9320586 A1 * | 10/1933 | ....... H01L 23/49503 |

*Primary Examiner* — Walter H Swanson
*Assistant Examiner* — Jacob T Nelson
(74) *Attorney, Agent, or Firm* — Murphy, Bilak & Homiller, PLLC

(57) ABSTRACT

A package includes a dielectric carrier, an electronic component mounted on the dielectric carrier, and an encapsulant encapsulating at least part of the dielectric carrier and the electronic component. Corresponding methods of manufacturing the package are also described.

15 Claims, 24 Drawing Sheets

(56) References Cited

U.S. PATENT DOCUMENTS

| | | |
|---|---|---|
| 2009/0305076 A1 | 12/2009 | Wong et al. |
| 2010/0044885 A1 | 2/2010 | Fuergut et al. |
| 2010/0193922 A1 | 8/2010 | Kastner et al. |
| 2012/0009737 A1 | 1/2012 | Kuratomi et al. |
| 2012/0175768 A1 | 7/2012 | Saito |
| 2014/0001620 A1* | 1/2014 | Shimizu .............. H01L 23/4952 257/676 |
| 2015/0130045 A1 | 5/2015 | Tseng et al. |
| 2015/0130047 A1 | 5/2015 | Tseng et al. |
| 2015/0380384 A1* | 12/2015 | Williams .......... H01L 21/31058 438/112 |
| 2017/0221804 A1* | 8/2017 | Taguchi ............ H01L 23/49517 |
| 2017/0338170 A1* | 11/2017 | Ziglioli ................ H01L 21/565 |
| 2019/0385939 A1* | 12/2019 | St. Germain ......... H01L 21/568 |
| 2020/0411421 A1* | 12/2020 | Teysseyre ............... H01L 24/41 |

\* cited by examiner

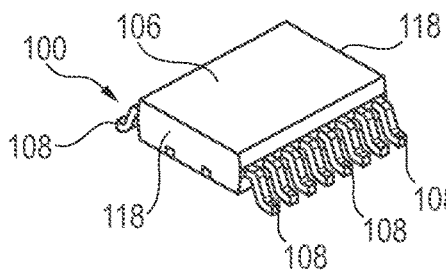
Fig. 1
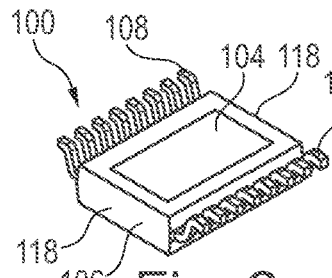
Fig. 2
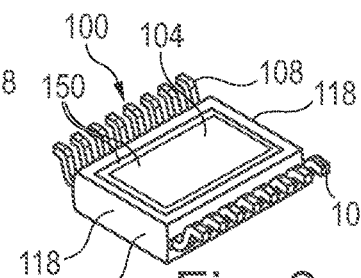
Fig. 3
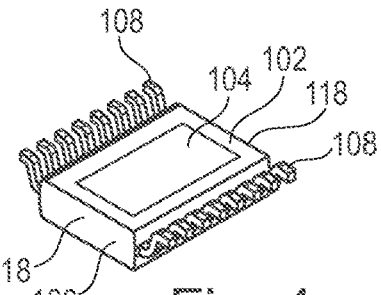
Fig. 4
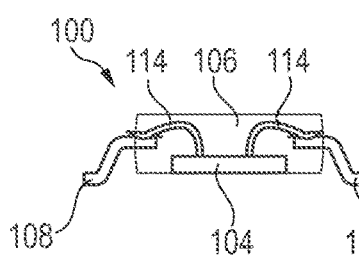
Fig. 5
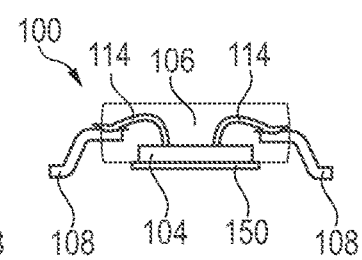
Fig. 6
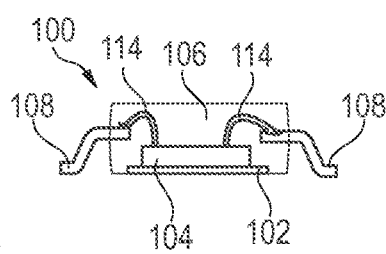
Fig. 7
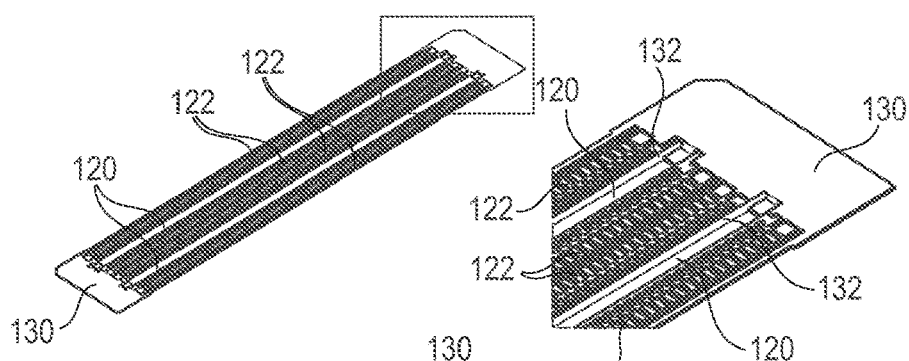
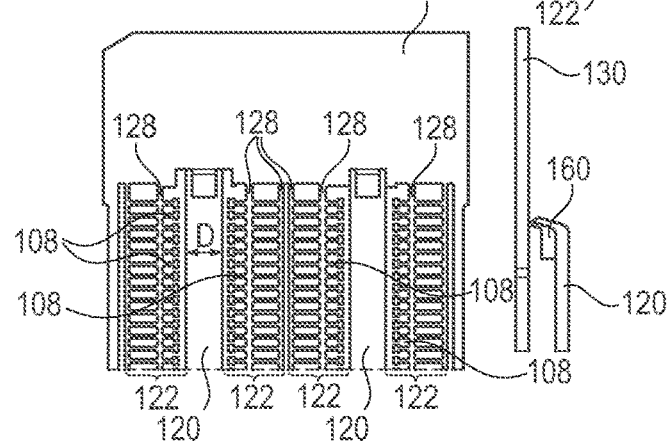
Fig. 8

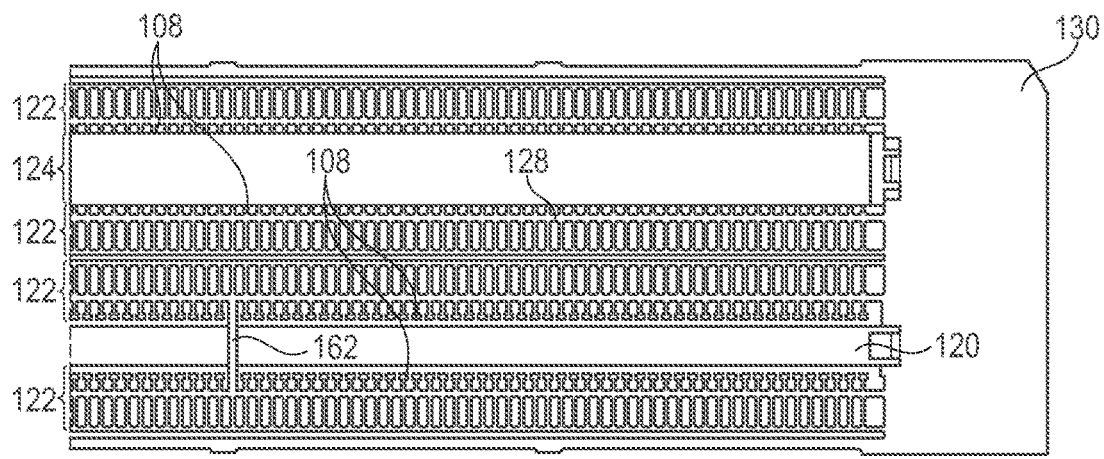
Fig. 13
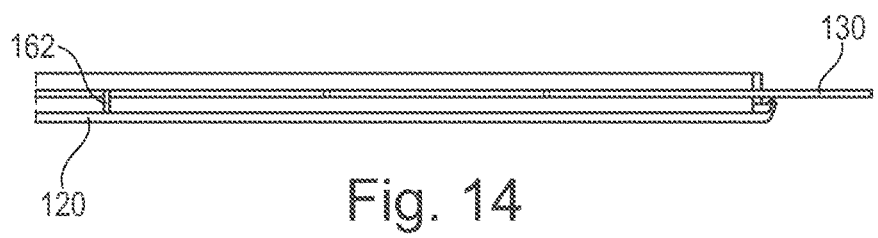
Fig. 14
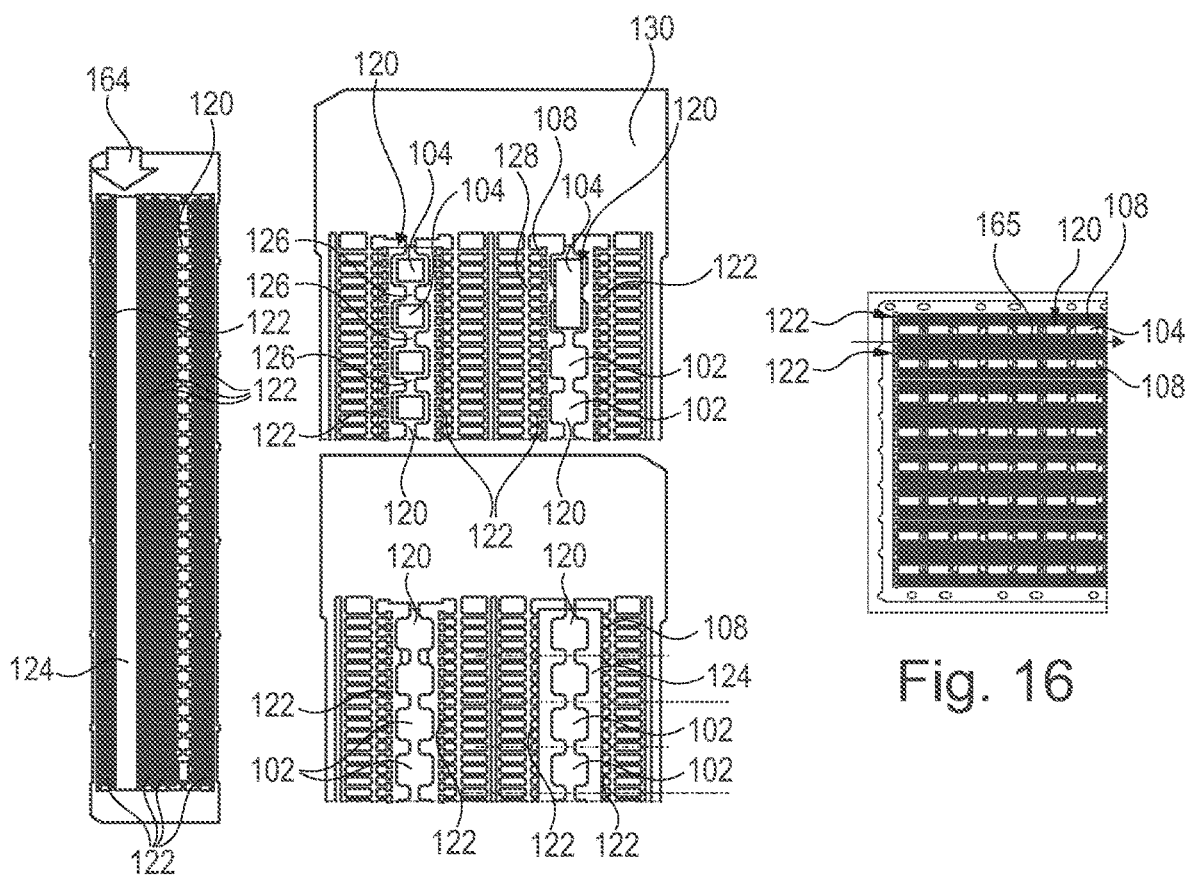
Fig. 15
Fig. 16

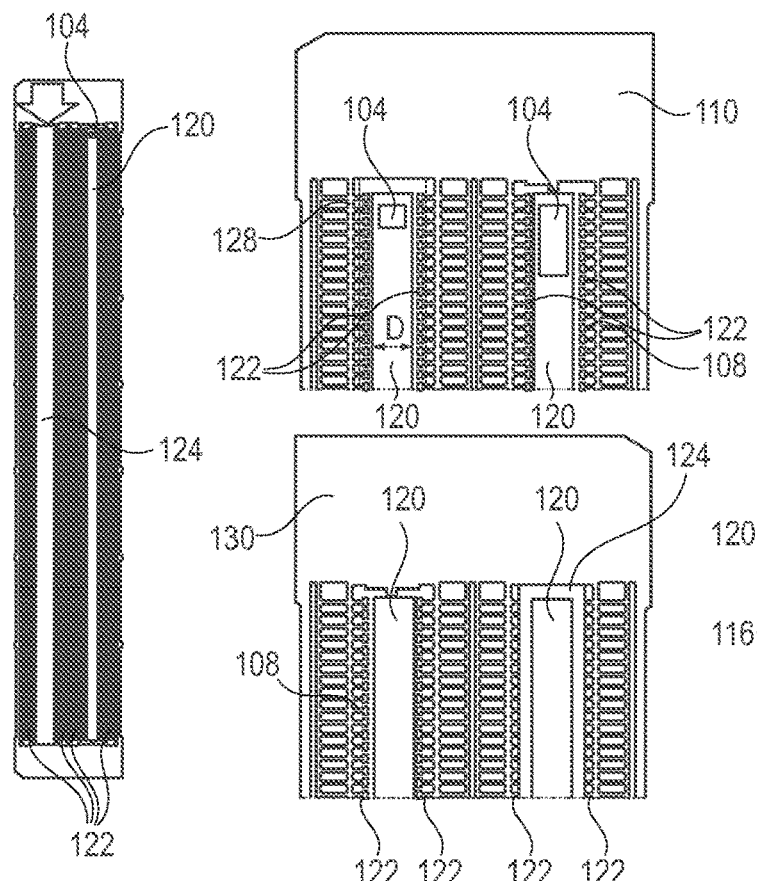
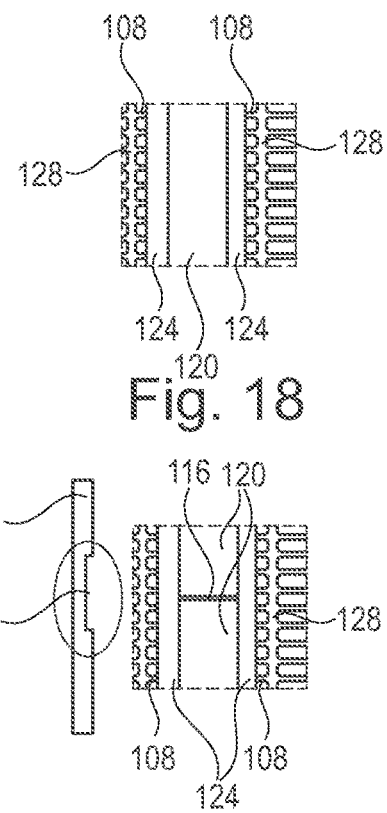
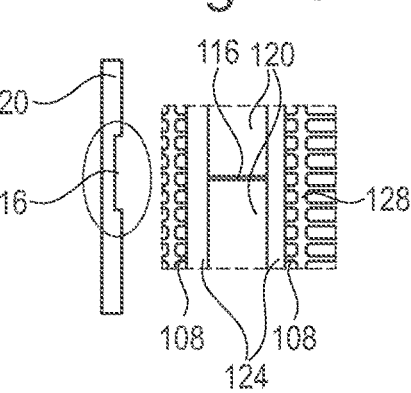
Fig. 17   Fig. 18   Fig. 19
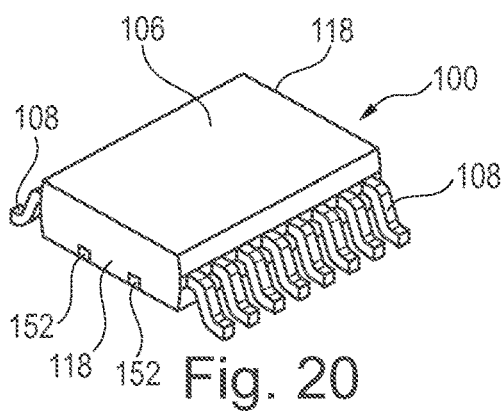
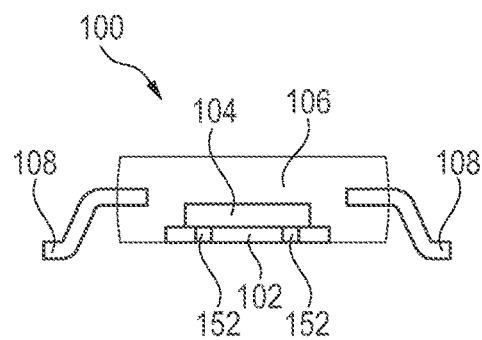
Fig. 20   Fig. 22
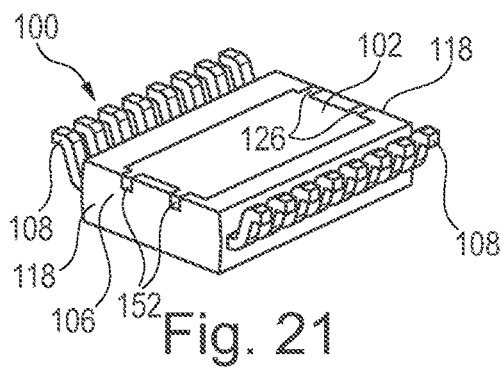
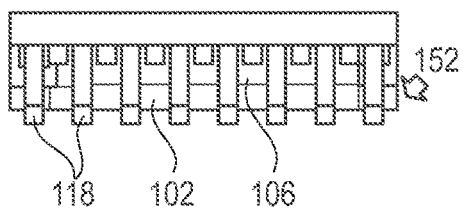
Fig. 21   Fig. 23

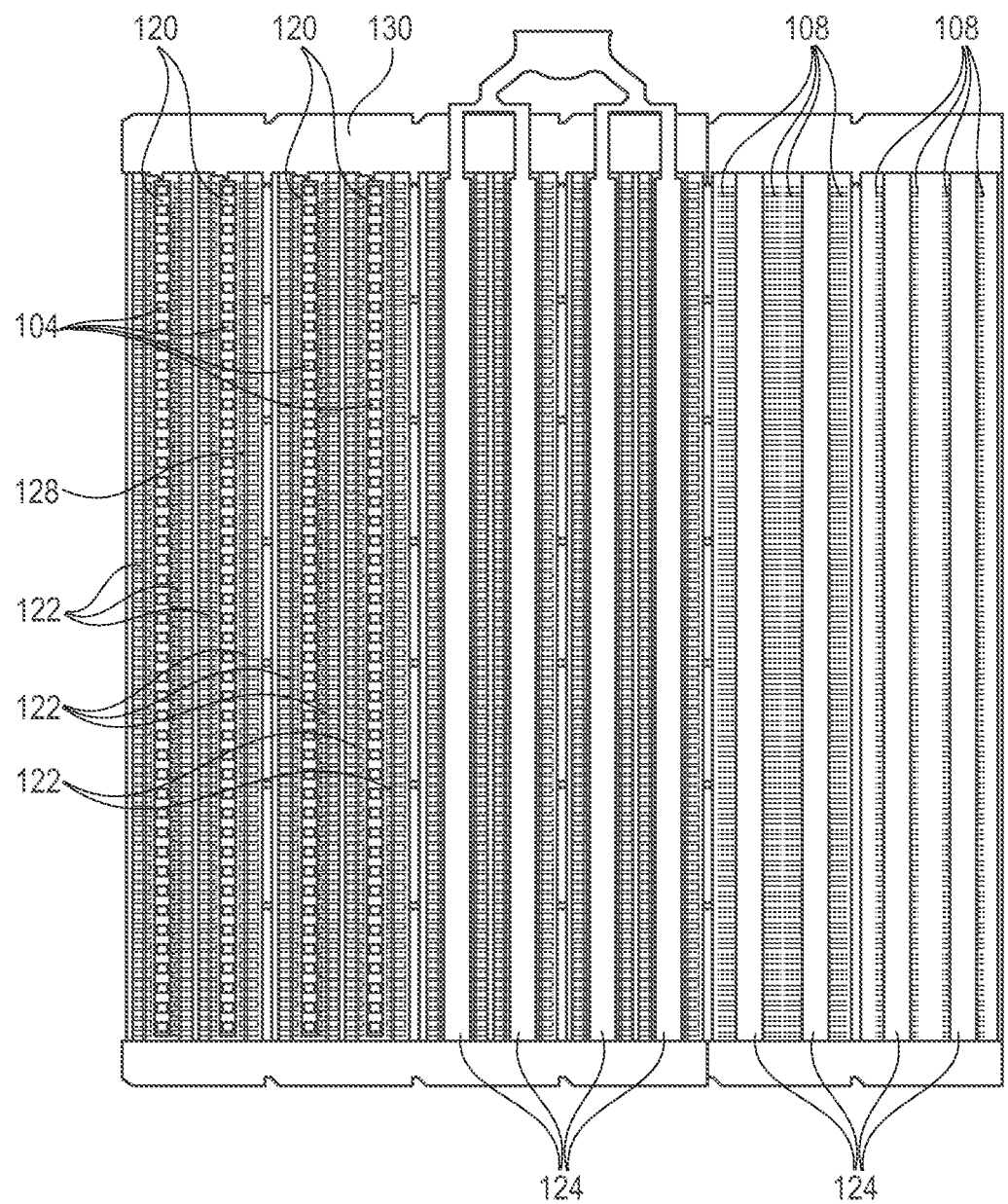
Fig. 41
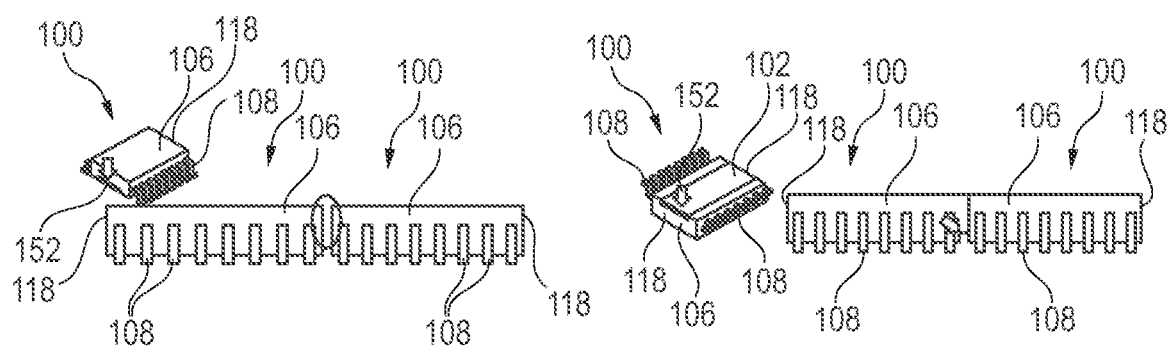
Fig. 42
Fig. 43

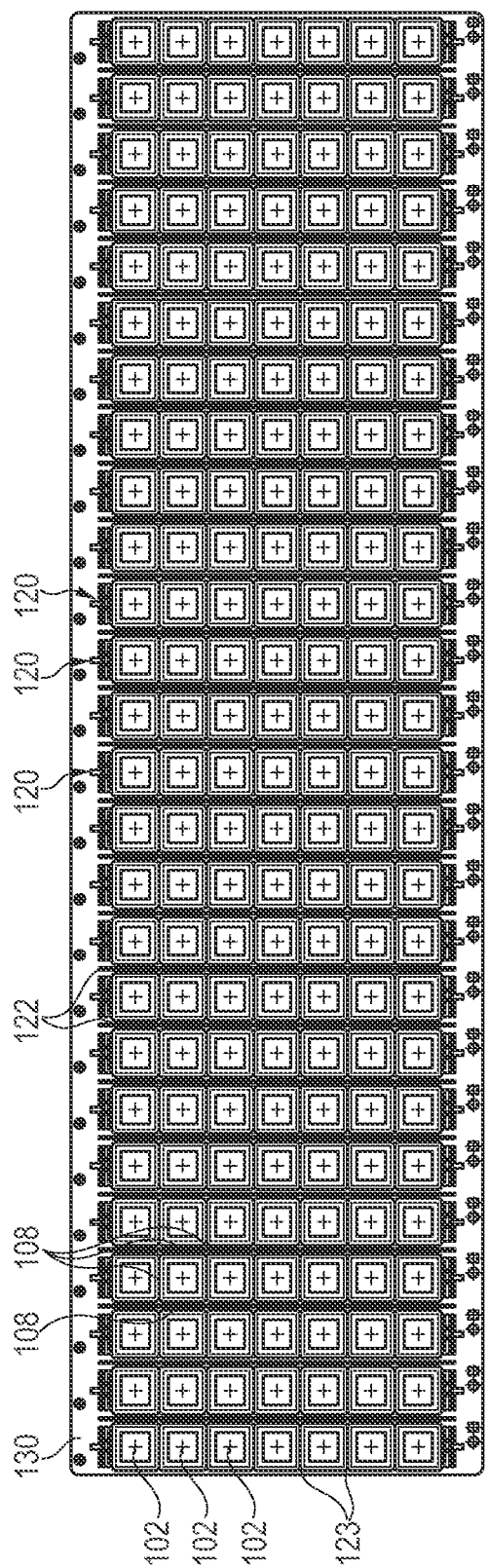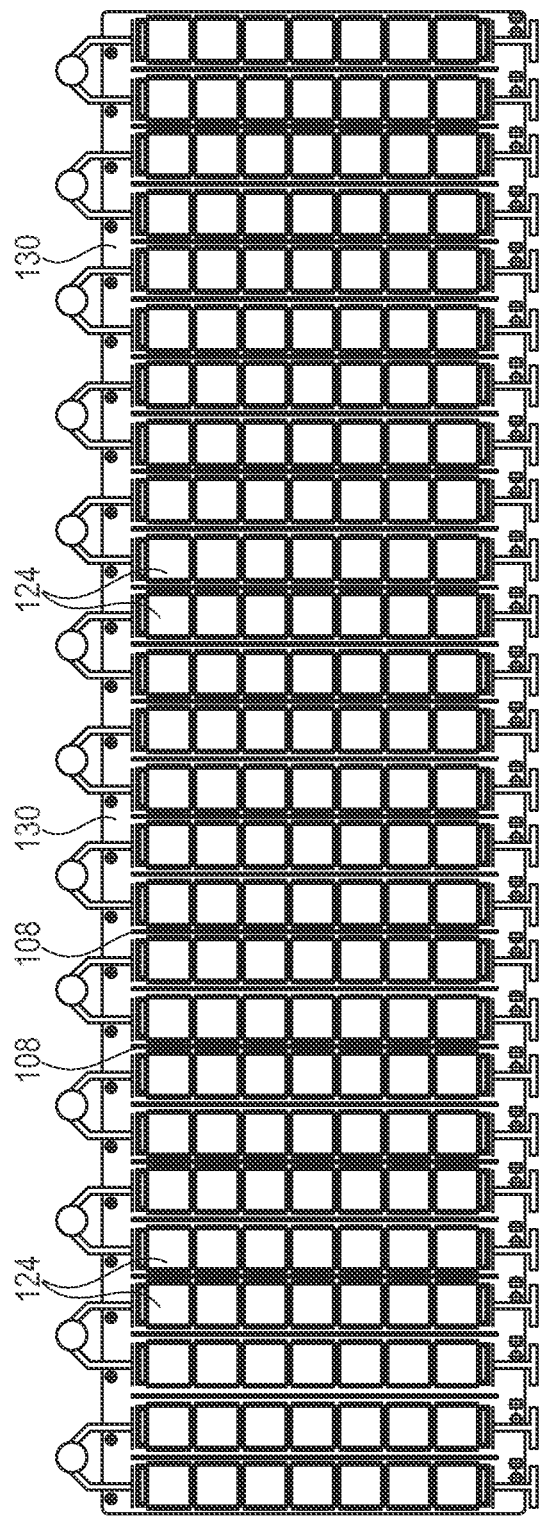
Fig. 45
Fig. 46

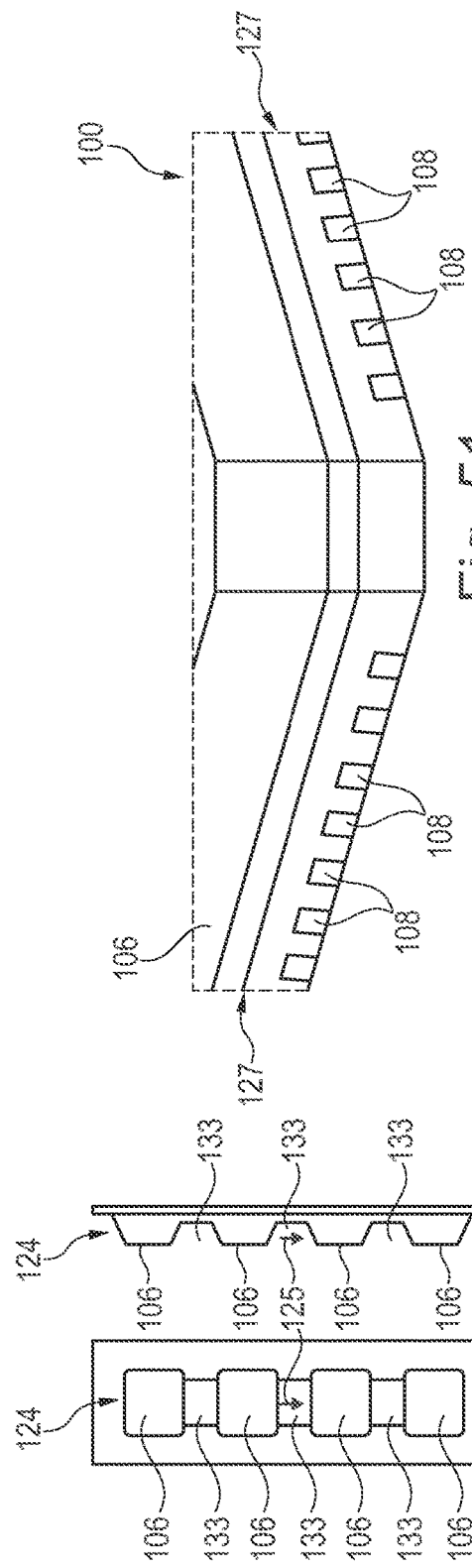
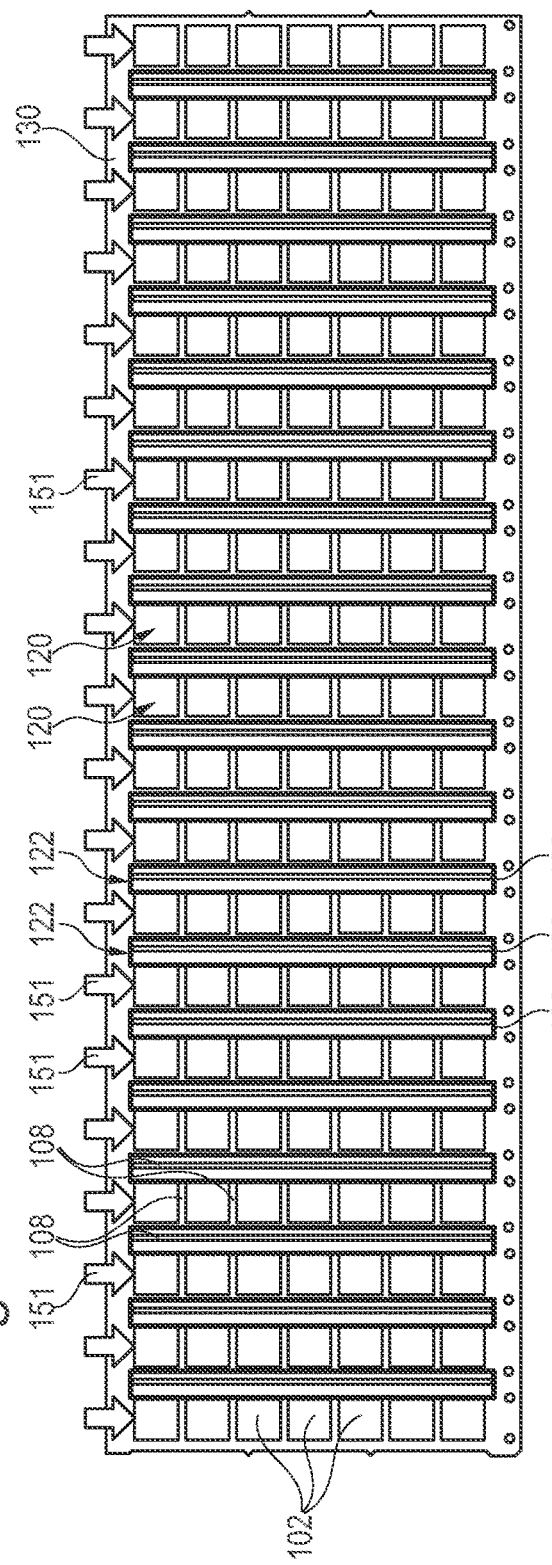

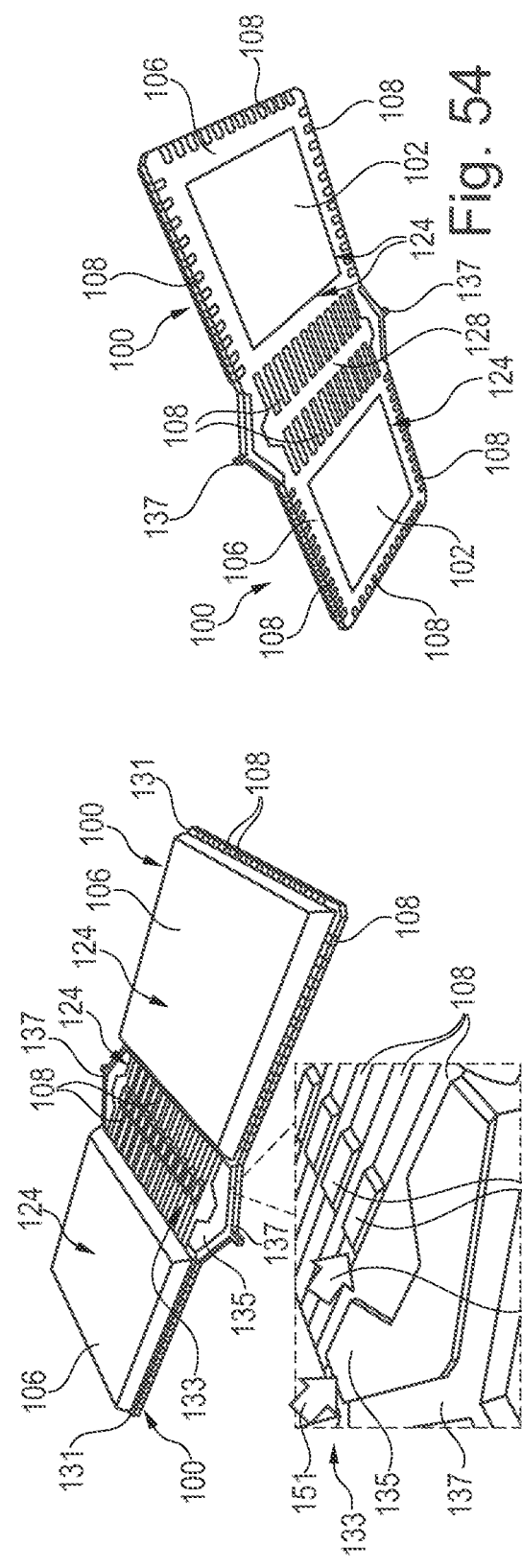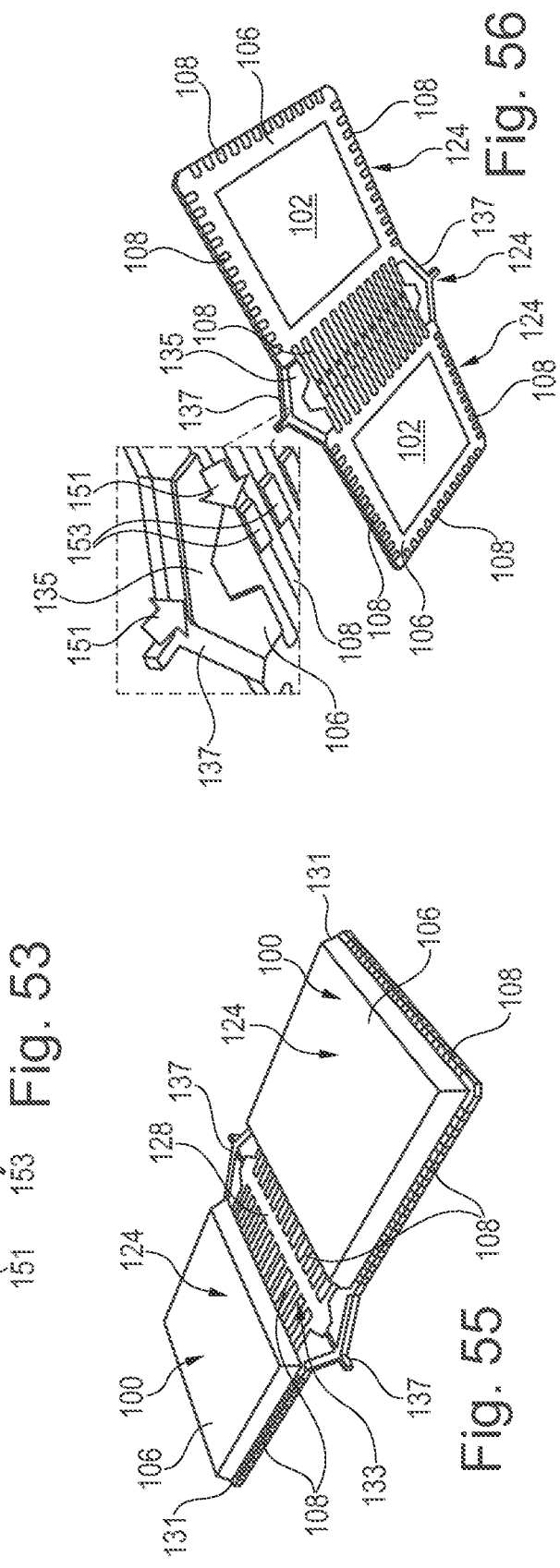

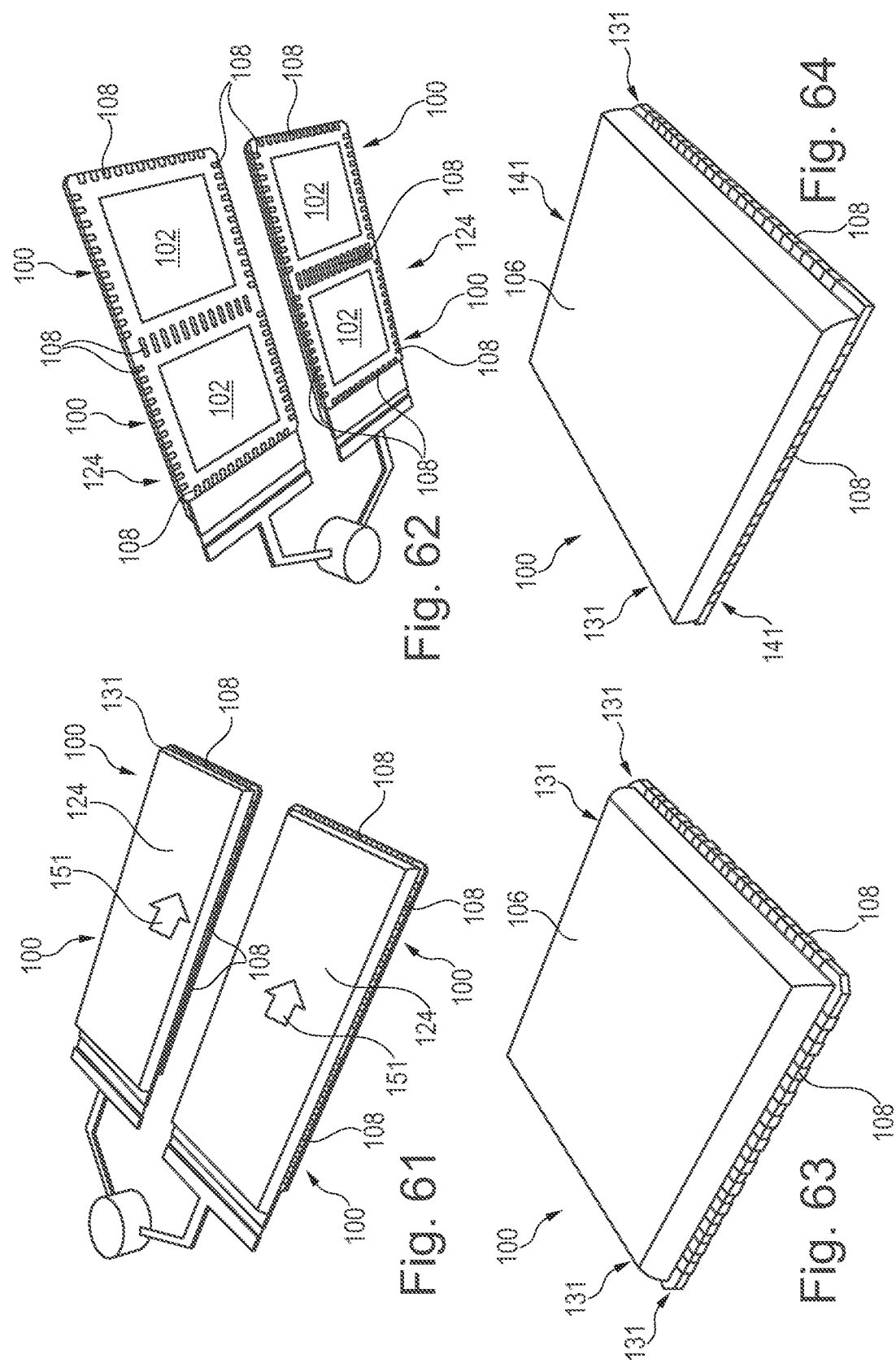

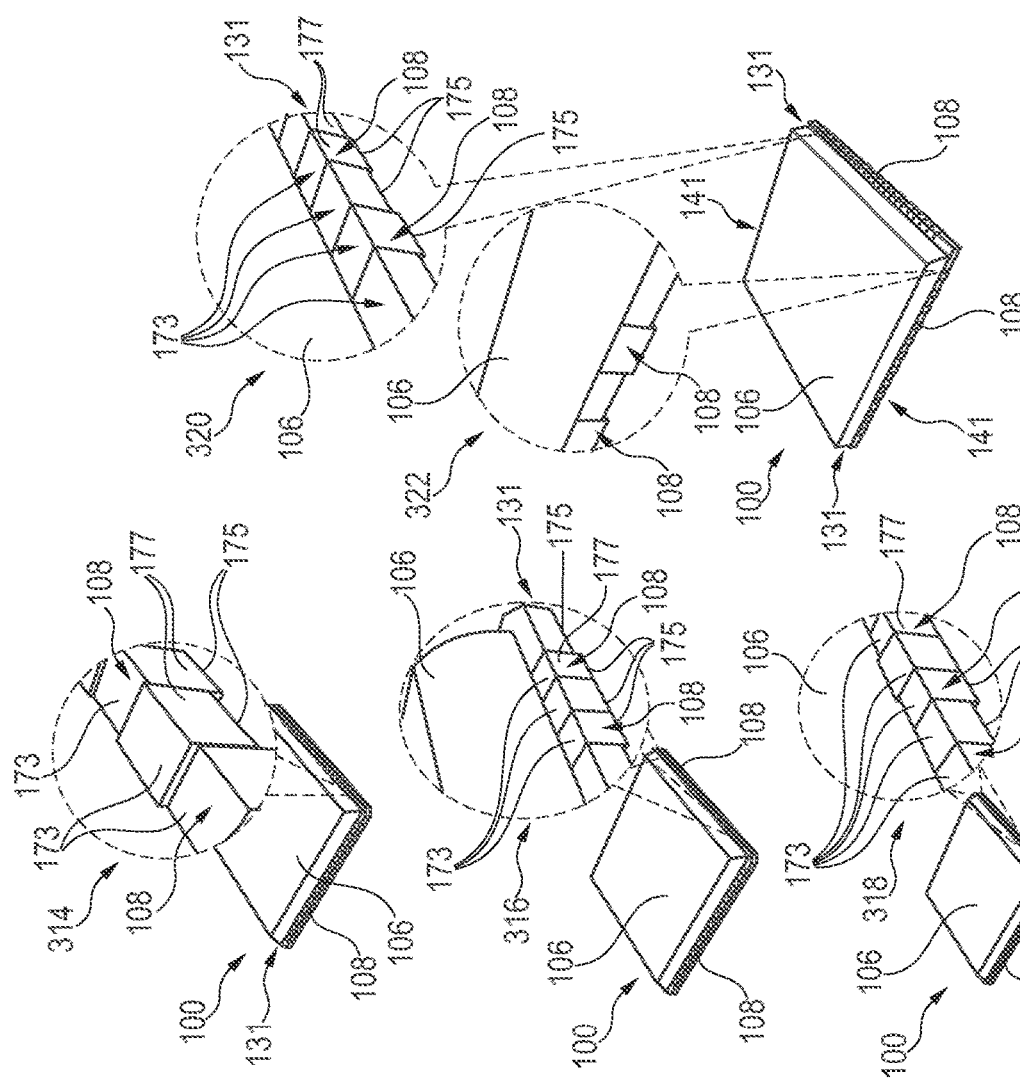
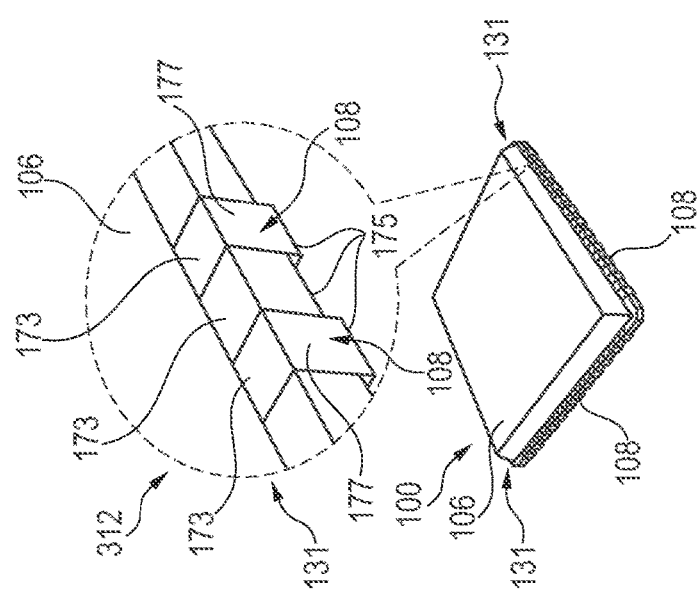

SEMICONDUCTOR PACKAGES AND METHODS FOR MANUFACTURING THEREOF

TECHNICAL FIELD

Various embodiments relate generally to packages, and methods of manufacturing packages.

BACKGROUND

Packages may be denoted as encapsulated electronic components with electrical connections extending out of the encapsulant and being mounted to an electronic periphery, for instance on a printed circuit board.

Packaging cost is an important driver for the industry. Related with this are performance, dimensions and reliability. The different packaging solutions are manifold and have to address the needs of the application.

SUMMARY

There may be a need to provide a possibility to manufacture packages with the focus to reduce processing complexity while obtaining high device reliability.

According to an exemplary embodiment, a package is provided which comprises a dielectric carrier, an electronic component mounted on the dielectric carrier, and an encapsulant encapsulating at least part of the dielectric carrier and the electronic component.

According to another exemplary embodiment, a package is provided which comprises an electronic component, an encapsulant encapsulating at least part of the electronic component, an electrically conductive layer exposed beyond the encapsulant and connected with the electronic component, and at least one lead electrically coupled with the electronic component and extending beyond the encapsulant.

According to another exemplary embodiment, a method of manufacturing a package is provided, wherein the method comprises mounting an electronic component on a dielectric carrier, and encapsulating at least part of the carrier and the electronic component by an encapsulant.

According to another exemplary embodiment, a package is provided which comprises an electronic component, an encapsulant encapsulating at least part of the electronic component, a plurality of leads electrically coupled with the electronic component and extending beyond two opposing sides of the encapsulant, and a lead tip inspection metallization exposed beyond the encapsulant on at least one sidewall of the encapsulant, wherein said at least one sidewall is arranged at another side of the encapsulant than said two opposing sides at which the leads extend beyond the encapsulant.

According to yet another exemplary embodiment, a method of manufacturing packages is provided, wherein the method comprises mounting a plurality of electronic components on carriers of a patterned metal plate, said carriers being surrounded by assigned leads of the patterned metal plate extending along four sides around the respective carrier, electrically coupling each of the components with the assigned leads extending along four sides around the carrier carrying the respective component, at least partially encapsulating carriers, assigned electronic components and assigned leads along four sides around said carriers, which carriers, electronic components and leads being arranged along a straight encapsulation path, by a continuous oblong encapsulant body, and thereafter separating the carriers, electronic components and leads being at least partially encapsulated by the continuous oblong encapsulant body along the straight encapsulation path into the packages or into preforms of the packages, so that each package or preform comprises one of the carriers, assigned leads extending along four sides around said carrier, at least one assigned electronic component, and a portion of the encapsulant body.

According to still another exemplary embodiment, a package (for example, a leadless package) is provided which comprises a carrier, an electronic component mounted on the carrier, an encapsulant encapsulating at least part of the electronic component and the carrier, and leads extending along four sides around the carrier, being electrically coupled with the electronic component and extending beyond the encapsulant along all four sides. In some implementations, the encapsulant comprises steps along at least two opposing of said four sides so that end portions of said leads are exposed at a top surface, a bottom surface and a lateral surface of each respective step. Sections of the leads and sections of the encapsulant at a respective step may extend up to different vertical levels with respect to said leads at said top surface and/or at said bottom surface.

According to a first exemplary embodiment of a first aspect, a package manufacturing concept is provided according to which an electronic component is mounted on a dielectric carrier, for example on an adhesive tape. This may render a conventional die attach unnecessary and may thereby reduce the effort for manufacturing the package. The (for instance sticky tape-shaped) dielectric carrier may remain permanent part of the readily manufactured package. In such an embodiment, the dielectric carrier may also contribute to an electric isolation of an electronic component mounted thereon, or even of multiple electronic components mounted on the same dielectric carrier. In another embodiment of the first aspect, it may be also possible to remove the dielectric carrier before completing manufacture of the package. In such a configuration, it may for instance be possible to provide a package with an exposed backside metallization of the encapsulated electronic component, wherein the backside metallization may be exposed by removing the dielectric carrier (for instance by stripping or peeling off a tape at the end of the manufacturing process). In such an embodiment, it is also possible to further process or condition the exposed (and preferably planar) metallization area, for instance by plating.

According to an exemplary embodiment of a second aspect, a highly efficient manufacturing method for manufacturing multiple packages with an integral and therefore highly efficient encapsulation process is provided. In such an embodiment, an oblong carrier body may be used which has multiple sections or portions, each capable of serving as a carrier (or part thereof) of a readily manufactured package. A plurality of electronic components, one or more for each of the packages, may be mounted on said common oblong carrier body. Thereafter, the multiple-package oblong carrier body with the assembled electronic components may be encapsulated as a whole so as to form a common encapsulant body. Descriptively speaking, such a common encapsulant body may have an appearance similar as a chocolate bar and may form the basis for the separation of multiple packages from it. Thereafter, the common encapsulant body, manufactured efficiently by the described batch procedure, may be separated or singularized by separating it into different pieces, each piece forming a package or a preform of a package. Each of those singularized packages may then comprise a carrier section of the previously oblong carrier body, one or more of the meanwhile encapsulated electronic components and a portion of the encapsulant material. Referring again to the descriptive example of above, the chocolate bar may be cut into a plurality of individual pieces, each piece corresponding to a package. By taking this measure, a highly efficient manufacturing architecture may be provided thanks to the provision of an oblong carrier body which is separated into individual carriers only after a batch-like encapsulation process. Highly advantageously, the oblong carrier body may be arranged between two multi-package rows of leads which may also be partially encapsulated during encapsulating oblong carrier body and electronic components. Consequently, separating the oblong carrier body together with the encapsulant and the electronic components into packages may also separate the two opposing straight arrangements of leads into package lead groups (each comprising any desired number of leads for an assigned package), so that an amount of leads desired for a specific package design may be selected by correspondingly determining the separation length of each individual package. Hence, the high efficiency of the described manufacturing process may be advantageously combined with a high flexibility of selecting a desired number of lead pairs for the singulation process, which provides a high freedom of scalability.

According to an exemplary embodiment of a third aspect, each of carriers belonging to a common patterned metal plate and each carrying at least one component may be surrounded by leads along four sides, wherein leads surrounding one carrier may be electrically coupled with the at least one component assigned to said carrier. Advantageously, each group of carriers arranged along a respective straight encapsulation path may then be at least partially encapsulated by a continuous oblong encapsulant body together with leads located in between said group of carriers and together with assigned leads arranged laterally to the group of carriers. This encapsulation may create a plurality of oblong encapsulant bodies being arranged side-by-side or parallel to each other and each covering an assigned group of carriers at least partially. The so obtained arrangement may then be singularized in individual packages or preforms thereof, in particular by separating said arrangement along separation paths extending parallel and perpendicular to the oblong encapsulant bodies. Advantageously, such a manufacturing architecture may significantly increase the package density, i.e. a number of obtainable packages per area of the patterned metal plate. Thus, the described approach may ensure a high throughput and may contribute to a continued miniaturization of packages. When portions of a respective oblong encapsulant body between adjacent carriers of a group comprises indentations, the singulation process may lead to packages having at least two opposing stepped side walls, each respective step exposing sequences of alternating lead sections and encapsulant sections in between. At a respective step, end portions of said leads may thus be exposed at a top surface, a bottom surface and a lateral surface. Descriptively speaking, such a geometry of an obtained package may be a fingerprint of the execution of the aforementioned manufacturing process.

In the following, further exemplary embodiments of the packages, and the methods will be explained.

In the context of the present application, the term "package" may particularly denote an electronic device which may comprise one or more electronic components mounted on a carrier, said carrier to comprise or consist out of a single part, multiple parts joined via encapsulation or other package components, or a subassembly of carriers. Said constituents of the package may be encapsulated at least partially by an encapsulant. Optionally, one or more electrically conductive interconnect bodies (such as bond wires and/or clips) may be implemented in a package, for instance for electrically coupling the electronic component with the carrier.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), a light emitting, semiconductor-based device (such as a light emitting diode (LED) or LASER), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated. Semiconductor chips implemented according to exemplary embodiments may be formed in silicon technology, gallium nitride technology, silicon carbide technology, etc.

In the context of the present application, the term "encapsulant" may particularly denote a substantially electrically insulating material surrounding at least part of an electronic component and at least part of a carrier to provide mechanical protection, electrical insulation, and optionally a contribution to heat removal during operation. In particular, said encapsulant may be a mold compound. A mold compound may comprise a matrix of flowable and hardenable material and filler particles embedded therein. For instance, filler particles may be used to adjust the properties of the mold component, in particular to enhance thermal conductivity.

In the context of the present application, the term "carrier" may particularly denote a structure which serves as a support for at least one electronic component of one package. Therefore, a carrier may be assigned to one individual package and may form part of said individual package. In some implementations, the carrier may fulfil a mechanical support function. A carrier may also comprise or consist of a single part, multiple parts joined via encapsulation or other package components.

In the context of the present application, the term "lead" may in particular denote an electrically conductive (for instance strip shaped) element (which may be planar or bent) which may serve for contacting the electronic component with respect to an exterior of the package. For instance, a lead may be partially encapsulated and partially exposed with respect to an encapsulant.

In the context of the present application, the term "dielectric carrier" may particularly denote a mechanical support body comprising or even consisting of an electrically insulating material such as a tape.

In the context of the present application, the term "electrically conductive layer" may particularly denote a planar continuous electrically conductive, in particular metallic, sheet.

In the context of the present application, the term "oblong carrier body" may particularly denote a physical support structure which may serve as a mounting support for mounting a plurality of components thereon. Said components may form part of different packages. Therefore, a carrier body may comprise a plurality of integrally connected carriers (wherein the term "carrier" is defined above). A carrier body may therefore comprise multiple integrally connected carriers for a plurality of different packages. A carrier body can form part of a large array used for the manufacture of many packages. In particular, the oblong carrier body may have a length being larger than its width, and in particular being at least three times, more particularly at least five times, and preferably at least eight times of its width. In readily manufactured packages, each section of such an oblong carrier body may serve as a carrier after package singulation.

In the context of the present application, the term "row of leads" may particularly denote a plurality (in particular at least ten, more particularly at least thirty) leads extending substantially parallel to each other on one side of the above-mentioned oblong carrier body. When forming a row, said leads may be arranged along a straight line (for instance vertically or horizontally).

In the context of the present application, the term "lead tip inspection metallization" may particularly denote an exposed surface metallization at a sidewall of an encapsulant of a package which is accessible from an exterior position for inspecting properties of the exposed metallized tip, for instance in terms of its capability of being connected by soldering. Such a lead tip inspection metallization may be located so as to be accessible even when the package is soldered with its leads on a mounting base such as a printed circuit board, and its leads are thus no longer accessible for inspection.

In an embodiment, the dielectric carrier is a tape. Such a tape may be a dielectric thin film which may be flexible or bendable so as to capable of assuming any desired configuration defined by a package designer. Attaching a component to the tape may significantly simplify the mounting procedure as compared to a conventional die attach process, at which for instance a semiconductor chip is soldered on a copper plate.

In an embodiment, the dielectric carrier comprises a sticky surface which adheres to the electronic component. Hence, the dielectric carrier may comprise a sticky surface. Highly advantageously, the dielectric carrier may be adhesive so that an attached electronic component will remain reliably at a mounting position at the carrier without taking any further measure. In particular, an adhesive tape may be a highly advantageous choice for mounting the one or more components on the dielectric carrier.

In an embodiment, the dielectric carrier is at least partially exposed with respect to the encapsulant. When the dielectric carrier is exposed beyond the encapsulant, it may also serve the function of electrically insulating an encapsulated electronic component from an electronic environment. Furthermore, the properties of the exposed dielectric layer may be specifically designed to meet requirements of a specific application, for instance to promote heat removal during operation of the package.

In an embodiment, an exterior surface of the dielectric carrier is in flush with an exterior surface of the encapsulant. Hence, the exposed dielectric carrier and the encapsulant may form a continuous flat surface without pronounced steps at a material interface by aligning an exterior surface of the encapsulant with an exterior surface of the dielectric carrier.

In an embodiment, the package comprises a heat sink attached to the at least partially exposed dielectric carrier. When exposing the dielectric carrier, the dielectric carrier may be in a perfect condition for being directly connected with a heat sink for accomplishing an efficient heat removal out of an interior of the package. This is of particular advantage when the embedded one or more electronic components generate a considerable amount of heat during operation, for instance when being embodied as power semiconductor chip(s). For instance, such a heat sink—which may be attached directly to an exposed surface of the dielectric carrier—may be a metal plate having a plurality of cooling fins extending therefrom.

In an embodiment, the dielectric carrier is fully circumferentially encapsulated in an interior of the encapsulant. As an alternative to the previously described embodiments, it is also possible that the dielectric carrier is completely surrounded by encapsulant material so that the dielectric carrier and the electronic component mounted thereon may be both be hermetically electrically insulated.

In an embodiment, the dielectric carrier is thermally conductive, in particular has a thermal conductivity of at least 2 W/mK, more particularly at least 5 W/mK, preferably at least 10 W/mK. When the dielectric carrier is made of a thermally properly conductive material, it may even contribute by itself, in addition or alternatively to an exterior heat sink, for efficiently removing heat out of an interior of the package. Hence, the carrier may be thermally conductive and electrically insulating.

In an embodiment, the package comprises at least one further electronic component mounted on the same dielectric carrier. According to such an embodiment, multiple electronic components may be mounted on the same dielectric carrier, for instance on the same strip of adhesive tape. In addition to the above-described advantages of the use of a sticky tape as dielectric carrier, this has the additional advantage that multiple electronic components belonging to the same package are properly electrically insulated. Such a mutual electric insulation of the electronic components of a common package may be in particular an advantageous configuration as compared to a conventional approach in which two electronic components are mounted on the same metal plate. Thus, the mounting of multiple electronic components on the same dielectric carrier may improve the electrical performance of the package.

In an embodiment, the dielectric carrier is free of metal. In such a preferred configuration, the entire dielectric carrier is completely free of any metal or other electrically conductive structure. It may simply consist of dielectric or electrically insulating material.

In an embodiment, the carrier has at least one groove, in particular being at least partially filled with the encapsulant. This may create a mechanical interlocking between encapsulant material (in particular mold compound) and carrier. Advantageously, this may efficiently suppress delamination and may promote a proper mechanical performance of the package. Alternatively, the groove may remain unfilled so that the groove may function as a stress buffer.

In another embodiment which relates to an exposed electrically conductive layer as explained above, part of the electrically conductive layer covers part of the encapsulant. For instance, a plateable mold compound may be used as material for the encapsulant for this purpose. It is then possible to plate not only an exposed backside metallization of the electronic component of the package, but also a surrounding (for instance annular) portion of the encapsulant. This may further increase the area of the exposed electrically conductive layer so that both a low ohmic connectivity as well as a proper heat removal capability of such an exposed electrically conductive layer may be obtained.

In an embodiment, the package comprises a further electronic component at least partially encapsulated by the encapsulant, and a further electrically conductive layer exposed beyond the encapsulant and connected with the further electronic component. In such a configuration, two (or more) different exposed electrically conductive layers may be provided in a single package (for instance arranged side-by-side), wherein at least one electronic component may be mounted on each of said electrically conductive layers. Hence, the described package architecture may be freely scaled with different numbers of electronic components and different numbers of electrically conductive layers.

In an embodiment, an outline of the package is free of a tie bar. Tie bars may be used for interconnecting constituents of different packages during manufacture. In many cases, tie bars are made of metal, and may for example form part of a leadframe. During separating individual packages manufactured in a batch procedure, said tie bars may be separated as well. However, cutting through metallic tie bar material may be cumbersome and may decelerate the separation process. Due to the manufacturing architecture of an exemplary embodiment, cutting through tie bars may be dispensable, since tie bars may be omitted in particular in regions in which packages are singularized.

In an embodiment, the package is configured as tie bar-less package. In such an embodiment, the entire package may be entirely free of any tie bar.

In an embodiment, the package comprises at least one lead electrically coupled with the electronic component and partially extending beyond the encapsulant. By such one or more leads, pads of the electronic component may be electrically coupled with an exterior of the package. For the example of a MOSFET chip, a gate pad, a source pad and a drain pad may be connected with a periphery of the package via leads.

In an embodiment, the package comprises a plurality of leads extending beyond the encapsulant at two (or more) opposing sides of the package. When guiding out leads at two opposing sides of the encapsulant, a considerable number of electric connections may be established in a compact way.

In an embodiment, the package comprises at least one electrically conductive interconnect body electrically connecting the electronic component with the at least one lead and being at least partially encapsulated in the encapsulant. For instance, such an electrically conductive interconnect body may be a bond wire, a bond ribbon or a clip. While bond wires and bond ribbons may be tiny flexible electrically conductive elements having two terminals to be connected with a pad of the electronic component and with a lead, a clip may be a three-dimensionally bent electrically conductive plate-shaped body to be attached on an upper main surface of a mounted electronic component and on an upper main surface of leads and/or an electrically conductive carrier.

In an embodiment, a portion of the at least one lead extending beyond the encapsulant is gull-wing shaped. A gull-wing shape of the leads may provide some elasticity and flexibility of the leads which thereby simplifies soldering the leads on a mounting base such as a printed circuit board.

In an embodiment, the package comprises a metallization exposed at a sidewall of the encapsulant and being accessible for lead tip inspection. Such a lead tip inspection metallization may be provided at a sidewall of the encapsulant and may enable to test an electric contact or solderability of electrically conductive material of the lead tip inspection (LTI) metallization.

In an embodiment, two opposing sidewalls of the encapsulant are vertical, wherein said sidewalls are free of leads. Said vertical sidewalls may be separated from an encapsulant body by mechanically sawing or laser-cutting. For instance, leads may extend beyond the encapsulant at the two remaining sidewalls of the encapsulant, which sidewalls may for example be slanted.

In an embodiment of the package, the electrically conductive layer forms a carrier on which the electronic component is mounted. The package may comprise a plurality of leads extending along four sides around the carrier, being electrically coupled with the electronic component and extending beyond the encapsulant along all four sides.

In an embodiment, the encapsulant comprises steps along at least two opposing of said four sides so that portions of said leads are exposed at a top surface, a bottom surface and a lateral surface of each respective step. Such a geometry of a readily manufactured package may be the result of a manufacturing process according to the third aspect. In some implementations, indentations of the oblong encapsulant body may be created between each two adjacent preforms of packages extending along the oblong encapsulant body. Separation of such an arrangement into individual packages may then lead to packages with a respective step at each of four sides along a perimeter of a package. Hence, the assigned manufacturing architecture leads to a very high package density, i.e. number of packages per area of a patterned metal plate used as a starting point for manufacturing said packages.

In an embodiment, sections of the leads and sections of the encapsulant at a respective step extend up to different vertical levels at said top surface and/or at said bottom surface. Such embodiments are shown for example in FIG. 66 to FIG. 68. Descriptively speaking, such a geometry may be obtained when providing at least one encapsulant reservoir and/or at least one channel between assigned carriers belonging to a common encapsulation path (compare FIG. 53 to FIG. 60). The mentioned encapsulant reservoir or channel may properly guide a still flowable encapsulant medium (such as a flowable mold compound) along a respective encapsulation path. For example, all sections of the leads and all sections of the encapsulant at a respective step may extend up to the same vertical level at said top surface, and at least one section of the leads and/or at least one section of the encapsulant at the respective step extends up to a different vertical level (which may be a higher vertical level or a lower vertical level) at said bottom surface than at least one other section of the leads and/or at least one other section of the encapsulant at the respective step. Corresponding embodiments are shown in FIG. 66 and FIG. 68 and may be the result of the formation of a mold flow channel during encapsulation. In another example, at least one section of the leads and/or at least one section of the encapsulant at a respective step extends up to a higher vertical level at said top surface and at said bottom surface than at least one other section of the leads and/or at least one other section of the encapsulant at the respective step. Such an embodiment is shown in FIG. 67. This may be obtained when providing a top-sided channel for guiding the mold flow during encapsulation.

In an embodiment, the encapsulant comprises steps along all four sides. FIG. 63 shows a corresponding embodiment. A mold tool used for defining the shape of the encapsulant body may have a geometry leading to steps along a lateral edge of an oblong encapsulant body. Moreover, the mold tool may be shaped so that indentations of the oblong encapsulant body are created between each two adjacent preforms of packages extending along the oblong encapsulant body. Separation of such an arrangement into individual packages may then lead to packages with a respective step at each of four sides along a perimeter of a package. In another embodiment, the encapsulant comprises steps along only two opposing of said four sides, whereas the encapsulant has stepless sidewalls at the other two opposing of said four sides. Such an embodiment is shown for instance in FIG. 64. The described geometry may be obtained when a mold tool used for defining the shape of the encapsulant body is shaped so that steps are formed along a lateral edge of an oblong encapsulant body. Furthermore, the mold tool may be shaped so that the oblong encapsulant body is free of indentations between adjacent preforms of packages extending along the oblong encapsulant body. More specifically, the oblong encapsulant body may be formed with an upper main surface embodied as continuous plane (see for example FIG. 61). The oblong encapsulant body may have full package thickness. Singulation into individual packages may then lead to packages with a respective step at two opposing lateral sides and with two continuous sidewalls (extending vertically or slanted) at edges between the stepped surfaces.

In an embodiment, all sections of the leads and all sections of the encapsulant at a respective step extend up to the same position at the lateral surface. This may be the consequence of a singulation process. At a respective step, the thickness of the encapsulant body may be locally reduced so that separation by punching may be made possible in a simple way. The geometrical result of such an approach may be a straight separation line leading to all leads and encapsulant sections at the respective step extending up to the same lateral surface. The package may for example, be configured as a leadless package such as a quad-sided leadless package. A quad-sided package may be a package with rectangular or substantially rectangular perimeter having exposed lead surfaces at each four sides. A leadless package may be denoted as a package in which leads for electrically connecting an encapsulated component do not extend beyond an encapsulant as exposed strips or legs, but are only accessible from an exterior of the package as planar surfaces being for instance aligned (in particular horizontally and/or vertically) with an exterior surface of the encapsulant. While leaded packages have exposed legs around the perimeter of a component for connection to a mounting base such as a printed circuit board, leadless packages only expose leads as contact points or areas (rather than protrusions) in alignment with the encapsulant.

In an embodiment, the method comprises removing the carrier after the encapsulating. In such an embodiment, the carrier may serve as a mechanical support during encapsulation and may be later removed, for instance for exposing a backside metallization of the electronic component or for making it possible to provide an electrically conductive layer at said backside.

In an embodiment, the method comprises forming, in particular by plating, an electrically conductive layer which is connected to the electronic component. Hence, an exposed backside metallization of an electronic component such as a semiconductor chip with pads may be capable of being plated.

In an embodiment, the method comprises forming the electrically conductive layer so that the electrically conductive layer also covers part of the encapsulant. This can be accomplished by plating not only an exposed backside metallization of an electronic component, but also an annular portion of the encapsulant surrounding such a backside metallization. In order to manufacture such a structure, a plateable encapsulant may be provided.

In an embodiment, the method comprises surrounding each of said carriers by assigned leads extending along four sides around the respective carrier, electrically coupling each of the components with the assigned leads extending along four sides around the carrier carrying the respective component, at least partially encapsulating carriers, assigned electronic components and assigned leads along four sides around said carriers, which carriers, electronic components and leads being arranged along a straight encapsulation path, by said continuous oblong encapsulant body extending along said oblong carrier body, and thereafter separating the carriers, electronic components and leads being at least partially encapsulated by the continuous oblong encapsulant body along said oblong carrier body into the packages or into preforms of the packages, so that each package or preform comprises one of the carriers, assigned leads extending along four sides around said carrier, at least one assigned electronic component, and a portion of the encapsulant body. In such an advantageous embodiment, (in particular rectangular or substantially rectangular) carriers each carrying one or more components (such as semiconductor chips) may have leads at each of its four sides which may be connected to the mounted component(s). A group of carriers with its components extending along a straight encapsulation path may then be overmolded by a common continuous oblong encapsulant body which also covers at least part of longitudinally extending leads between carriers of said group and laterally extending leads corresponding to two opposing lateral edges of the encapsulant body. Separation of such a structure into separate packages or package preforms can involve separating the encapsulant body between each adjacent pair of carriers encapsulated along said straight encapsulation path. More generally, separation of a correspondingly processed patterned metal plate may be accomplished by separating the obtained arrangement along separation paths extending parallel and perpendicular to the oblong encapsulant bodies. Such a manufacturing principle may advantageously lead to quad-sided packages with leadless design and a very high package density, i.e. number of manufactured packages per area. Consequently, packages with excellent reliability may be manufactured in a quick and simple process as well as in a highly compact way.

In an embodiment, the method comprises forming the oblong carrier body together with at least one further oblong carrier body and together with said leads as part of a patterned metal plate. Such a patterned metal plate may be a leadframe-like structure with die pad-type carriers which may be arranged in a matrix-like way in rows and columns Each carrier may be surrounded by four groups of leads, each group of leads located at an assigned edge of the preferably rectangular carrier. With such a design, a plurality of oblong carrier bodies may be provided, each corresponding to a respective column of the matrix-like array of carriers and each including leads between its carriers as well as leads located at both lateral sides of the straight array of carriers.

In an embodiment, the method comprises controlling the encapsulating so that flowable encapsulant medium flows along the straight encapsulation path between adjacent carriers via spaces between leads extending between said adjacent carriers. This may be achieved by correspondingly shaping a mold tool for defining the encapsulation path(s) and by making provisions to guide the flow of liquid or viscous encapsulation medium along said encapsulation path(s) in a controlled way. Advantageously, encapsulation medium may be guided to flow along a plurality of parallel encapsulation paths to thereby form a plurality of parallel oblong encapsulant bodies with lateral gaps in between.

In an embodiment, the method comprises forming the encapsulant body with a continuously planar upper main surface and a continuously planar lower main surface at and between adjacent packages or preforms of packages. Such an approach is shown for example in FIG. 61 and FIG. 62.

In another embodiment, the method comprises forming the encapsulant body with indentations extending transverse to the straight encapsulation path and located between adjacent packages or preforms of packages. Descriptively speaking, such a geometry resembles to a chocolate bar. This may lead to a design of a respective oblong encapsulant body as shown in FIG. 49. Advantageously, the indentations may correspond to locally thinned encapsulant portions which simplifies separation of the oblong encapsulant body together with its encapsulated carriers, components and leads for producing individual packages or preforms thereof. The method may further comprise separating the packages or preforms of packages at said indentations. This may involve punching the encapsulant body and the carrier body at said indentations. Advantageously, the locally thinned encapsulant body at the indentations may be separated by the fast and simple process of punching, rendering a more complex and time-consuming sawing process dispensable for separating the encapsulant body along the indentations.

In an embodiment, the method comprises forming the encapsulant body so that leads extending parallel to the encapsulant body and/or reinforcing bars connecting leads and extending transverse to the encapsulant body are exposed at the indentations. Hence, the encapsulant body may be formed very thin at the indentations for simplifying the singulation process. Thus, leads and/or tie bars may be exposed in said indentations regions. While said leads may extend parallel to the arrangement of carriers along the longer side of the oblong carrier body, reinforcing bars (such as tie bars) may extend perpendicular to said leads and along an indentation. The reinforcing bars may be integrally connected with a group of leads for holding them together as part of a patterned metal plate prior to a singulation process.

In one embodiment, the method comprises forming the encapsulant body and/or the oblong carrier body so that flowable encapsulant medium flows along at least one or more of the following: at least one top-sided reservoir, at least one bottom-sided reservoir and/or at least one continuous channel between adjacent ones of the packages or between adjacent ones of the preforms of the packages. In some implementations, the method comprises forming the encapsulant body and/or the oblong carrier body so that at least one reservoir for accommodating flowable encapsulant medium is formed at a top side of a respective one of said indentations. Such an embodiment is shown for instance in FIG. 53 and FIG. 54. The mold flow during encapsulation may be directed in such a way that flowable mold material may be accommodated in the at least one reservoir, for instance excessive encapsulant medium. In another variation, the method comprises forming the encapsulant body and/or the oblong carrier body so that a reservoir for accommodating flowable encapsulant medium is formed at a bottom side of a respective one of said indentations. Also, such a bottom-sided reservoir may function for accommodating encapsulant material during an encapsulation process. A corresponding embodiment is shown in FIG. 55 and FIG. 56. In another example, it is possible that the mentioned reservoir is present only on the top side, not on the bottom side in the indentation region (see FIG. 53 and FIG. 54). Alternatively, it is possible that the mentioned reservoir is present only on the bottom side, not on the top side in the indentation region (see FIG. 55 and FIG. 56). In yet another variation, it is possible that the mentioned reservoirs are present both on the top side and on the bottom side in the indentation region, which may further increase the reservoir volume (see FIG. 57 and FIG. 58).

In an embodiment, the method comprises forming the encapsulant body and/or the oblong carrier body so that a lateral protrusion, such as a substantially V-shaped lateral protrusion, is formed at a respective one of said indentations. As shown for instance in FIG. 53 to FIG. 60, such a lateral V-shaped protrusion may extend the reservoir volume for accommodating encapsulant flow without limiting the leadframe unit density.

In an embodiment, the method comprises forming the encapsulant body and/or the oblong carrier body so that at least one continuous channel for channeling flowable encapsulant medium is formed between adjacent leads. A plurality of continuous channels may also be formed in between adjacent leads. The continuous channel(s) may be used for channeling flowable encapsulant medium between adjacent preforms of packages transverse to a respective one of said indentations. Such an embodiment is shown in FIG. 59 and FIG. 60. One or more channels may be formed at a respective indentation, wherein plural channels may extend straight and parallel to each other. By providing such a channel, a mold flow may be precisely guided between adjacent packages around the channel.

In an embodiment, the method comprises forming the encapsulant body and/or the oblong carrier body so that at least one continuous channel, in particular having the same thickness as the patterned metal plate, is formed for channeling flowable encapsulant medium between adjacent preforms of packages transverse to a respective one of said indentations.

In an embodiment, the method comprises forming the encapsulant body and/or the oblong carrier body so that the at least one channel is formed at a top side and/or at a bottom side of a respective one of said indentations. Thus, the mentioned channel can be located on a top side, on a bottom side or both on a top side and a bottom side of an indentation between two adjacent package preforms. In an embodiment, the channel may have the same thickness as the patterned metal plate, i.e. may extend through the entire patterned method plate between its front side and its back side.

In an embodiment, the method comprises forming the continuous oblong encapsulant body by guiding flowable encapsulant medium between adjacent packages or preforms of packages along a plurality of substantially parallel sub-paths of the straight encapsulation path, said sub-paths being in particular separated from each other by leads. Thus, a multiple entry mode flow design may be realized, promoting an efficient encapsulation.

According to another exemplary embodiment, a method of manufacturing packages is provided, wherein the method comprises mounting a plurality of electronic components on an oblong carrier body which comprises a plurality of sections as carriers and which is arranged between two opposing rows of leads arranged along the oblong carrier body, electrically coupling each of the components with at least one of the leads, encapsulating at least partially the oblong carrier body, at least partially the electronic components and only partially the leads by a continuous oblong encapsulant body and thereafter separating the encapsulated oblong carrier body, electronic components and leads into the packages or preforms of the packages, each package or preform comprising one of the carriers, a portion of the encapsulant body, a part of the leads, and at least one of the electronic components.

In an embodiment, the method comprises using a tape, in particular a sticky tape, as the dielectric carrier. Using a sticky tape for provisionally or permanently mounting one or more electronic components may simplify the manufacturing process as compared to a solder based die attach process.

In an embodiment, the method comprises removing the carriers (i.e. the oblong carrier body) from the electronic components after the encapsulating. By taking this measure, a temporary (preferably dielectric) carrier may be removed from the preform of the package, for instance for exposing a backside metallization of a chip type electronic component.

In an embodiment, the oblong carrier body is a purely dielectric oblong carrier body. When the oblong carrier body is a purely dielectric oblong carrier body, it may contribute to an electric insulation of the electronic component within the package. For instance, the oblong carrier body may be an adhesive dielectric tape. In an embodiment, the oblong carrier body is tape-based, in particular is a strip of tape. In an embodiment, the oblong carrier body is a sticky tape.

In another embodiment, the oblong carrier body is a metallic sheet. In such an alternative embodiment, the oblong carrier body may for instance a patterned metal plate or part thereof, for instance made of copper or aluminium.

In an embodiment, the method comprises encapsulating by molding so that the encapsulant body is a molded block. Such a molded block or bar may be an integral body made of mold compound material and encapsulating multiple packages or preforms thereof. For instance, such a molded block may be a substantially cuboid block.

In an embodiment, the method comprises encapsulating by transferring encapsulant material to flow from electronic component to electronic component along the oblong carrier body. Such a preferred encapsulation process may be denoted as infusion molding. Flowable or even liquid encapsulant material may be forced to flow along the packages arranged along a row, for instance parallel to the opposing rows of leads, so as to surround all electronic components of a row simultaneously. As a result, a molded block or bar of encapsulant material may be obtained which can be solidified upon curing the mold compound. The only thing which needs to be done thereafter for obtaining the packages is separating the block, together with the partially encapsulated electronic components, carriers and leads so as to obtain a plurality of packages.

In an embodiment, the separating comprises at least one of the group consisting of mechanically sawing, laser cutting, and punching. Separating the encapsulant block may be carried out preferably by mechanically sawing or laser cutting. A singulation of an encapsulated structure for separating a set of leads belonging to a respective package may be carried out by punching exposed portions of the leads in a direction perpendicular to the cutting of the encapsulant body.

In an embodiment, the oblong carrier body is a strip which has a substantially constant width (and preferably also thickness) over its entire extension along the rows of leads. When the oblong carrier body is a strip with constant width over its entire extension, the length of the various carrier sections may be freely selected in accordance with a specific application (in particular in accordance with a number of electronic components being encapsulated per package). Together with the parallel array of leads on both sides of the encapsulant body, a completely free scalability of the package dimensions may thus be made possible.

In another embodiment, the oblong carrier body has constrictions between adjacent carriers. When the oblong carrier body has constrictions or narrow sections between precisely defined carrier sections, the dimension of a package is defined by the dimension of a respective carrier between two subsequent constrictions or bottlenecks (or by a selectable number of directly adjacent carriers). The mentioned configuration has the advantage that separating the encapsulant requires substantially only separating mold compound material with the only exception of the separation of the narrow constrictions of the oblong carrier body. Hence, a corresponding singulation process may be carried out in a fast and simple way thanks to the constriction design.

In an embodiment, the method comprises encapsulating so that one main surface of the oblong carrier body remains exposed with respect to the encapsulant body. More specifically, the main surface of the oblong carrier body facing away from the electronic component may remain free of encapsulant material even during encapsulation. This makes possible to remove the oblong carrier body as a whole after encapsulation, if desired.

In an embodiment, the leads extend parallel to each other and each perpendicular to the oblong carrier body. Such a parallel extension of the leads in a large number along both sides of the oblong carrier body allows scaling the number of leads required per package, for each specific application.

In an embodiment, the leads of each row are interconnected by at least one bar. The method may then comprise separating the leads of each row from the respective at least one bar after the encapsulating. The mentioned bars may hold all leads of a row together prior to encapsulation and singulation. However, after encapsulation and during singulation, the one or more bars may be cut as well so that the individual leads may be separated. After encapsulation, multiple leads assigned to a respective package may be held together by the partially surrounding encapsulant.

In an embodiment, the method comprises encapsulating so that the bars remain exposed from the encapsulant body. When the bars remain exposed during encapsulation, they may be freely accessible for separation after encapsulation.

In an embodiment, the method comprises attaching the oblong carrier body to a patterned metal plate which comprises the leads and has a recess which is bridged, in particular at an elevated vertical level, by the oblong carrier body. In particular, the method may comprise mounting the electronic components at a vertical level between the oblong carrier body and the patterned metal plate. Such a patterned metal plate may for instance be a leadframe. At a later position of the oblong carrier body, the leadframe may have a correspondingly shaped and dimensioned recess between two adjacent rows of leads. Said recess may be bridged by the oblong carrier body, for instance by a sticky tape. In order to arrange the electronic components of the packages to be manufactured at a correct vertical level, the oblong carrier body may be stretched over the patterned metal plate to thereby assume a rigid configuration as a basis for mounting the electronic components thereon.

In an embodiment, the method comprises forming, in particular by plating, an electrically conductive layer which is connected to the electronic components, wherein in particular the method comprises forming the electrically conductive layer so that the electrically conductive layer covers also part of the encapsulant body.

In an embodiment, the exposed lead tip inspection metallization forms part of a carrier on which the electronic component is mounted. Thus, the LTI feature may be provided by an electrically conductive carrier itself which may extend up to a sidewall of the encapsulant. Consequently, an LTI feature may be provided with simple measures.

In an embodiment, the method comprises plating at least part of the at least one lead. By such a plating process, an exposed surface of the leads may be made solderable, for instance by a tin coating.

In an embodiment, the electronic component is configured as a power semiconductor chip. Thus, the electronic component (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide or gallium nitride). A semiconductor power chip may comprise one or more field effect transistors, diodes, inverter circuits, half-bridges, full-bridges, drivers, logic circuits, further devices, etc. However, exemplary embodiments may also be applied to other types of chips, for instance to logic chips.

As substrate or wafer forming the basis of the electronic components, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in gallium nitride or silicon carbide technology.

For the encapsulating, a plastic-like material or a ceramic material which may be subsidized by encapsulant additives such as filler particles, additional resins or others may be used.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

Furthermore, the following additional aspects of exemplary embodiments are disclosed:

Aspect A. A method of manufacturing packages (100), wherein the method comprises:
 mounting a plurality of electronic components (104) on carriers (102) of a patterned metal plate (130), said carriers (102) being surrounded by assigned leads (108) of the patterned metal plate (130) extending along four sides around the respective carrier (102);
 electrically coupling each of the components (104) with the assigned leads (108) extending along four sides around the carrier (102) carrying the respective component (104);
 at least partially encapsulating carriers (102), assigned electronic components (104) and assigned leads (108) along four sides around said carriers (102), which carriers (102), electronic components (104) and leads (108) being arranged along a straight encapsulation path, by a continuous oblong encapsulant body (124); and thereafter separating the carriers (102), electronic components (104) and leads (108) being at least partially encapsulated by the continuous oblong encapsulant body (124) along the straight encapsulation path into the packages (100) or into preforms of the packages (100), so that each package (100) or preform comprises at least one (i.e. one or more than one) of the carriers (102), assigned leads (108) extending along four sides around said carrier (102), at least one assigned electronic component (104), and a portion of the encapsulant body (124). For example, singulating the oblong encapsulant body may be carried out to form a plurality of individual packages each comprising at least one carrier.

Aspect B. A package (100), comprising:
a carrier (102);
an electronic component (104) mounted on the carrier (102);
an encapsulant (106) encapsulating at least part of the electronic component (104) and the carrier (102); and
leads (108) extending along four sides around the carrier (102), being electrically coupled with the electronic component (104) and extending beyond the encapsulant (106) along all four sides;
wherein the encapsulant (106) comprises steps (131) along at least two opposing of said four sides so that end portions of said leads (108) are exposed at a top surface, a bottom surface and a lateral surface of each respective step (131).

Aspect C. The package (100) according to aspect B, wherein sections of the leads (108) and sections of the encapsulant (106) at a respective step (131) extend up to different vertical levels at said top surface and/or at said bottom surface.

Aspect D. The package (100) according to aspect B or C, wherein the sections of the leads (108) and the sections of the encapsulant (106) are aligned at a lateral surface of the respective step (131) connecting said top surface with said bottom surface.

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 1 illustrates a three-dimensional view of a top side of a package according to exemplary embodiments.

FIG. 2 to FIG. 4 illustrate three-dimensional views of a bottom side of packages according to exemplary embodiments which all have a top side appearance according to FIG. 1.

FIG. 5 illustrates a cross-sectional view of the package according to FIG. 2.

FIG. 6 illustrates a cross-sectional view of the package according to FIG. 3.

FIG. 7 illustrates a cross-sectional view of the package according to FIG. 4.

FIG. 8 illustrates different views of structures obtained at a first stage of a method of manufacturing packages according to an exemplary embodiment.

FIG. 13 illustrates a plan view of a structure obtained during manufacturing packages according to an exemplary embodiment.

FIG. 14 illustrates a side view of the structure of FIG. 13.

FIG. 15 illustrates different views of structures obtained during manufacturing packages according to an exemplary embodiment.

FIG. 16 illustrates a horizontal mold injection during manufacturing packages according to an exemplary embodiment.

FIG. 17 illustrates different views of structures obtained during manufacturing packages according to an exemplary embodiment.

FIG. 18 illustrates a plan view of a structure without a groove for mold lock obtained during manufacturing packages according to an exemplary embodiment.

FIG. 19 illustrates a plan view of a structure with a groove for mold lock obtained during manufacturing packages according to an exemplary embodiment.

FIG. 20 illustrates a three-dimensional top view and FIG. 21 illustrates a three-dimensional bottom view of a package according to an exemplary embodiment.

FIG. 22 illustrates a cross-sectional view of the package of FIG. 20 and FIG. 21.

FIG. 23 illustrates a side view of the package of FIG. 20 to FIG. 22 according to an exemplary embodiment.

FIG. 41 shows a structure illustrating different stages of manufacturing packages according to an exemplary embodiment.

FIG. 42 illustrates structures obtained during singularizing packages according to an exemplary embodiment.

FIG. 43 illustrates structures obtained during singularizing packages according to another exemplary embodiment.

FIG. 45 shows a plan view of a patterned metal plate used as a basis for manufacturing packages according to an exemplary embodiment.

FIG. 46 shows a plan view of the patterned metal plate of FIG. 45 after encapsulation by a plurality of parallel encapsulant bodies according to an exemplary embodiment.

FIG. 49 shows a plan view and a side view of an encapsulant body manufactured according to an exemplary embodiment.

FIG. 51 shows a lateral edge region of a package manufactured according to an exemplary embodiment.

FIG. 52 shows a plan view of a patterned metal plate used as a basis for manufacturing packages according to another exemplary embodiment and shows a flowing direction of encapsulant medium.

FIG. 53 shows a three-dimensional top view and a corresponding detail of still integrally connected pre-forms of packages according to an exemplary embodiment.

FIG. 54 shows a three-dimensional bottom view of the still integrally connected pre-forms of packages according to FIG. 53.

FIG. 55 shows a three-dimensional top view of still integrally connected pre-forms of packages according to another exemplary embodiment.

FIG. 56 shows a three-dimensional bottom view and a corresponding detail of the still integrally connected pre-forms of packages according to FIG. 55.

FIG. 61 shows a three-dimensional top view of still integrally connected pre-forms of packages according to yet another exemplary embodiment.

FIG. 62 shows a three-dimensional bottom view of the still integrally connected pre-forms of packages according to FIG. 61.

FIG. 63 shows a three-dimensional view of a package with four steps at four sides according to an exemplary embodiment.

FIG. 64 shows a three-dimensional view of a package with two steps and two vertical sidewalls at four sides according to an exemplary embodiment.

FIG. 72 shows a detail of a step at an edge of a package manufactured using a mold reservoir according to an exemplary embodiment.

FIG. 73 shows details of a step at an edge of a package manufactured using a mold channel according to an exemplary embodiment.

FIG. 74 shows details of a step at an edge of a package manufactured using an infuse mold gate according to an exemplary embodiment.

DETAILED DESCRIPTION

Figure 9:
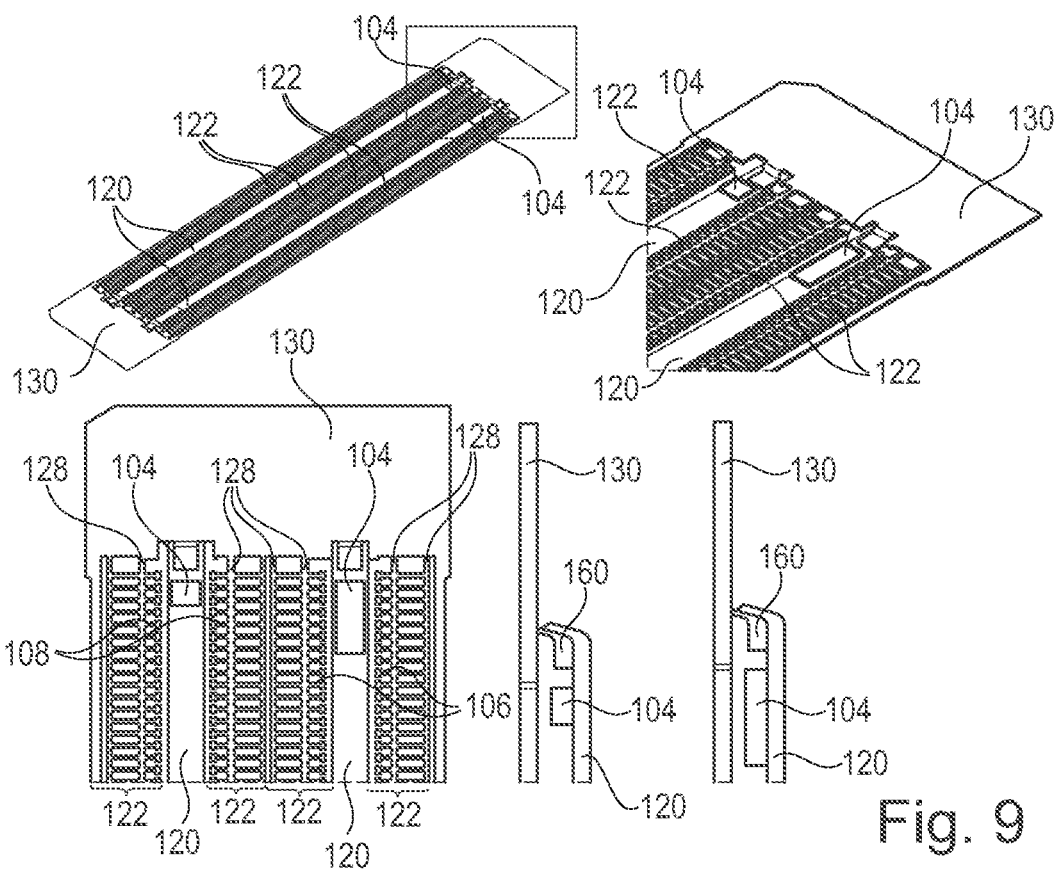
FIG. 9 illustrates different views of structures obtained at a second stage of a method of manufacturing packages according to an exemplary embodiment.

The illustration in the drawing is schematically and not to scale.

Before exemplary embodiments will be described in more detail referring to the figures, some general considerations will be summarized based on which exemplary embodiments have been developed.

According to an embodiment of a first aspect, a dielectric carrier, preferably a sticky tape, may be used as a support for one or multiple electronic components to be mounted thereon for one or multiple packages. Descriptively speaking, a tape may be configured as a die paddle or to substitute a conventional die paddle. Such a dielectric carrier, preferably a tape, may form part of the readily manufactured package or may be removed at the end (i.e. may be a temporary carrier). Such an adhesive dielectric carrier (for instance an encapsulated tape, an exposed tape or a tape to be removed before completing manufacture of the package) may also increase flexibility of the manufacturing process and may improve the electrical performance of the obtained packages. In an embodiment, the provision of a dielectric carrier such as a sticky tape may also eliminate the need for tie bars or the like.

According to an exemplary embodiment of a second aspect, symmetrical lead columns may be arranged at both sides of an oblong carrier body, for instance formed on the basis of a tape or on the basis of a leadframe. With such a symmetrical lead column design, a proper scalability of manufactured packages may be made possible in terms of dimensions of a carrier and in terms of a number of connected leads per package. In this context, it may also be possible to provide an LTI (lead tip inspection) feature with low effort.

According to an exemplary embodiment of the first aspect, a package with a tape based carrier made of an electrically insulating material is provided. On this basis, a die pad-less and/or tie bar-less molded package may be created.

To enable a high power package (in particular in accordance with a DSO platform), a minimum creepage distance is a limitation on the package outline.

In order to improve the RDSon performance of a package, it may be required that the maximum chip size increases. Conventional chip pads cannot always handle this requirement. RDSon stands for drain-source on resistance, or the total resistance between the drain and source in a Metal Oxide Field Effect Transistor (MOSFET), when the MOSFET is on.

Reduction of manufacturing effort is a focus in package technology. How to increase a leadframe design density may be able to increase the manufacturing efficiency.

Conventionally, package size is increased to gain creepage distance, but is a concept involving high effort.

According to an exemplary embodiment, a method of making or manufacturing a dual side outline tie bar-less package is provided, wherein the package is assembled without metallic die paddle. This may result in an exposed backside metallization of a semiconductor die of a gull wing-type surface mounted device (SMD) package. A package according to an exemplary embodiment may be assembled without die paddle, which may result in a tape-protected die back. Advantageously, such a tape may further comprise high thermally conductive properties. It is also possible that the tape further comprises high electrical isolation properties. A specific mold concept may be applied to increase leadframe density, and to reduce the manufacturing effort.

An exposed pad-less leadframe concept may be provided according to an exemplary embodiment to enable a maximum chip size in a package (in particular from a DSO platform). Consequently, a maximum chip size can increase since there is no die to die pad clearance constraint. Moreover, a tie-bar less leadframe design may improve creepage distance. Said tie bar-less configuration may be achievable by the use of a tape as bond pad. Such a tie bar-less concept may also render the manufactured packages highly appropriate for high voltage applications. In particular, a thermally conductive and electrically insulating tape may be advantageous. Furthermore, the described manufacturing concept for manufacturing packages may enable a high density leadframe design.

A number of advantages occur when using tape as die pad: Firstly, this may increase the voltage class of the package, as internal metal to metal distances no longer constrain. Additionally or alternatively, a larger chip size can be used for achieving a better performance. Secondly, freely scalable packages may be manufactured on the basis of such an approach. For the case of an exposed die pad, the tape can remain as part of the readily manufactured package, for instance as an interface to a heat sink for heat removal.

Alternatively, it may also be possible to remove the tape before completing manufacture of the package. In such an embodiment, a created exposed metal pad may then be used for heat dissipation.

In particular, a method of manufacturing a tie bar-less semiconductor package without conductive die paddle may be provided, wherein the chip may be carried by an electrically non-conductive carrier, for example a dielectric and preferably adhesive tape. When a tape is used as (or as a replacement for) a die pad, the non-metallic property of the tape may provide for a better internal isolation between two or more chips or other kinds of electronic components. Furthermore, an increased flexibility in terms of multichip design may be achieved. Apart from this, a tape-type carrier can be used as external isolation material, for instance to interface with a heat sink. Furthermore, no tie bar influences the package outline, so that proper creepage properties may be achieved, and a high speed separation may be enabled. Beyond this, the tape may be removed, and a large exposed pad can be formed by a metal build up, for instance using a plating approach.

According to an exemplary embodiment of the second aspect, symmetrical leads may be provided at opposing sides of an oblong carrier body which may be provided in common for multiple electronic components and multiple packages. Such symmetrical lead arrays or rows may allow different die sizes to be packaged in the same column. On this basis, infused cavity molding on a dual side leaded package may be carried out.

Encapsulating electronic components, and in particular molding, is an important process in semiconductor manufacturing as it relates to batch processing which affects overall packaging quality and effort. However, a conventional cavity transfer molding approach implementing a runner and gate arrangement has several limitation. In such a conventional approach, a processing window has limitations concerning maximizing the density versus mold transfer. Moreover, stress during a mold ejection and a degating process is also a challenge, in particular when packages move towards continued miniaturization. This may result in a risk of delamination of leads and pads.

In contrast to this, an exemplary embodiment provides a mold cavity designed to be connected from package to package vertically or horizontally. In other words, adjacent packages of a row or column of packages may be connected with one another in terms of mold flow before curing. Advantageously, such an architecture makes it possible that runner and gate provisions between package to package may become dispensable. Descriptively speaking, such a manufacturing architecture may be denoted as infuse mold canal design concept. Furthermore, an exemplary embodiment may enable package singulation in a highly flexible way, i.e. according to a desired or required pin number of a respective row of pins or leads. For example by mechanically sawing or laser processing, singulation of the common molded packages may be achieved. Hence, a freely scalable manufacturing concept may thus be provided. Highly advantageous, such a manufacturing architecture may enable the manufacture of packages (in particular of DSO-type packages) with lead tip inspection (LTI) feature at an exposed pad. Thus, packages manufactured according to the described concept may be properly scalable in terms of pin count, and preferably no de-gate marks occur on a corresponding package.

Moreover, the described manufacturing process may enable the provision of a carrier groove which may function as a mold locking feature and/or as a stress release feature for a fuse pad design. A process flow for a manufacturing method after having assembled multiple electronic components on an oblong carrier body may be the execution of infused cavity molding, followed by post mold curing, dambar cutting, plating, marking, forming, and singulation (for instance by mechanically sawing or execution of a non-mechanical (for instance laser or waterjet based) singulation process). By the described manufacturing process, it may be possible to increase the unit density (i.e. the number of manufacturable packages per area) of dual side leaded packages through infused cavity molding without strip size change.

According to embodiments, a semiconductor manufacturing method using infused molding may be provided, wherein an infused link chain runner (vertical or horizontal) connecting package to package may be implemented, so that the mold compound may be transferred from one package region to another along a row or column. Advantageously, a vertical sidewall of the manufactured packages may be provided without flashes on a respective singulated unit. This may enable package stackability, for instance in printed circuit board (PCB) applications. In particular for DSO-type packages, the manufacturing effort may be significantly reduced while providing a flexibly scalable package concept and manufacturing flow. In terms of package performance, the described manufacturing concept enables the manufacture of packages with large chips as well as the provision of short electrical paths.

Advantageously, a method of manufacturing a dual side outline exposed pad package with LTI feature may thus be provided, wherein die paddles are infused vertically, lead tip inspection may be made possible at an exposed pad side wall, no tie bars may occur (which may result in a bigger chip to package ratio), infuse die paddles may be provided for scaling the package to different pin counts and body size, and a non-chamfer package body may be provided.

According to exemplary embodiments, an ultra-high-density-very-thin-quad-flat-non-leaded package manufacturing concept may be provided which may be based on the use of a multi gate mold flow design. Using such a manufacturing architecture, it may be possible to increase a leadframe unit density. In particular, a through mold gate system may be provided for guiding a mold compound gate flow through from one unit to a respective neighboring unit. With such a design concept, it may be possible to remove side gate design dimensions and replace them with additional units. This may increase the throughput of packages per leadframe (or more generally patterned metal plate) area. By implementing a direct gate mold gate and mold only flow from one unit to another unit (accompanied by removing a mold gate dimension), additional units may be added more which may allow to increase the units density.

Descriptively speaking, exemplary embodiments relate to a patterned metal plate (such as a leadframe) in which carriers (such as die pads) in a column are connected, and the carriers of the patterned metal plate and components (for example dies) mounted thereon are subjected to an encapsulant (in particular a mold) flow process to create an encapsulated patterned metal plate (in particular a molded leadframe) before singulation into individual packages or preforms thereof. In a preferred embodiment, adjacent leadframe sections in a column may be connected by a multi-lead structure, for example coupled with a groove (such as a V-groove). This may advantageously facilitate the flow of mold from the top to bottom of a column along a straight encapsulation path.

FIG. 1 illustrates a three-dimensional view of a top side of a package 100 according to an exemplary embodiment. FIG. 2, FIG. 3 and FIG. 4 illustrate three-dimensional views of a bottom side of packages 100 according to exemplary embodiments which all have a top side appearance according to FIG. 1. FIG. 5 illustrates a cross-sectional view of the package 100 according to FIG. 2. FIG. 6 illustrates a cross-sectional view of the package 100 according to FIG. 3. FIG. 7 illustrates a cross-sectional view of the package 100 according to FIG. 4. All these embodiments provide a package 100 which may be denoted as a DSO tie bar-less package which may be manufactured using infuse gate methods discussed herein. FIG. 1 shows a three-dimensional view of package 100 which may correspond to the package 100 of FIG. 2 and FIG. 5, to the package 100 of FIG. 3 and FIG. 6, and to the package 100 of FIG. 4 and FIG. 7, what concerns its exterior appearance from the shown side.

What is shown in FIG. 1 is an encapsulated package 100 with leads 108 extending beyond opposing sidewalls of the encapsulant 106.

Referring to the embodiment of FIG. 1, FIG. 2 and FIG. 5, a package 100 with exposed backside metallization of a semiconductor chip-type electronic component 104 is provided. The exposed backside metallization may also be plated, for instance by tin (Sn). The package 100 according to FIG. 2 and FIG. 5 may be manufactured by mounting electronic component 104 on a carrier 102 that is such as a sticky tape (see FIG. 4), by electrically coupling pads of the electronic component 104 with leads 108 by wire bonding using electrically conductive interconnect bodies 114, and by subsequently encapsulating the carrier 102, the electronic component 104, the leads 108 and the electrically conductive interconnect bodies 114 by a mold-type encapsulant 106. For the embodiment of FIG. 1, FIG. 2 and FIG. 5, the tape-type carrier 102 may then be removed after the encapsulation to thereby expose the backside metallization of the electronic component 104. For instance, such a manufacturing process may be carried out by batch processing, for example in accordance with the description of FIG. 8 to FIG. 12. As a result, FIG. 1, FIG. 2 and FIG. 5 show a package 100 assembled without die paddle, which results in an exposed backside metallization of the encapsulated die. Package 100 according to FIG. 2 and FIG. 5 is a gull wing-type surface mounted device (SMD) package 100, i.e. a package 100 which can be mounted on a mounting base such as a printed circuit board (not shown) in surface mounted device technology.

The embodiment of FIG. 1, FIG. 3 and FIG. 6 differs from the embodiment of FIG. 2 and FIG. 5 in that additionally plated copper may be formed both on the exposed backside metallization of the electronic component 104 as well as on a surrounding annular portion of the cured mold compound of encapsulant 106. The so obtained package 100 of FIG. 1, FIG. 3 and FIG. 6 thus comprises the electronic component 104, the encapsulant 106 encapsulating the electronic component 104, and an electrically conductive layer 150 (obtained by the described plating process) exposed beyond the encapsulant 106 and connected with the electronic component 104 as well as with a portion of encapsulant 106. Multiple leads 108 are electrically coupled with the electronic component 104 by electrically conductive interconnect bodies 114 (which may again be embodied as bond wires). As shown, the leads 108 partially extend beyond the encapsulant 106 to enable an electric coupling of the package 100 with an electronic periphery such as a printed circuit board (PCB) or any other mounting base (not shown). As already mentioned, part of the plated electrically conductive layer 150 covers part of the encapsulant 106. Advantageously, an outline of the package 100 is free of any tie bar, so that package 100 of FIG. 1, FIG. 3 and FIG. 6 is configured as tie bar-less package 100. As shown, package 100 comprises a plurality of leads 108 extending beyond the encapsulant 106 at two opposing sides of the package 100. A respective portion of each lead 108 which extends beyond the encapsulant 106 is gull-wing shaped. Two opposing sidewalls 118 of the encapsulant 106 are vertical, and said vertical sidewalls 118 are free of leads 108. The other two sidewalls of the encapsulant 106 which are traversed by leads 108 may be slanted. As already described, plating can be carried out for forming electrically conductive layer 150 which is connected to the electronic component 104 and additionally also covers part of the encapsulant 106. In order to accomplish this, it is for instance possible to configure the encapsulant 106 as a plateable mold compound. Portions of the encapsulant 106 where the electrically conductive layer 150 is to be plated may then be selectively removed (for example by laser processing) before plating the electrically conductive layer 150. The electrically conductive layer 150 may be a metal layer which may be formed after removing a dielectric carrier 102.

Now referring to the embodiment of FIG. 1, FIG. 4 and FIG. 7, this embodiment shows a package 100 which differs from package 100 of FIG. 2 and FIG. 5 by protecting the electronic component 104 with a dielectric carrier 102. More specifically, the molded chip is protected by a tape according to FIG. 4 and FIG. 7. More specifically, the package 100 of FIG. 4 and FIG. 7 comprises the dielectric carrier 102, which is here embodied as a sticky electrically insulating tape. Semiconductor chip-type electronic component 104, such as a power semiconductor chip, is adhesively attached directly to the carrier 102 thanks to its self-adhesive properties. Mold-type encapsulant 106 encapsulates part of the carrier 102 and the electronic component 104.

Advantageously, the dielectric carrier 102 is free of metal and is purely dielectric, and therefore consists exclusively of electrically insulating material. Thereby, the dielectric carrier 102 contributes to the electric isolation of the encapsulated electronic component 104. As shown, a lower main surface of the dielectric carrier 102 is entirely exposed with respect to the encapsulant 106. As best seen in FIG. 7, an exterior surface of the dielectric carrier 102 is in flush with an exterior surface of the encapsulant 106 to thereby form a common planar lower main surface.

Advantageously, the material of the dielectric carrier 102 according to FIG. 4 and FIG. 7 may be thermally conductive, and may preferably have a thermal conductivity of at least 10 W/mK. For instance, the thermal conductivity of the dielectric carrier 102 may be enhanced by inserting highly thermally conductive filler particles (for instance comprising aluminum oxide or aluminum nitride) into the dielectric carrier 102. Package 100 of FIG. 4 and FIG. 7 is assembled without metallic die paddle. The result of this manufacturing concept is the exposed tape protecting the backside of the die.

Figure 35:
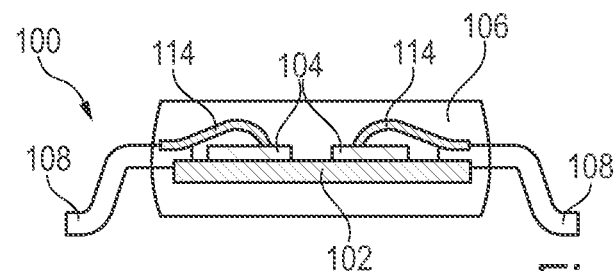
FIG. 35 illustrates a cross-sectional view of a package according to still another exemplary embodiment.

Advantageously, the tape-shaped dielectric carrier 102 according to FIG. 4 and FIG. 7 has highly thermally conductive properties and also provides a high electrical isolation. Thus, the tape design may ensure both a reliable electric isolation and a high thermal dissipation of heat generated by the encapsulated electronic component 104 during operation of the package 100. More generally, the material properties of the tape constituting carrier 102 may be freely selectable in accordance with the specific needs of a respective application. In other words, the material of the tape may be a freely selectable design parameter. In another embodiment, the tape-shaped dielectric carrier 102 may be completely enclosed by the encapsulant 106. For example, as shown in FIG. 35.

Concluding, in each of the embodiments of FIG. 1 to FIG. 7, either the electronic component 104 may be exposed (for instance covered with a plating layer), or an electrically conductive layer 150 covering electronic component 104 and part of the encapsulant 106, or an adhesive tape forming dielectric substrate 102. In all embodiments, as shown in FIG. 5 to FIG. 7, the electronic component 104 is connected with corresponding leads 108 by electrically conductive interconnect bodies 114, which are here embodied as bond wires or bond ribbons.

In the following, referring to FIG. 8 to FIG. 12, a method of manufacturing packages 100 according to an exemplary embodiment will be explained. In each of these figures, a three-dimensional overview, a three-dimensional detail and further detailed views are shown for illustrating various features.

FIG. 8 illustrates different views of structures obtained at a first stage of a method of manufacturing packages 100 according to an exemplary embodiment.

More specifically, FIG. 8 shows a patterned metal plate 130 which may be configured as a leadframe (for instance made of copper). Patterned metal plate 130 has multiple oblong recesses 132. In this embodiment, each oblong carrier body 120 for supporting electronic components 104 takes the form of a dielectric tape and they are attached to the patterned metal plate 130 in order to bridge recesses 132 in the patterned metal plate 130. As explained subsequently in relation to the FIG. 12 embodiment, each oblong carrier body 120 may be subsequently encapsulated and separated such that the separated parts of an oblong carrier body 120 functions as a temporary or permanent carrier 102 of a respective package 100 (such as those shown in FIG. 4 and FIG. 7).

Each of multiple rows 122 of leads 108 extend parallel to each other. Leads 108 of one row 122 are arranged in parallel to each other as well. The extension of each individual lead 108 is perpendicular to an extension direction of each of a respective oblong carrier body 120. On the left-hand side and on the right-hand side of each oblong carrier body 120, a respective row 122 of leads 108 is provided. As best seen in the detailed plan view of FIG. 8, the leads 108 of each row 122 are interconnected by a respective metallic bar 128. At the end of the manufacturing process (more precisely after the encapsulation process described referring to FIG. 10), the leads 108 of each row 122 may be separated from the respective bar 128 and may thereby be electrically separated from each other.

As already mentioned, each of the adhesive tape-type oblong carrier body 120 can be adhesively connected to patterned metal plate 130. The latter comprises an exterior frame and also the leads 108 of all rows 122. Each recess 132 is bridged at an elevated vertical level by the oblong carrier body 120 (see the side view on the right-hand side of FIG. 8). Descriptively speaking, each tape constituting a respective one of the oblong carrier bodies 120 is applied as die carrier fusing a whole column of the strip. Said tape can function as temporary carrier (for instance for manufacturing a package 100 shown in FIG. 2 or FIG. 3) or as final layer for isolation (for instance for manufacturing a package 100 shown in FIG. 4).

In the illustrated embodiment, the strips of tape constituting the dielectric oblong carrier body 120 are provided with constant thickness D.

Although FIG. 8 is described in the context of a dielectric oblong carrier body 120, oblong carrier bodies in the form of a continuous or patterned metallic strip may also be used. Such a metallic strip may be integrally formed with the patterned metal plate 130.

FIG. 9 illustrates different views of structures obtained at a second stage of a method of manufacturing packages 100 according to an exemplary embodiment. Although the manufacturing processes in FIG. 9 to FIG. 13 are described in the context of an oblong carrier body 120 that is a dielectric tape or strip, the process may also be applied to a metallic oblong carrier body.

Based on the structure shown in FIG. 8, the structure shown in FIG. 9 may be obtained by mounting a plurality of electronic components 104, such as semiconductor chips, on each dielectric oblong carrier body 120. The latter comprises a plurality of sections which may function in the readily manufactured packages 100 as carriers 102 (see FIG. 4 and FIG. 7). As a result, each mounted electronic component 104 is arranged between two opposing rows 122 of leads 108 arranged along the oblong carrier body 120 to which a respective electronic component 104 is attached so as to be adhesively connected.

Although not shown in FIG. 9, each of the assembled electronic components 104 may then be electrically coupled with a respective one of the leads 108. This may be accomplished by electrically conductive interconnect bodies 114, such as bond wires. As an alternative to wire bonding, other electrical interconnect bodies such as a clip (for instance made of copper) may also be used for electrically connecting the leads 108 with pads of the electronic components 104 (not shown).

As best seen in the side views on the bottom right-hand side of FIG. 9, the electronic components 104 are arranged at a vertical level between the dielectric oblong carrier body 120 and the patterned metal plate 130.

Advantageously, FIG. 9 illustrates a very simple die attach on the sticky tape without the need of any curing process. Furthermore, the chip size is freely scalable with the shown common tape approach. In FIG. 9, different electronic components 104 with significantly different dimensions are shown to illustrate this fact.

As shown in FIG. 9, the various semiconductor chip-type electronic components 104 may be freely mounted on the dielectric carrier bodies 120. As can be taken from FIG. 9, the package manufacturing concept is perfectly scalable and is compatible with different chip types, different chip sizes, and different numbers of chips per package 100. For instance, in the shown embodiment, electronic components 104 of different dimensions are attached to the sticky surface of the tape-type dielectric oblong carrier body 120. In view of the constant thickness D of the oblong carrier body 120, it can be flexibly decided which partial length of the dielectric oblong carrier body 120 corresponds to a respective carrier 102 and consequently to a respective package 100. Correspondingly, also a desired number of leads 108 per package 100 may be freely selected. As best seen on the bottom right-hand side of FIG. 9, the electronic components 104 are placed on the sticky surface of the dielectric oblong carrier body 120 facing the patterned metal plate 130, and spaced with respect to the patterned metal plate 130. Elevated portions 160 of the generally planar patterned metal plate 130 may ensure said spaced arrangement of the electronic components 104 with respect to the patterned metal plate 130.

Figure 10:
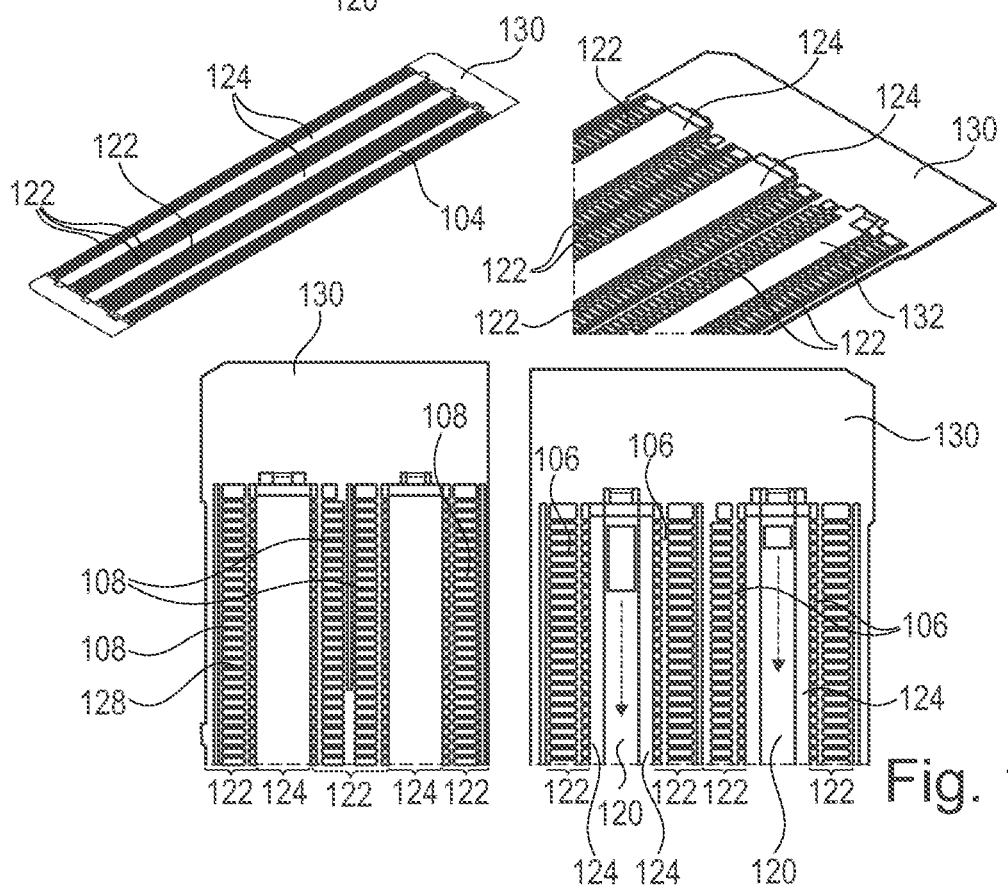
FIG. 10 illustrates different views of structures obtained at a third stage of a method of manufacturing packages according to an exemplary embodiment.

FIG. 10 illustrates different views of structures obtained at a third stage of a method of manufacturing packages 100 according to an exemplary embodiment.

In order to obtain the structure shown in FIG. 10, the structure shown in FIG. 9 may be partially encapsulated by forming an array of parallel, continuous, straight and oblong encapsulant bodies 124. Each encapsulant body 124 is formed on an assigned dielectric oblong carrier body 120 to cover the latter in a plan view. More specifically, each encapsulant body 124 covers an assigned oblong carrier body 120, the electronic components 104 mounted thereon and part of the leads 108 of the pair of rows 122 between which the respective encapsulant body 124 and the assigned dielectric oblong carrier body 120 is located.

Preferably, said encapsulating process may be carried out by molding. Hence, each encapsulant body 124 may be a molded block of mold compound. Highly advantageously, the process of encapsulating may be carried out by transferring flowable uncured encapsulant material (in particular a liquid mold compound) forced to flow along the array of electronic components 104 attached to an assigned dielectric oblong carrier body 120 and hence straight along substantially the entire oblong carrier body 120. As can be taken from the bottom view of the obtained structure shown on the bottom right-hand side of FIG. 10, the encapsulating process may be carried out so that one main surface of the dielectric oblong carrier body 120 remains exposed with respect to the encapsulant body 124. Moreover, the encapsulating of parts of the leads 108 may be executed so that tie bars 128, connecting groups of leads 108, remain entirely exposed from the encapsulant body 124. Descriptively speaking, the described encapsulation process may be denoted as infuse map molding.

For instance, molding may be carried out with a plateable mold compound, i.e. an encapsulant 106 on which metal plating is enabled. This may make it possible to plate a bottom of a package 100 with a metal to thereby form an electrically conductive layer (compare reference signs 150 in FIG. 3 and FIG. 6), which may also cover part of a surface of encapsulant 106, after optionally removing oblong carrier body 120. If a backside of a chip has a backside metallization, electroless copper can be applied to thicken the backside metallization.

Hence, the dielectric oblong carrier body 120 with the electronic components 104 attached thereto as well as portions of connected leads 108 of the respectively two adjacent rows 122 may be encapsulated by a block of encapsulant material such as mold compound. As a result, continuous blocks or bars of encapsulant bodies 124 may be obtained. Said encapsulant bodies 124 may have the appearance of a chocolate bar.

Figure 11:
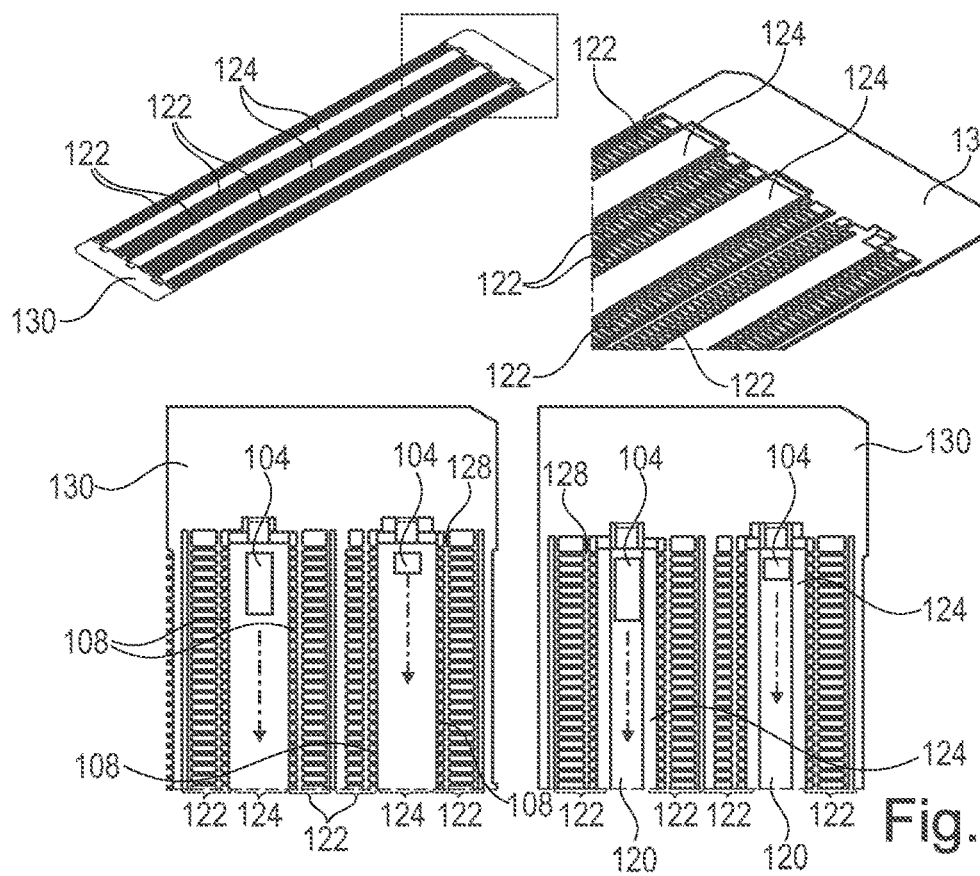
FIG. 11 illustrates different views of structures obtained at a fourth stage of a method of manufacturing packages according to an exemplary embodiment.

FIG. 11 illustrates different views of structures obtained at a fourth stage of a method of manufacturing packages 100 according to an exemplary embodiment.

Optionally, a respective dielectric oblong carrier body 120 may be removed from the structure obtained by encapsulating according to FIG. 10. For this purpose, a de-tape process can be carried out, for instance in a scenario in which an electrically conductive backside metallization of an electronic component 104 shall be exposed. This can be the case if a contact is desired for electric.

Alternatively, the tape constituting each dielectric oblong carrier body 120 can remain attached to the backside of the structure shown in FIG. 11, and may form part of the readily manufactured packages 100 (compare FIG. 4 and FIG. 7). This may be advantageous for example when the dielectric oblong carrier body 120 provides high thermal conductivity and electrical isolation.

As seen in FIG. 11 and as shown with arrows there, the flowable encapsulant material can be supplied to flow from a top sided end of the dielectric oblong carrier body 120 to a lower sided end portion thereof and subsequently covers, with a constant width, the entire set of electronic components 104 attached to the dielectric oblong carrier body 120 and belonging to different packages 100 which are manufactured in a batch process. In other words, each encapsulant body 124 may have a constant width along the entire extension of its two adjacent rows 122 of leads 108.

Figure 12:
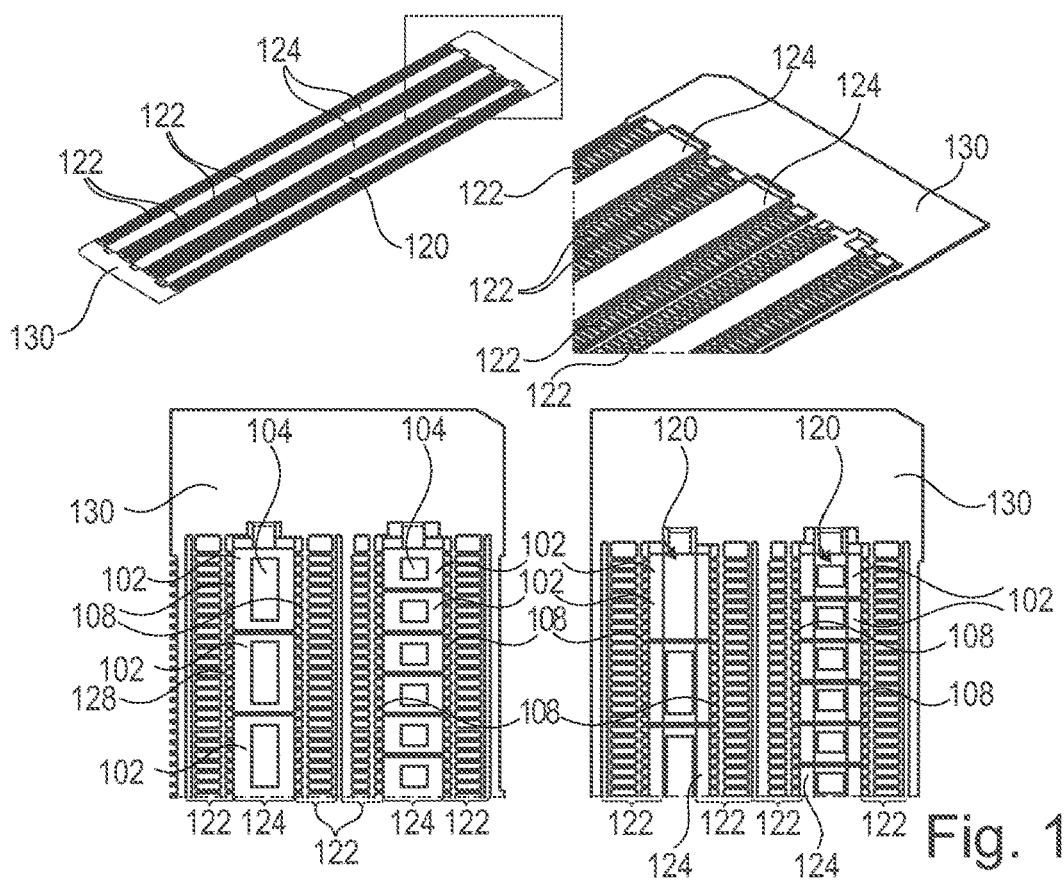
FIG. 12 illustrates different views of structures obtained at a fifth stage of a method of manufacturing packages according to an exemplary embodiment.

FIG. 12 illustrates different views of structures obtained at a fifth stage of a method of manufacturing packages 100 according to an exemplary embodiment.

In order to obtain the structure shown in FIG. 12, the structure obtained according to FIG. 11 may be singularized into individual packages 100. In an embodiment in which the dielectric oblong carrier body 120 forms part of the readily manufactured packages 100, the encapsulated dielectric oblong carrier body 120, electronic components 104 and leads 108 may be separated into the individual packages 100 or preforms of the packages 100. Consequently, each separated package 100 or preform comprises part of a respective dielectric oblong carrier body 120 (wherein such a part or section constitutes a respective carrier 102 of a respective package 100), a portion of the encapsulant body 124 (constituting encapsulant 106 of the respective package 100), some of the leads 108, and one or more of the electronic components 104 mounted on the respective part or section of the oblong carrier structure 120. In another embodiment, in which the oblong carrier bodies 120 are only temporary carrier bodies which do not form part of the readily manufactured packages 100 and are therefore peeled off before the singulation, the individual packages 100 comprise the same constituents as mentioned beforehand, but no section of a respective oblong carrier body 120.

What concerns horizontal singulation lines according to the plan views of FIG. 12, separation of the encapsulant bodies 124 including encapsulated constituents may be accomplished for example by mechanically sawing or laser cutting. What concerns vertical singulation lines, separation of the rows 122 of leads 108 into groups of leads 108 assigned to the individual packages 100 may be accomplished by punching (not shown in FIG. 12).

Highly advantageously, in the FIG. 12 embodiment, the described singulation may be carried out with a freely selectable scale in terms of horizontal and vertical singulation. In other words, the individual packages 100 may be singulated according to a required pin number, chip size and chip number. For example, this selection may be carried out by mechanically sawing or laser processing at selectable horizontal positions according to FIG. 12 to enable a scalable manufacturing concept. More specifically, the length of the sections of the encapsulant bodies 124 may be selected in accordance with the size and number of encapsulated electronic components 104 per package 100. Accordingly, the number of leads 108 assigned to a respective section may correspond to the number of electrical terminals of the one or more encapsulated electronic components 104 per package 100. Hence, the leadframe-like design of oblong carrier body 120 according to FIG. 12 allows a proper scalability with respect to different chip sizes. The larger an electronic component 104 is in a vertical direction according to FIG. 12, the larger can be the number of leads 108 of a respective row 122 assigned to the respective electronic component 104. Singulation into individual packages 100 can then be carried out by freely assigning a vertical portion of the respective leads 108 of a row 122 to a package 100 depending on the size of and number of terminals of said electronic component(s) 104. The fuse pad design and the arrangement of leads 108 on the leadframe-type oblong carrier body 120 may promote free scalability.

Advantageously, singulation of the packages 100 in accordance with horizontal singulation lines may be accomplished via sawing or laser processing which only requires to cut through mold and optionally tape material, but preferably not through metal. This makes the separation process quick and simple.

Referring to previously described FIG. 8 to FIG. 12 as well as to subsequently described FIG. 13, a dielectric oblong carrier body 120 is implemented. However, both dielectric and metallic oblong carrier bodies may be alternatively used in each of these embodiments. Hence, a manufacturing method according to an alternative exemplary embodiment is also applicable to oblong carrier bodies that are metallic. In such an alternative embodiment, modifications may be made, for instance elevated portions 160 forming part of the metal frame 130 may be integrally connected with the oblong carrier bodies 120. Furthermore, modifications to the die attachment and singulation method may be made as well to achieve compliance with metallic oblong carrier bodies.

FIG. 13 illustrates a plan view of a structure obtained during manufacturing packages 100 according to an exemplary embodiment. FIG. 14 illustrates a side view of the structure of FIG. 13.

As shown in FIG. 13 and FIG. 14, an additional tie bar 162 may be optionally provided to additionally hold the dielectric oblong carrier body 120. The additional tie bar 162 can be arranged to traverse the oblong carrier body 120 to strengthen the tape.

An example for a material for a sticky tape as an embodiment of dielectric oblong carrier body 120 (and its carriers 102 which form part of the oblong carrier body 120)is the use of a thermally conductive adhesive with high thermal conductivity, low thermal resistance and proper adhesion and reliability. For improving thermal conductivity, a filler dispersion may be included in such a tape. This may allow to obtain a thermal conductivity of the tape of for example at least 10 W/mK, for instance about 13 W/mK. For improving the dielectric properties, fillers may be adapted correspondingly. For obtaining a proper heat resistance, it is for instance possible to fabricate the tape based on polyimide. When using a polyimide resin base, the following different types of adhesive may be distinguished: bond glue, or tacky glue. In a bond glue configuration, the material of the tape may be thermally cured so that a glue sheet is obtained. Alternatively, an already fully cured tacky type tape may be used which may have a de-taping ability. Such a tacky type tape may be processable up to a very high temperature of 200° C. and more, and may have a low interfacial thermal resistance of for instance below 0.01° C/W.

FIG. 15 illustrates different views of structures obtained during manufacturing packages 100 according to an exemplary embodiment.

In the previously described embodiments, oblong carrier bodies 120 have been shown which are embodied as a tape with constant width, D (see for instance FIG. 8). In contrast to this, the oblong carrier bodies 120 shown in FIG. 15 each have a plurality of narrow portions, bottlenecks or constrictions 126 between adjacent carriers 102, each of which forming part of a respective oblong carrier body 120. More specifically, each of these carriers 102 may be substantially rectangular, wherein adjacent carriers 102 are connected by a respective constriction 126. The latter approach has advantages in particular when the oblong carrier body 102 is made of a metal, such as copper or aluminum. In such a configuration, singulation of individual packages 100 in a horizontal direction according to FIG. 15 can be accomplished by cutting substantially only through mold material, with the only exception of the tiny constrictions 126 being the only metal elements to be cut during the horizontal singulation process. Hence, even when the oblong carrier body 102 is made of a metal, the singulation process may still be kept simple and fast.

What concerns the encapsulation process for manufacturing packages 100 according to exemplary embodiments, a mold cavity may be designed for establishing a flow connection from each package preform to the next package preform along a row or column. Hence, a flowable, liquid or viscous still uncured mold compound may flow along an entire oblong carrier body 120 without the need of providing cumbersome runner and gate structures between different packages.

FIG. 15 shows an overview and a detailed view of structures obtained during manufacturing packages 100 according to an exemplary embodiment. As shown by an arrow 164, an infused gate mold architecture may be implemented. When using an oblong carrier body 120 with constrictions 126, already pre-defined carriers 102 may be used which are fused by a respective constriction 126. This enables a very simple singulation process since individual die paddle type carriers 102 are already pre-defined by the constrictions 126.

FIG. 16 illustrates a horizontal mold injection during manufacturing packages 100 according to an exemplary embodiment. Hence, infusion of flowable mold compound may be carried out horizontally, as shown in FIG. 16, or vertically, as shown in FIG. 15. Hence, as shown in FIG. 16, the vertical infused gate architecture of FIG. 15 can be substituted by a horizontal infusion direction, see reference sign 165 in FIG. 16.

In the embodiment of FIG. 16, both dielectric and metallic oblong carrier bodies 120 may be used.

FIG. 17 illustrates different views of structures obtained during manufacturing packages 100 according to an exemplary embodiment.

According to FIG. 17, the oblong carrier body 120 is a strip which has a substantially constant width D over its entire extension along the rows 122 of leads 108. Descriptively speaking, oblong carrier body 120 according to FIG. 17 may be denoted as a fuse pad. A desired or required portion of a strip-shaped plastic tape or metal plate may be flexibly defined and used for mounting one or more electronic components 104 assigned to one package 100.

FIG. 17, in comparison to FIG. 15, hence shows that an oblong carrier body 120 can also have a constant thickness D, i.e. can be free of constrictions 126. This allows to freely select the dimensions of a portion of the oblong carrier body 120 to be used for a single package 100. With a small die size, see left-hand side of the detail of FIG. 17, the portion of the oblong carrier body 120 may be smaller than with a larger die size shown on the right-hand side.

FIG. 18 illustrates a plan view of a structure without a groove in an oblong carrier body 120 obtained during manufacturing packages 100 according to an exemplary embodiment. FIG. 18 shows a portion of the structure of FIG. 17 without groove for mold locking.

FIG. 19 illustrates a plan view of a structure with a groove 116 for mold locking obtained during manufacturing packages 100 according to another exemplary embodiment. Preferably, the oblong carrier body 120 in this embodiment is a metallic oblong body. According to FIG. 19, each carrier 102 forming part of an oblong carrier body 120 and being separated therefrom by singulation may be provided with an exterior or interior groove 116. As shown in FIG. 19, the groove 116 may be filled with material of the encapsulant 106, which flows into groove 116 during a molding process. After curing, encapsulant material in groove 116 may mechanically interlock carrier 102 with encapsulant 106 for suppressing any risk of undesired delamination of the readily manufactured package 100. Even when groove 116 is not filled by encapsulant 106, it may have advantageous properties, since it may function as stress relief recess.

FIG. 20 illustrates a three-dimensional top view and FIG. 21 illustrates a three-dimensional bottom view of a package 100 according to another exemplary embodiment. FIG. 22 illustrates a cross-sectional view of the package 100 of FIG. 20 and FIG. 21. FIG. 23 illustrates a side view of the package 100 of FIG. 20 to FIG. 22.

The package 100 according to FIG. 20 to FIG. 23 comprises an electronic component 104 mounted on an electrically conductive carrier 102 such as a metallic die paddle. Such a metallic carrier 102 may be a separated portion of a metallic oblong carrier body 120 which may be shaped in a similar way as that shown in FIG. 15 but with adjacent carriers 102 being interconnected by two (rather than one) constrictions 126. The carrier 102 may be made of a metal such as copper or aluminum.

Mold-type encapsulant 106 encapsulates the electronic component 104 and part of the carrier 102. The carrier 102 is exposed beyond the encapsulant 106 at a bottom main surface of the carrier 102 and at the flange faces of the constrictions 126. Furthermore, a plurality of leads 108 are electrically coupled with the electronic component 104 and extend beyond two opposing sides of the encapsulant 106. A lead tip inspection metallization 152, which corresponds in the shown embodiment to the above-mentioned flange faces of the constrictions 126, is exposed beyond the encapsulant 106 at two opposing sidewalls 118 of the encapsulant 106. Said two opposing sidewalls 118 are arranged at other sides of the encapsulant 106 than the aforementioned two opposing sides at which the leads 108 extend beyond the encapsulant 106. Beyond this, the exposed lead tip inspection metallization 152 forms part of carrier 102 on which the electronic component 104 is mounted. Advantageously, the lead tip inspection metallization 152 exposed at said sidewalls 118 of the encapsulant 106 are accessible for lead tip inspection (LTI).

The embodiment of FIG. 20 to FIG. 23 may be manufactured by infused cavity molding for achieving a density increase, i.e. an obtained number of packages 100 per area. A high degree of simplicity of the underlying manufacturing concept results from the use of a common oblong carrier body 120 for mounting plural electronic components 104. Advantageously, a common tooling may be used for all pin counts and for an entire package platform. Moreover, the described manufacturing architecture is properly compatible with an efficient batch processing with an ultra-high density leadframe design for high throughput. Furthermore, a quality improvement may be achieved as compared to conventional approaches, since degating stress may be reliably prevented in view of the direct mold flow approach via infuse gate transfer molding. Also an improvement of the package performance may be achieved, i.e. it may become possible to obtain a larger chip and chip aspect ratio.

The package 100 according to FIG. 20 to FIG. 23 configures the chip backside as exposed pad for providing a direct backside metallization contact with a mounting base such as an electronic board. Furthermore, the thermal and electrical transfer of said package 100 may be highly efficient in view of the exposed metal providing high electric and thermal conductivity.

Thus, the embodiment of FIG. 20 to FIG. 23 provides a dual side outline semiconductor package 100. A corresponding manufacturing method allows producing scalable DSO-type packages 100 with an infuse gate molding approach. This may allow to remove conventional runner and gate-based mold approaches. The result is the illustrated DSO package 100 with LTI feature at the exposed pad.

Also in this embodiment, a mold locking feature may be obtained. It is also possible to achieve stress release in view of the explained fuse pad design. The shown package 100 is furthermore scalable in terms of pin count, and advantageously no de-gate marks occur on the package 100.

FIG. 20 to FIG. 23 thus show different views of the package 100 according to an exemplary embodiment with metallic carrier 102 which has formed part of a metallic oblong carrier body 120 similar to FIG. 15 with two constrictions 126 between two adjacent carriers 102. As a consequence of such a manufacturing method, lead tip inspection (LTI) metallizations 152 are exposed at sidewalls 118 being different from other sidewalls of encapsulant 106 at which the gull wing type leads 108 leave the encapsulant 106. This allows a user to verify wettability or solderability properties at metallization 152 even when the package 100 is already solder connected on a mounting base by soldering leads 108.

Again referring to the package 100 according to FIG. 20 to FIG. 23 having an LTI feature, lead tip inspection may mean that a metal is plateable and a lead 108 is inspectable from the side when solder is already present at the bottom. If the packages are already soldered to a PCB and the leads 108 are no longer accessible, the leads 108 can nevertheless be inspected from a side to achieve a proper solderability.

In the previously described embodiments of FIG. 19 to FIG. 23, the use of metallic oblong carrier bodies 120 is preferred in view of the continuous die paddle.

Figure 24:
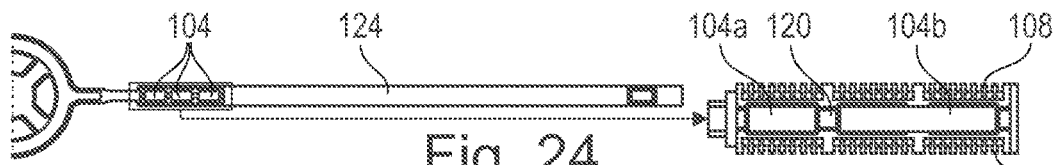
FIG. 24 to FIG. 26 illustrate structures obtained during infusion molding for manufacturing packages according to an exemplary embodiment.
Figure 25:
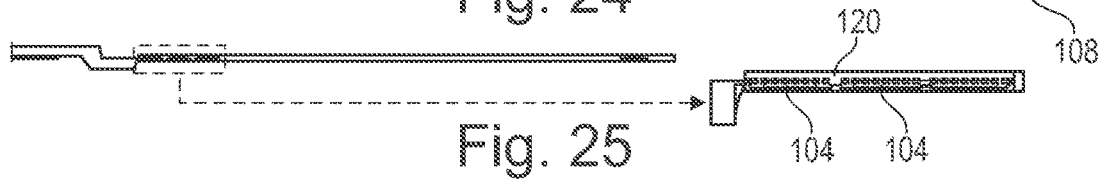
Figure 26:
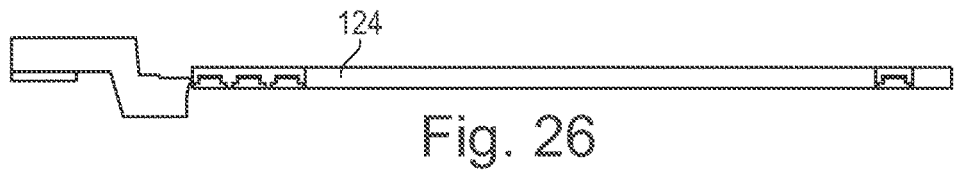

FIG. 24, FIG. 25 and FIG. 26 illustrate structures obtained during infusion molding for manufacturing packages 100 according to an exemplary embodiment. FIG. 24 to FIG. 26 illustrate again that the manufacturing concept described above is properly scalable, i.e. can be used with smaller chips 104a or larger chips 104b. Depending on the chip size of the electronic components 104, i.e. for a small chip 104a as well as for a larger chip 104b, a respective portion of the oblong carrier body 120 per package 100 as well as an assigned number of leads 108 for a package 100 may be freely selected.

Figure 27:
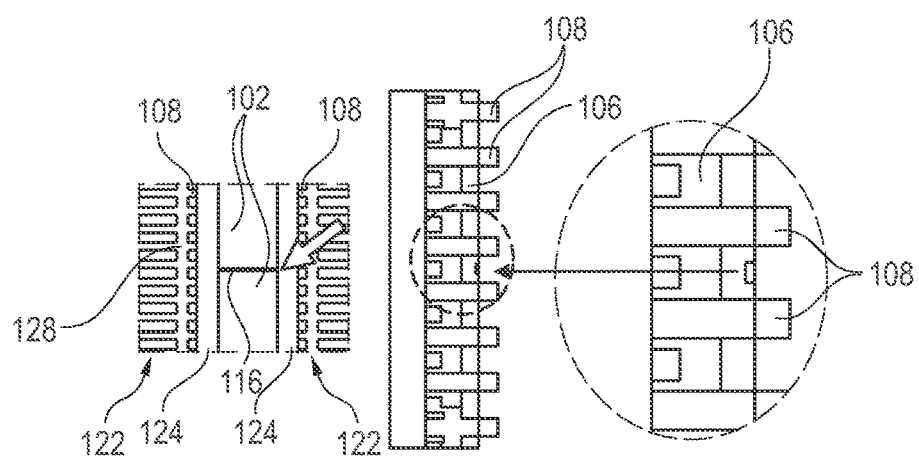
FIG. 27 illustrates different views of leads of a package according to an exemplary embodiment.

FIG. 27 illustrates different views of leads 108 of a package 100 according to an exemplary embodiment.

Figure 28:
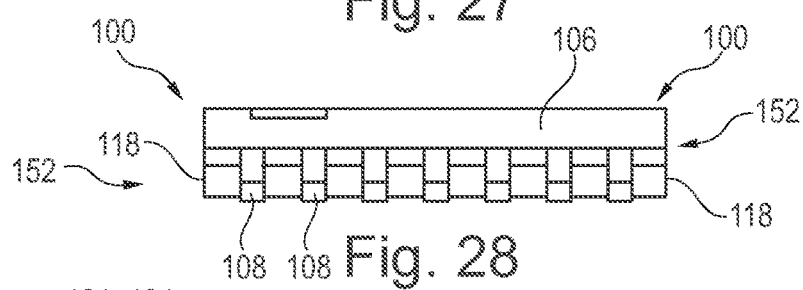
FIG. 28 illustrates side wall features of a package according to an exemplary embodiment.

FIG. 28 illustrates an LTI sidewall feature of a package 100 according to an exemplary embodiment. In other words, FIG. 28 illustrates that lead tip inspection is possible via metallization 152 at sidewalls 118.

Figure 29:
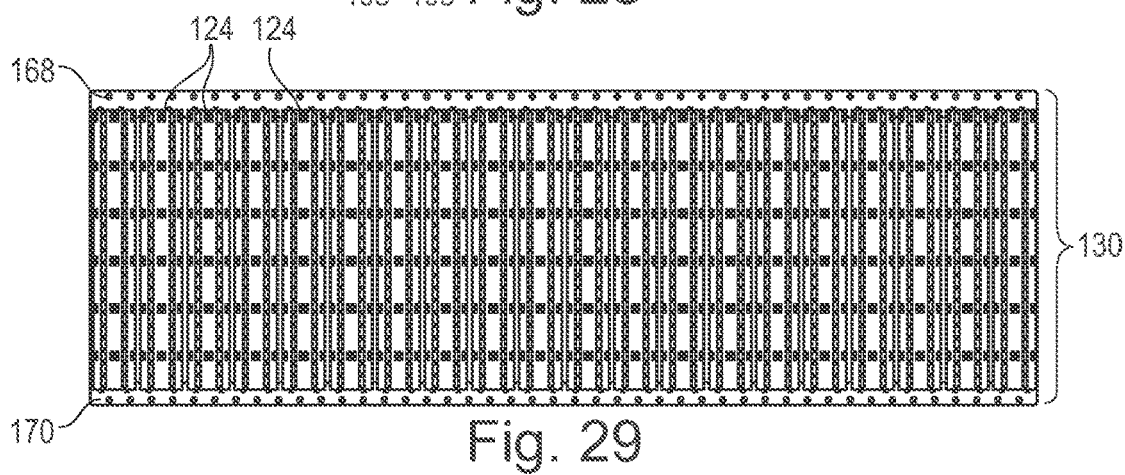
FIG. 29 illustrates a yield increase of a method of manufacturing packages according to an exemplary embodiment.

FIG. 29 illustrates a yield increase of a method of manufacturing packages 100 according to an exemplary embodiment. The architecture according to FIG. 29 shows a significant density improve in view of the above described infuse gate design in comparison with conventional manufacturing methods. An additional advantage results from the batch manufacturing process in terms of molding, plating, and testing. Also the scalable DSO architecture concerning pin count may offer a lean manufacturing concept.

More specifically, FIG. 29 illustrates a leadframe type metal plate 130 used as a basis for forming bar-shaped encapsulant bodies 124 between two opposing index strips 168, 170 of the leadframe type metallic plate 130. With the infused gate design of FIG. 29, a significant density improvement may be achieved compared to conventional approaches, so that the hardware resources may be used more efficiently.

Figure 30:
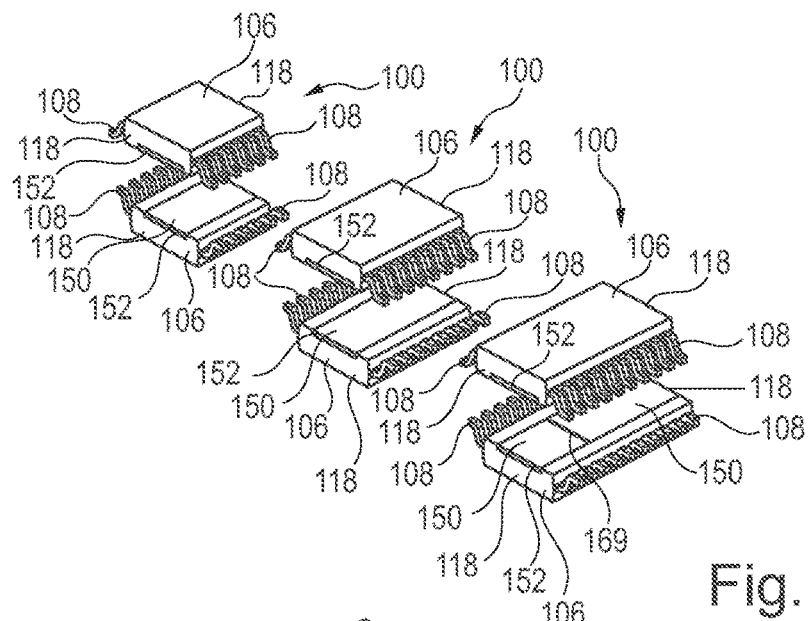
FIG. 30 illustrates packages according to exemplary embodiments with different and freely selectable numbers of lead and numbers of exposed electrically conductive layers.

FIG. 30 illustrates packages 100 according to an exemplary embodiment with different and freely selectable numbers of leads 108. In general, FIG. 30 illustrates the flexible pin count and package body architecture of exemplary embodiments.

Referring to package 100 shown on the right-hand side of FIG. 30, multiple electronic components 104 are encapsulated by the same encapsulant 106. However, two separate electrically conductive layers 150 are shown and are exposed beyond the encapsulant 106. Each of said separate electrically conductive layers 150 may be connected with one of the mentioned multiple electronic components 104.

FIG. 30 shows the proper scalability of the manufacturing concept of exemplary embodiments. Depending on size and number of terminals of a respective electronic component 104 to be encapsulated, a corresponding portion of an oblong carrier body 120 and a corresponding number of leads 108 belonging initially to the two opposing rows 122 of leads 108 may be selected and may be assigned to one individual package 100. For instance, the two packages 100 on the left-hand side of FIG. 30 may have a smaller chip and 2×6 leads 108 or a larger chip and 2×8 leads 108. In the embodiment on the right-hand side of FIG. 30, two separate electrically conductive layers 150 are provided for multiple electronic components 104 (not shown in FIG. 30). The two separate exposed electrically conductive layers 150 of FIG. 30 can be separated also by mold compound material in a gap 169 in between. The electrically conductive layers 150 may function as a substitution for conventional die paddles.

Figure 31:
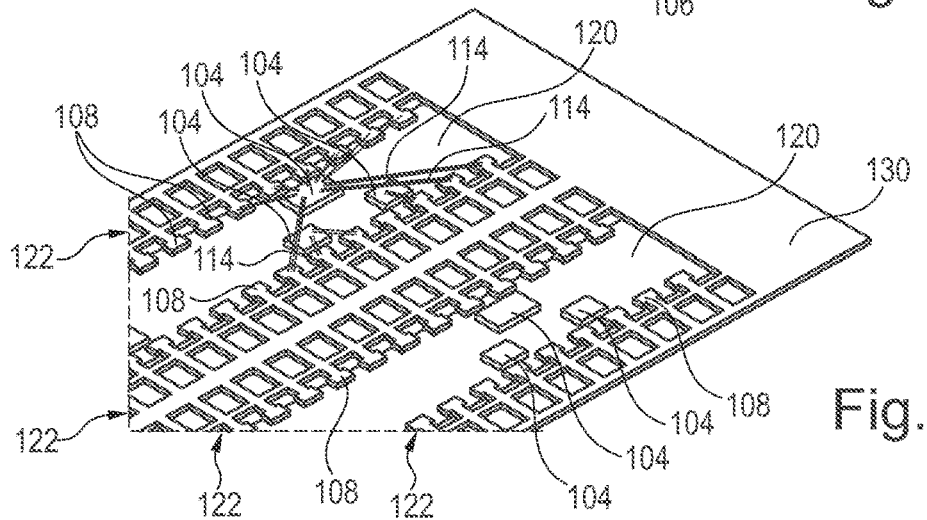
FIG. 31 illustrates a process of mounting multiple electronic components on a tape-type carrier attached to a leadframe used during manufacturing packages according to an exemplary embodiment.

FIG. 31 illustrates a process of mounting multiple electronic components 104 on an oblong carrier body 120. The oblong carrier body 120 may for example be a dielectric oblong carrier body 120 attached to a leadframe-type patterned metal plate 130 or a metallic oblong carrier body 120 which is integrally formed as part of the patterned metal plate. Referring to FIG. 31, multiple electronic components 104 mounted on an oblong carrier body 120 are shown after connection of chip pads with leads 108 by electrically conductive interconnect bodies 114, which are here embodied as bond wires. For instance, a sticky tape may be used as oblong carrier body 120 which may for instance be configured to become adhesive only upon heating. By using such a sticky adhesive tape, it may be possible to bypass or omit a conventional die attach process. According to FIG. 31, the respective electronic component 104 may be put directly on the tape without the need of soldering or the like.

Figure 32:
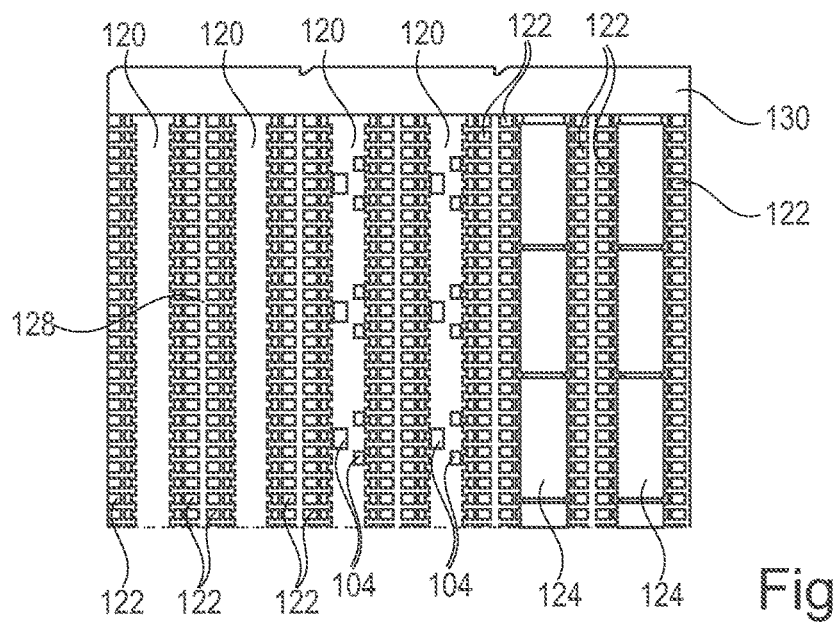
FIG. 32 shows a structure illustrating different stages of manufacturing packages according to an exemplary embodiment.

FIG. 32 shows a structure illustrating different stages of manufacturing packages 100 according to an exemplary embodiment.

On the left-hand side of FIG. 32, the oblong carrier bodies 120 configured as sticky tapes are attached to recesses 132 of leadframe type patterned metallic plate 130. Thereafter, the electronic components 104 are mounted on the sticky tape and are connected to the leads 108 by wire bonding. As shown on the right-hand side of FIG. 32, the individual arrays of oblong carrier body 120, electronic components 104 mounted thereon and leads 108 of two assigned rows 122 may be encapsulated by forming a bar shaped encapsulation body 124. Thereafter, singulation of the packages 100 may be carried out by a horizontal and a vertical separation. The manufacturing process described in relation to FIGS. 31-21 may also be applicable to embodiments where metallic oblong carrier bodies are used instead.

Figure 33:
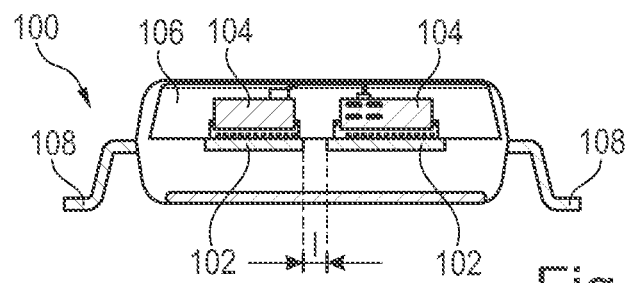
FIG. 33 illustrates a cross-sectional view of a package according to an exemplary embodiment.

FIG. 33 illustrates a cross-sectional view of a package 100 according to an exemplary embodiment.

The package 100 shown in FIG. 33 comprises two electronic components 104 mounted on two different dielectric carriers 102 being spaced with each other by a distance, 1. For instance, said distance, 1, may be 300 µm or more. With the architecture of FIG. 33, even the presence of a high electric voltage is not able to traverse the gap between the electronic components 104 and the assigned dielectric carriers 102 due to the dielectric property of these tape shaped bodies. Thereby, package 100 of FIG. 33 may benefit from an internal isolation and may provide an improved electric reliability.

Figure 34:
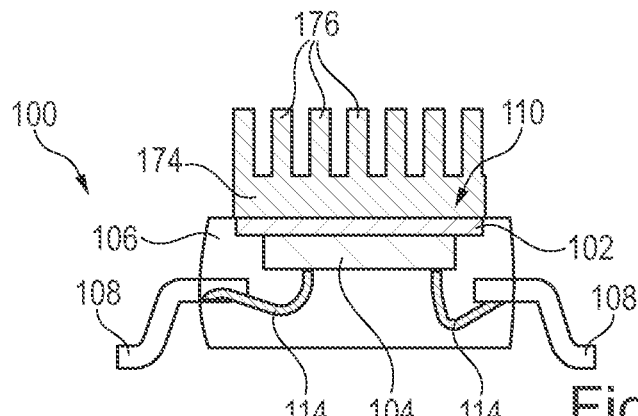
FIG. 34 illustrates a cross-sectional view of a package with heat sink according to another exemplary embodiment.

FIG. 34 illustrates a cross-sectional view of a package 100 according to another exemplary embodiment.

In the embodiment of FIG. 34, a heat sink 110 is attached to an exposed dielectric carrier 102 embodied as thermally conductive and electrically insulating as well as adhesive tape.

FIG. 34 shows package 100 with exposed dielectric carrier 102 which may be configured as a thermally highly conductive tape. Heat sink 110, which may be embodied as a copper body, can be attached directly to the exposed dielectric carrier 102. In the shown embodiment, heat sink 110 comprises an electrically conductive plate 174 and a plurality of mutually spaced cooling fins 176 extending from the metal plate 174. Therefore, the package 100 shown in FIG. 34 shows excellent mechanical, electrical and thermal performance.

FIG. 35 illustrates a cross-sectional view of a package 100 according to still another exemplary embodiment.

According to FIG. 35, the tape-shaped dielectric carrier 102 is fully circumferentially encapsulated in an interior of the encapsulant 106. Two different electronic components 104, which may each be embodied as power semiconductor chips, may be mounted on the same dielectric carrier 102.

Also, the embodiment of the package 100 according to FIG. 35 has a high electrical reliability. The two electronic components 104 are mounted on the common dielectric carrier 102, embodied as an adhesive tape. Even in the presence of high voltages, the internal isolation between the electronic components 104 of the package 100 can be ensured.

Figure 36:
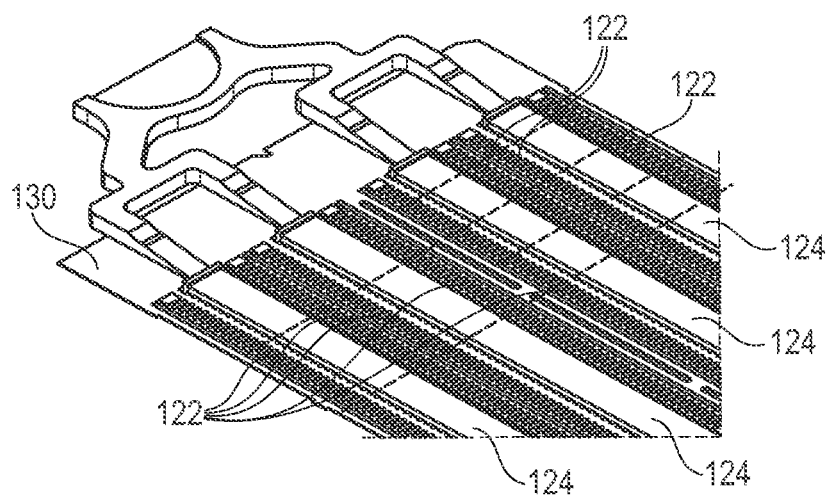
FIG. 36 illustrates infusion molding during manufacturing packages according to an exemplary embodiment.

FIG. 36 illustrates infusion molding during manufacturing packages 100 according to an exemplary embodiment.

FIG. 36 shows again the parallel supply of still flowable encapsulant material (such as a liquid or viscous mold compound) to the various rows of electronic components 104 attached to a respective oblong carrier body 120. The mold flow occurs along the entire line from the uppermost to the lowermost end of the respective oblong carrier body 120. As a result, parallel bars of encapsulant bodies 124 are formed.

Figure 37:
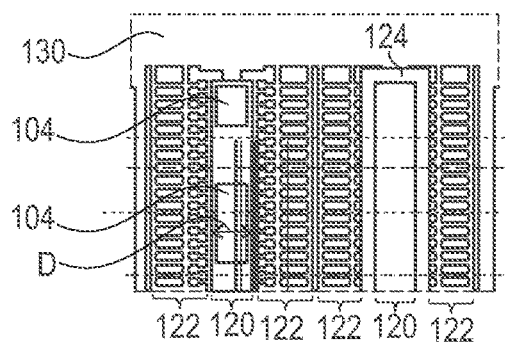
FIG. 37 and FIG. 38 illustrate structures obtained during manufacturing packages according to exemplary embodiments.
Figure 38:
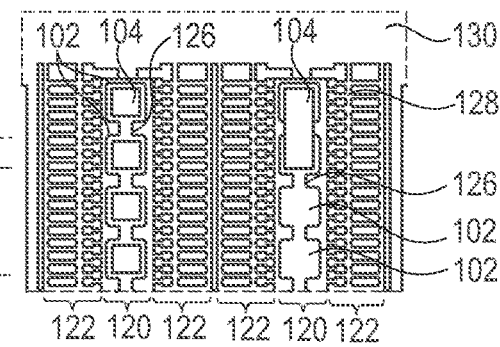

FIG. 37 and FIG. 38 illustrate structures obtained during manufacturing packages 100 according to an exemplary embodiment.

Referring to FIG. 37, the described manufacturing concept enables package scalability and flexibility. One and the same assembly tool may be shared for the manufacture of quite different packages 100. Thus, FIG. 37 shows again the concept of scalable package manufacture using an oblong carrier body 120 with constant thickness D. Chips of very different sizes may be mounted flexibly on such an oblong carrier body 120, and a corresponding section of the oblong carrier body 120 together with a corresponding section of rows 122 of leads 108 may then be separated for defining the dimension of a corresponding package 100.

Now referring to FIG. 38, high-speed sawing may be achieved by strongly limiting the amount of metal which needs to be cut during singulation. Substantially only mold component material needs to be separated during singulation, thanks to the provision of the tiny constrictions 126 connecting adjacent carriers 102. Again, mold tool sharing is possible for manufacturing different kinds of packages 100, which may further reduce the manufacturing effort. Hence, the formation of constrictions 126 between adjacent carriers 102 of an oblong carrier body 120 may be used for mounting one individual electronic component 104 on each carrier 102, see left-hand side of FIG. 38. As shown on the right-hand side, electronic component 104 covers two carriers 102 and thereby extends also over one constriction 126 in between.

Figure 39:
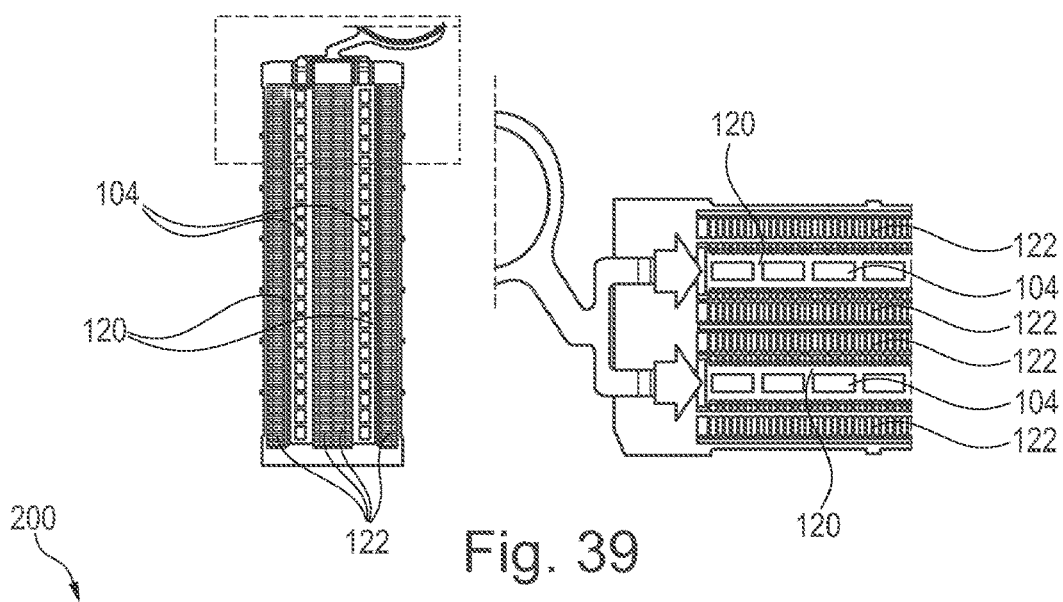
FIG. 39 shows different views of structures obtained during infusion molding according to an exemplary embodiment.

FIG. 39 shows different views of structures obtained during infusion molding according to an exemplary embodiment. FIG. 39 again illustrates the parallel supply of still uncured encapsulant material to parallel aligned oblong carrier bodies 120 with surface mounted electronic components 104 so that the still flowable encapsulant material flows along the entire oblong carrier body 120.

Figure 40:
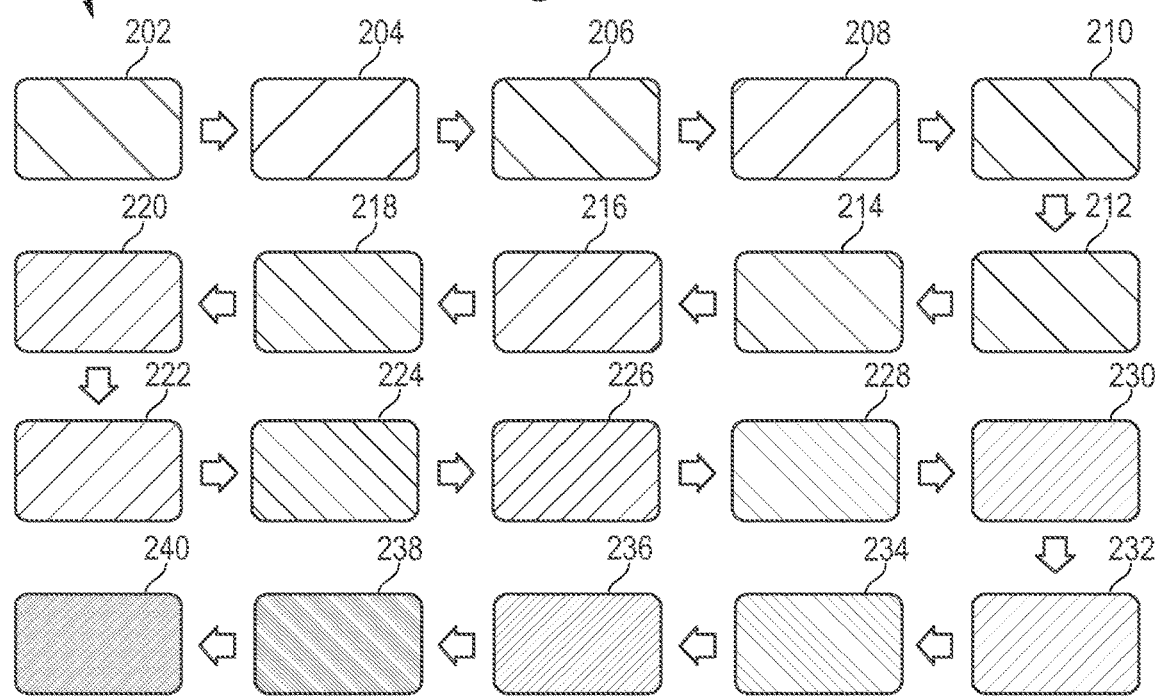
FIG. 40 illustrates a flowchart of a method of manufacturing packages according to an exemplary embodiment.

FIG. 40 illustrates a flowchart 200 of a method of manufacturing packages 100 according to an exemplary embodiment. Flowchart 200 of FIG. 40 illustrates processes carried out during manufacturing packages 100 according to an exemplary embodiment.

In a block 202, wafer mounting, and sawing is carried out. Block 204 illustrates die attach. Block 206 corresponds to curing of glue. Thereafter, a DAV procedure is carried out, compare block 208. This is followed by plasma cleaning, see block 210. In block 212, wire bonding is performed. In block 214, plasma cleaning is carried out. In block 216, a morphological adhesion promoter is formed, for instance by plating. In block 218, an automatic optical inspection is carried out. In block 220, a molding process is carried out. A post mold curing process is executed in block 222. Thereafter, a dambar cut is carried out, see block 224. This is followed by sawing or laser processing, see block 226. Thereafter, a chemical deflashing process may be carried out, see block 228. After that, plating can be carried out, for instance using tin (see block 230). This is followed by a lead cut process, see block 232. Thereafter, a strip test may be executed, see block 234. In subsequent block 236, a mark forming process may be carried out. By sawing or laser processing, singulation may then be carried out, see block 238. In block 240, the manufacturing process may be completed, for instance by packaging and shipping.

FIG. 41 shows a structure illustrating different stages of manufacturing packages 100 according to an exemplary embodiment.

FIG. 41 shows various processing stages of manufacturing packages 100. From left to right, electronic components 104 may first be mounted on oblong carrier bodies 120. This may be followed by an encapsulation process for forming encapsulant bodies 124 extending in parallel to each other as bars. Thereafter, plating of leads 108 may be carried out optionally. Furthermore, leads 108 may be cut, for instance by punching. Furthermore, the obtained structure may be singularized (not shown) into individual packages 100 by horizontally cutting the encapsulation bodies 124 together with the encapsulated leads 108, electronic components 104 and oblong carrier bodies 120.

FIG. 42 and FIG. 43 illustrate structures obtained during singularizing packages 100 according to an exemplary embodiment.

Figure 44:
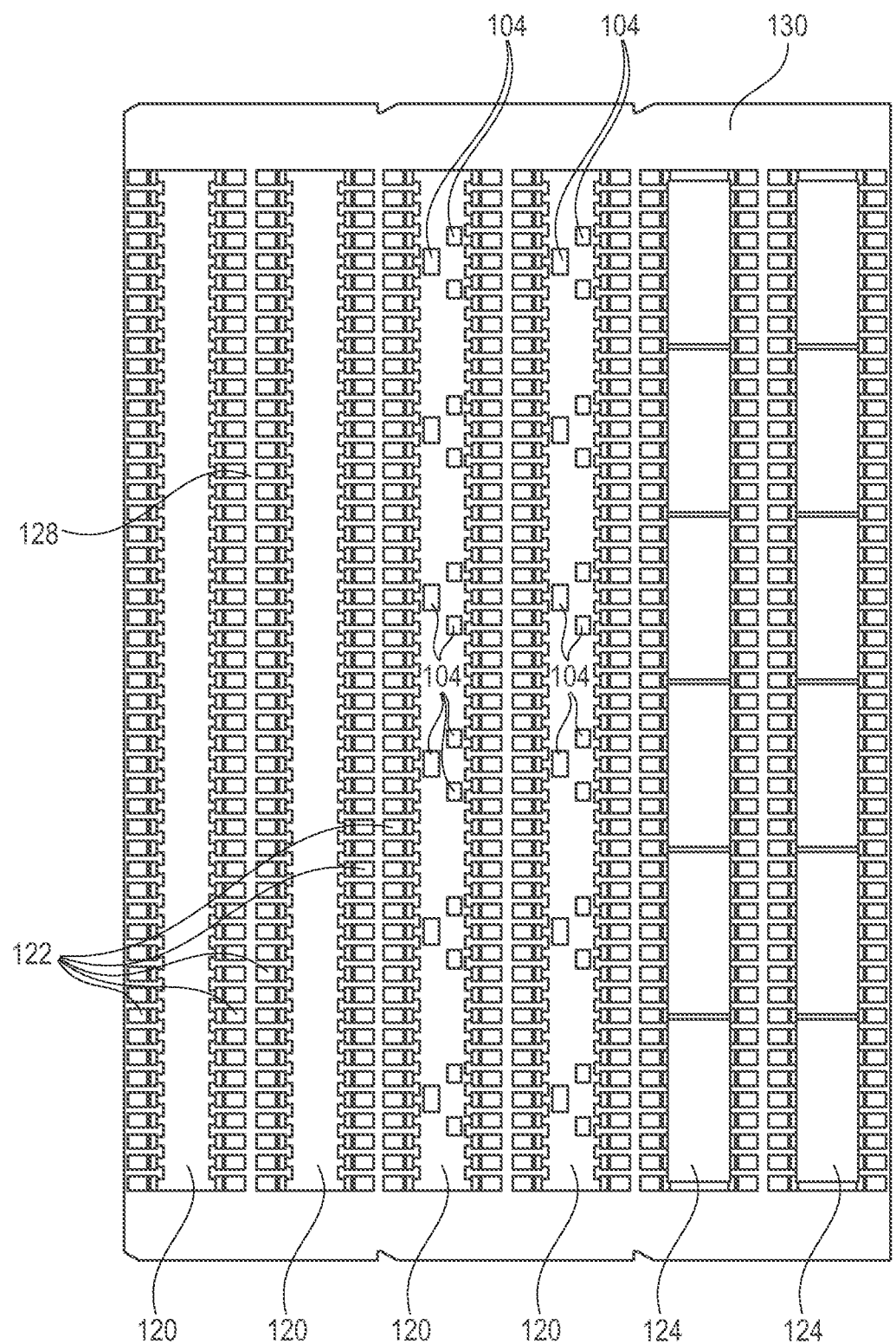
FIG. 44 shows a structure illustrating different stages of manufacturing packages according to an exemplary embodiment.

FIG. 44 shows a structure illustrating different stages of manufacturing packages 100 according to an exemplary embodiment.

FIG. 45 shows a plan view of a patterned metal plate 130 used as a basis for manufacturing packages 100 according to an exemplary embodiment. FIG. 46 shows a plan view of the patterned metal plate 130 of FIG. 45 after encapsulation by a plurality of parallel encapsulant bodies 124 according to an exemplary embodiment.

FIG. 45 shows leadframe-type patterned metal plate 130 with a plurality of die pad-type carriers 102, each configured for carrying a die-type component 104 (not shown in FIG. 45). Each carrier 102 is surrounded by four groups of leads 108, each group of leads 108 being arranged at a respective side of the assigned carrier 102. The leads 108 are arranged in vertical rows 122 and in horizontal rows 123. Each vertical row of carriers 102 with assigned leads 108 (which may be interconnected by metallic bars) forms an oblong carrier body 120. Descriptively speaking, the patterned metal plate 130 comprises a plurality of parallel and spaced oblong carrier bodies 120. The inventors have discovered that by using a leadframe layout such as the one illustrated in FIG. 45 the unit density per patterned metal plate (each patterned metal plate commonly referred to as a "strip") can be increased by around 30% when the encapsulation method illustrated in FIG. 46 is deployed. For example, 182 packages may be produced per patterned metal plate 130 compared to 140 when conventional leadframe designs and methods are used.

For producing packages 100 based on the patterned metal plate 130 according to FIG. 45, a plurality of electronic components 104 are mounted on the carriers 102. Thereafter, it may be possible to electrically connect pads of each of the components 104 with the assigned leads 108 extending along four sides around the respective carrier 102 carrying the respective component 104.

Now referring to FIG. 46, the carriers 102, assigned electronic components 104 and assigned leads 108 along four sides around said carriers 102 can be encapsulated along a straight encapsulation path (extending in a vertical direction according to FIG. 46) by a continuous oblong encapsulant body 124, which may be embodied as mold compound. FIG. 46 shows the result of such a molding process, i.e. a molded leadframe. The process according to FIG. 46 is carried out using a through mold gate system with a mold flow from top to bottom. As a result, an arrangement of a plurality of parallel continuous oblong encapsulant bodies 124 is obtained. Advantageously, the process of encapsulating may be controlled so that flowable encapsulant medium flows along the straight encapsulation path between adjacent carriers 102 via spaces between leads 108 extending between said adjacent carriers 102. Such a control may be supported by a corresponding design of a mold tool (not shown). More detailed description of the aforementioned molding methods is provided in the succeeding paragraphs and FIGS. 53-60, and 65-70.

After completing the encapsulation process according to FIG. 46, the carriers 102, electronic components 104 and leads 108 being encapsulated by a respective continuous oblong encapsulant body 124 along a respective straight encapsulation path is separated or singularized into the packages 100 or preforms thereof in such a way that each package 100 or preform comprises one of the carriers 102, assigned leads 108 extending along four sides around said carrier 102, one assigned electronic component 104 mounted on the carrier 102, and a corresponding portion of the encapsulant body 124.

In comparison with conventional approaches, the described manufacturing architecture may allow to increase the unit density per strip by about 30% which reduces the manufacturing effort per package 100 and contributes to a miniaturized manufacture.

Figure 47:
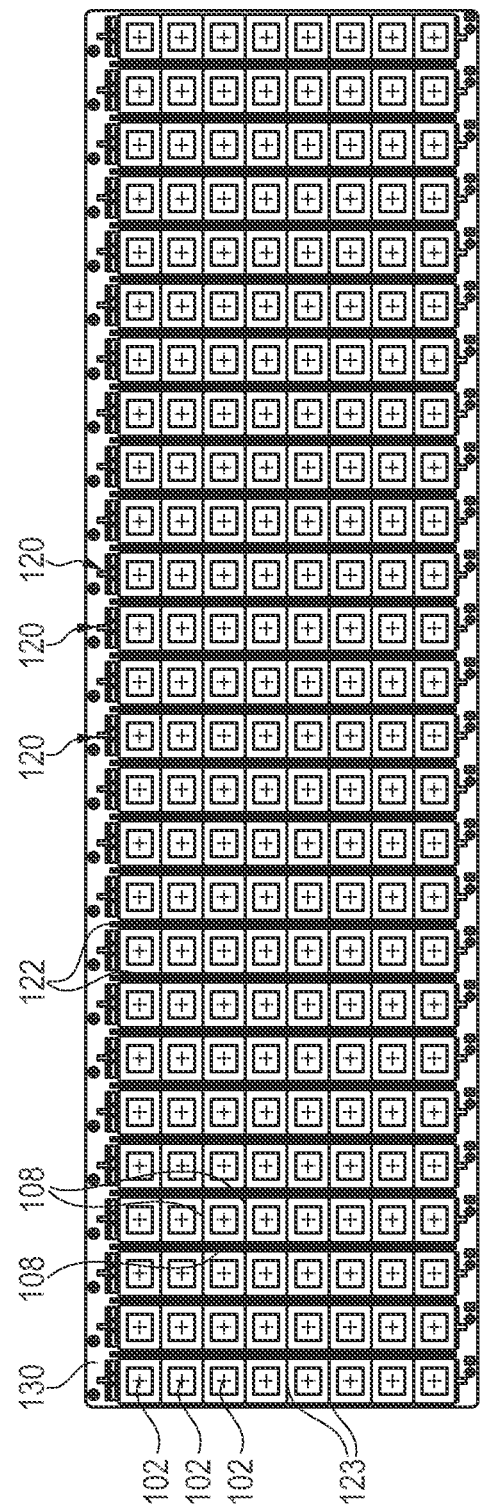
FIG. 47 shows a plan view of a patterned metal plate used as a basis for manufacturing packages according to another exemplary embodiment.
Figure 48:
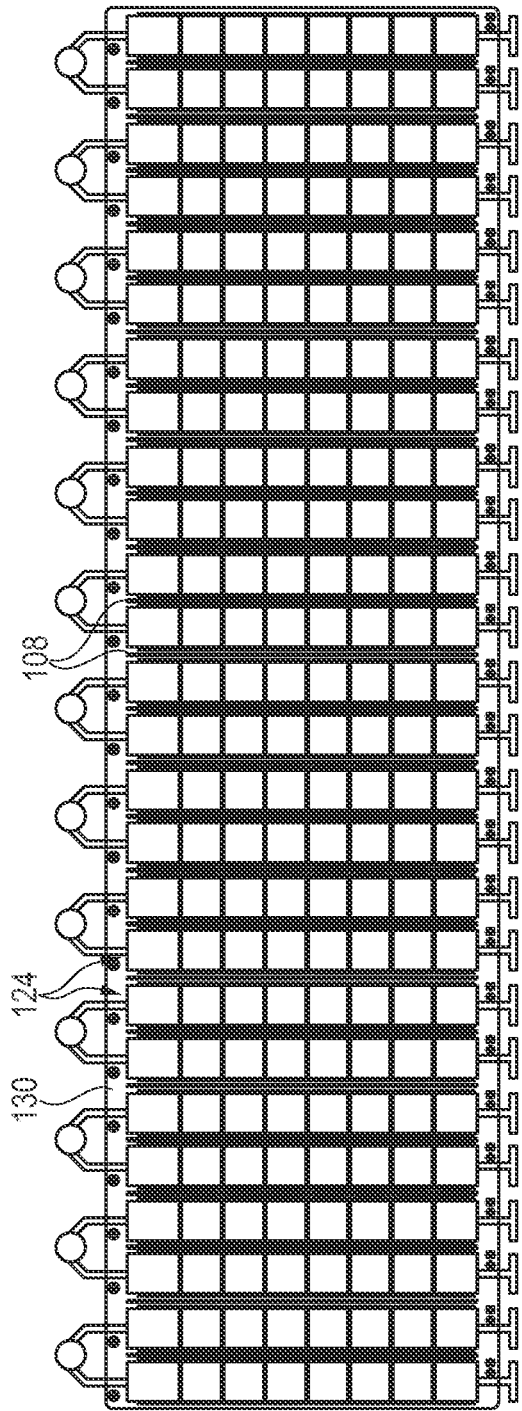
FIG. 48 shows a plan view of the patterned metal plate of FIG. 47 after encapsulation by a plurality of parallel encapsulant bodies according to an exemplary embodiment.

FIG. 47 shows a plan view of a patterned metal plate 130 used as a basis for manufacturing packages 100 according to another exemplary embodiment. FIG. 48 shows a plan view of the patterned metal plate 130 of FIG. 47 after encapsulation by a plurality of parallel encapsulant bodies 124 according to an exemplary embodiment.

A difference between the manufacturing process according to FIG. 47 and FIG. 48 in comparison with the embodiment of FIG. 45 and FIG. 46 is that, in the embodiment according to FIG. 47 and FIG. 48, an infused mold gate system is used. Exemplary embodiments using infused gate systems are illustrated in FIGS. 61-64 and 71.

In comparison with conventional approaches, the aforementioned manufacturing architecture illustrated in FIGS. 47-48 may provide an increase of about 48% in unit density per strip. For example, 208 packages may be produced per patterned metal plate 130 by adopting the approach in FIGS. 47 and 48 compared to 140 when conventional approaches. This accordingly translates to a reduction in manufacturing effort per package 100 and lower manufacturing cost.

FIG. 49 shows a plan view and a side view of an encapsulant body 124 manufactured according to an exemplary embodiment. In the embodiment of FIG. 49, a mold flow occurs from unit to unit, i.e. along a mold flow direction indicated with reference sign 125. This may be accomplished by a mold flow gate from leadframe edge and via each individual unit. Between each two adjacent blocks of encapsulant 106 of the encapsulant body 124 (wherein each block corresponds to a respective readily manufactured package 100), the encapsulant body 124 comprises a respective mold material indentation 133. Said indentations 133 simplify a singulation process.

Figure 50:
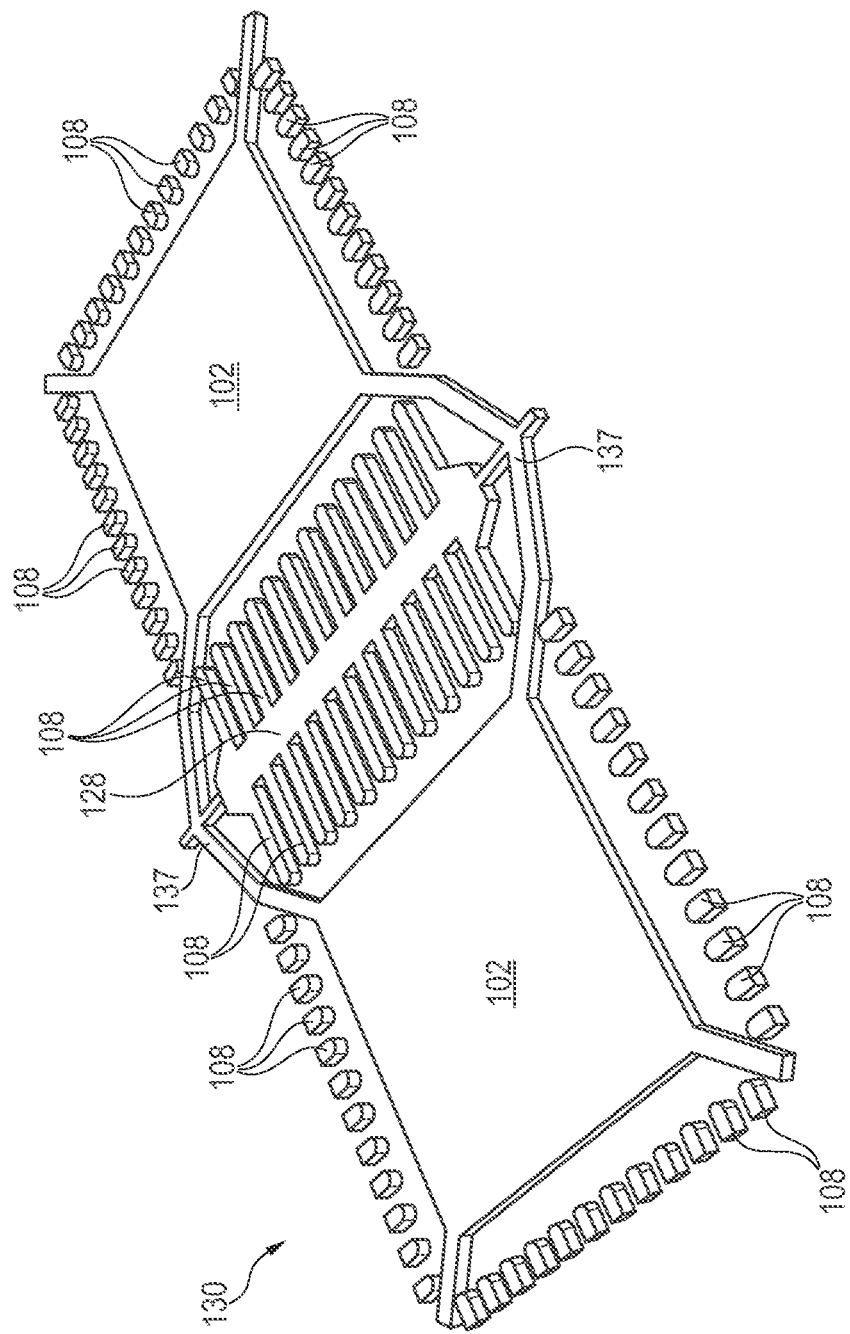
FIG. 50 shows a portion of a leadframe-type patterned metal plate used according to an exemplary embodiment.

FIG. 50 shows a portion of a leadframe-type patterned metal plate 130 used according to an exemplary embodiment. Several features of the illustrated metal plate 130, which corresponds to two packages 100 to be formed, will be explained below, in particular referring to FIG. 53 and FIG. 54.

FIG. 51 shows a lateral edge region of a package 100 manufactured according to an exemplary embodiment. As shown by reference sign 127, each individual lead 108 of the package is covered on top by mold compound. The package 100 of FIG. 51 can be singulated via mechanical punching through an assigned oblong encapsulant body 124. Advantageously, singulation by punching may involve a lower effort and may allow a faster processing as compared to singulation by sawing. FIG. 52 shows a plan view of a patterned metal plate 130 used as a basis for manufacturing packages 100 according to another exemplary embodiment and shows, with reference sign 151, a flowing direction of an encapsulant medium. As indicated by rectangles according to reference sign 129, dimensions for a mold gate may be removed and replaced with a more efficient mold gate design.

FIG. 53 shows a three-dimensional top view and a corresponding detail of still integrally connected pre-forms of packages 100 according to an exemplary embodiment. FIG. 54 shows a three-dimensional bottom view of the still integrally connected pre-forms of packages 100 according to FIG. 53.

As shown in FIG. 53, the encapsulant body 124 may be formed with indentations 133 extending transverse to the straight encapsulation path and transverse to the array of packages 100 or preforms thereof being assigned to the respective oblong encapsulant body 124. Furthermore, each indentation 133 is located between adjacent packages 100 or preforms of packages 100. The indentations 133 may be formed by correspondingly shaping a mold tool (not shown) used for forming the oblong encapsulant body 124. For example, in this top reservoir approach, the mold tool may have a higher ceiling where the reinforcing bars 128 are located so that encapsulant medium can flow between adjacent packages 100 or preforms of packages 100 along a plurality of substantially parallel sub-paths of the straight encapsulation path. The indentations 133 have the advantage that separating the packages 100 or preforms of packages 100 from the oblong encapsulant body 124 may be accomplished by punching along said indentations 133.

As can be derived from a combination of FIG. 53 and FIG. 54, the encapsulant body 124 may be formed so that leads 108 extending parallel to the longer extension direction of the oblong encapsulant body 124 and reinforcing bars 128 connecting leads 108 and extending transverse to the encapsulant body 124 are exposed at the indentations 133. Thus, the encapsulant body 124 may be very thin at the indentations 133.

Advantageously, the encapsulant body 124 and the oblong carrier body 120 are configured so that reservoirs 135 for accommodating flowable encapsulant medium are formed at a top side of the illustrated indentation 133. More specifically, the encapsulant body 124 and the oblong carrier body 120 are configured so that a V-shaped lateral protrusion 137 is formed at the shown indentation 133 and delimits the assigned reservoir 135. The V-shaped lateral protrusions 137 may protrude laterally beyond the encapsulant body 124. Advantageously, the reservoirs 135 delimited by V-shaped lateral protrusions 137 may accommodate excessive mold flow during encapsulation. The mold reservoirs 135 contribute to the flow of mold material from unit to unit.

Advantageously, it may be possible to use a space between a respective lead 108 and the reservoir 135 for filling or transferring flowable encapsulant medium to form a multi-gate entry from one package 100 or preform thereof to another package 100 or preform thereof. This may allow using space between leads 108 and reservoirs 135 to fill or transfer the encapsulant 106. This may form a multi-gate entry to fill material of encapsulant 106 from one package 100 to another.

Reference signs 151 indicate a direction of the mold flow during encapsulation. Advantageously, the continuous oblong encapsulant body 124 can be formed by guiding flowable encapsulant medium between adjacent packages 100 or preforms of packages 100 along a plurality of substantially parallel sub-paths of the straight encapsulation path. Said sub-paths may be separated from each other by leads 108.

Reference sign 153 indicates encapsulant protrusions on the upper side of the connection region between adjacent packages 100, wherein the encapsulant protrusions correspond to a metallic bar 128 shown in FIG. 54. Metallic bar 128 forms a transverse connection for the longitudinal leads 108.

FIG. 53 illustrates top sided reservoirs 135, i.e. a reservoir concept on the top side of a package 100. Reservoirs 135 may be arranged between leads 108 and/or at a corner lead corresponding to the V-shaped lateral protrusion 137. FIG. 54 shows that no reservoir is present on the bottom side between the packages 100 in the present embodiment. In the shown embodiment, multiple through mold gates are realized with mold reservoirs 135, wherein a mold flow occurs over half-etched tie bar features in between leads 108. Additional through mold gates are realized with mold reservoirs flowing over half etched tie bar features on the package corner. A final package 100 manufactured in accordance with the embodiment of FIG. 53 and FIG. 54 may have an outline as illustrated in FIG. 63.

FIG. 55 shows a three-dimensional top view of still integrally connected pre-forms of packages 100 according to another exemplary embodiment. FIG. 56 shows a three-dimensional bottom view and a corresponding detail of the still integrally connected pre-forms of packages 100 according to FIG. 55.

FIG. 55 and FIG. 56 illustrate a bottom reservoir only concept where the encapsulant body 124 and the oblong carrier body 120 are formed so that a reservoir 135 for accommodating flowable encapsulant medium is formed only on the bottom side between the packages 100. The reservoirs 135 may be present between leads 108 and/or at a corner lead (i.e. next to V-shaped lateral protrusion 137). In contrast, FIGS. 53-54 show a top reservoir only concept. In the bottom reservoir approach of FIG. 55-56, the indentations 133 between the leads 108 are located at the bottom side between the packages 100. For example, the mold tool may have a higher ceiling on the bottom at the location of the reinforcing bars 128 are located so that encapsulant medium can flow between adjacent packages 100 or pre-forms of packages 100 along a plurality of substantially parallel sub-paths of the straight encapsulation path.

Figure 57:
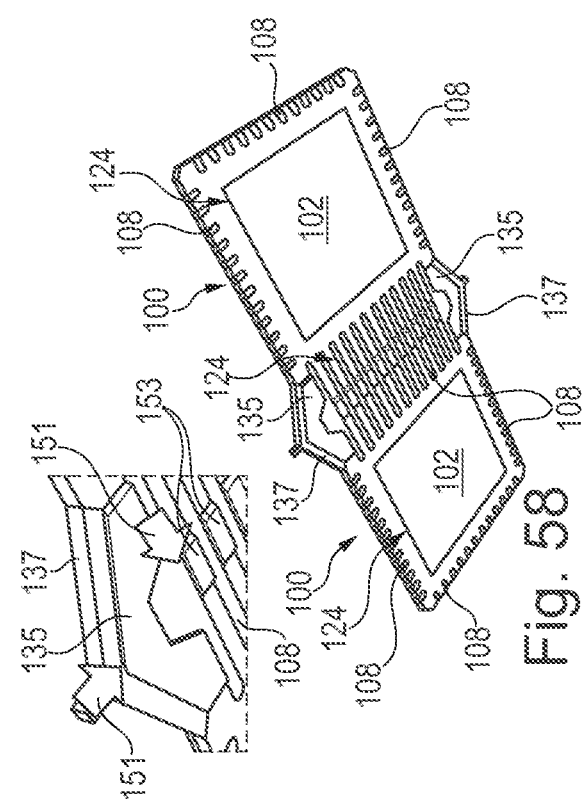
FIG. 57 shows a three-dimensional top view and a corresponding detail of still integrally connected pre-forms of packages according to an exemplary embodiment.
Figure 58:
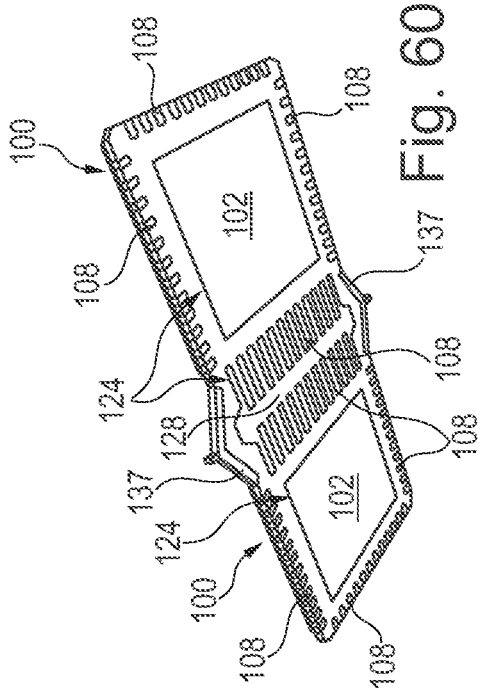
FIG. 58 shows a three-dimensional bottom view and a corresponding detail of the still integrally connected pre-forms of packages according to FIG. 57.

FIG. 57 shows a three-dimensional top view and a corresponding detail of still integrally connected pre-forms of packages 100 according to an exemplary embodiment. FIG. 58 shows a three-dimensional bottom view and a corresponding detail of the still integrally connected pre-forms of packages 100 according to FIG. 57.

FIG. 57 and FIG. 58 show a top and bottom reservoir concept having reservoirs 135 for accommodating excessive mold material both on the top side (see FIG. 57) as well as on the bottom side (compact FIG. 58). Descriptively speaking, the embodiment of FIG. 57 and FIG. 58 can be considered as a combination of the measures according to the embodiment of FIG. 53 and FIG. 54 and the embodiment of FIG. 55 and FIG. 56. Embodiments according to FIG. 57 and FIG. 58 may comprise reservoirs 135 between leads 108 and/or at corner leads (i.e. next to V-shaped lateral protrusion 137). Accordingly, for the FIGS. 57 and 58 embodiment, there are indentations 133 formed on both sides since both top and bottom reservoirs are used.

Figure 59:
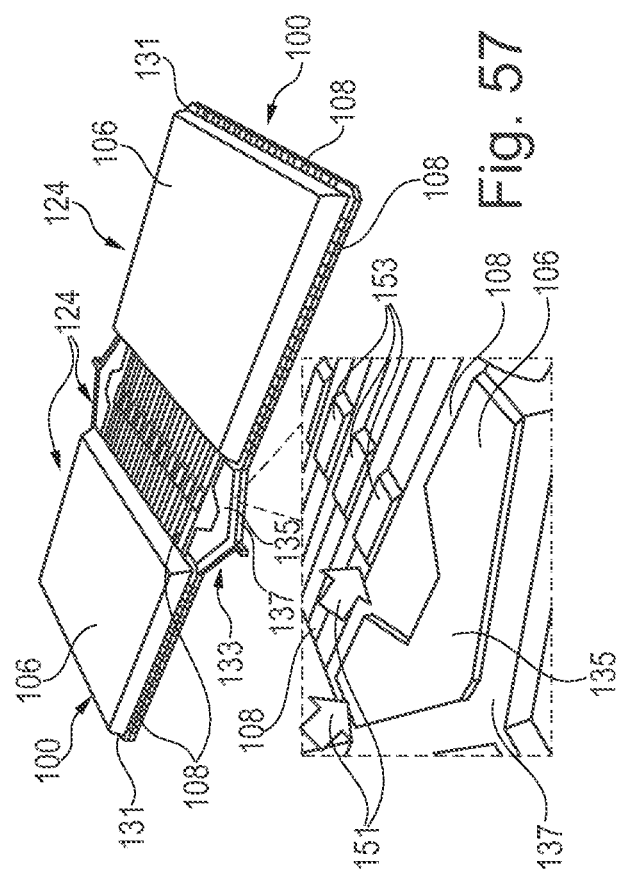
FIG. 59 shows a three-dimensional top view and a corresponding detail of still integrally connected pre-forms of packages according to still another exemplary embodiment.
Figure 60:
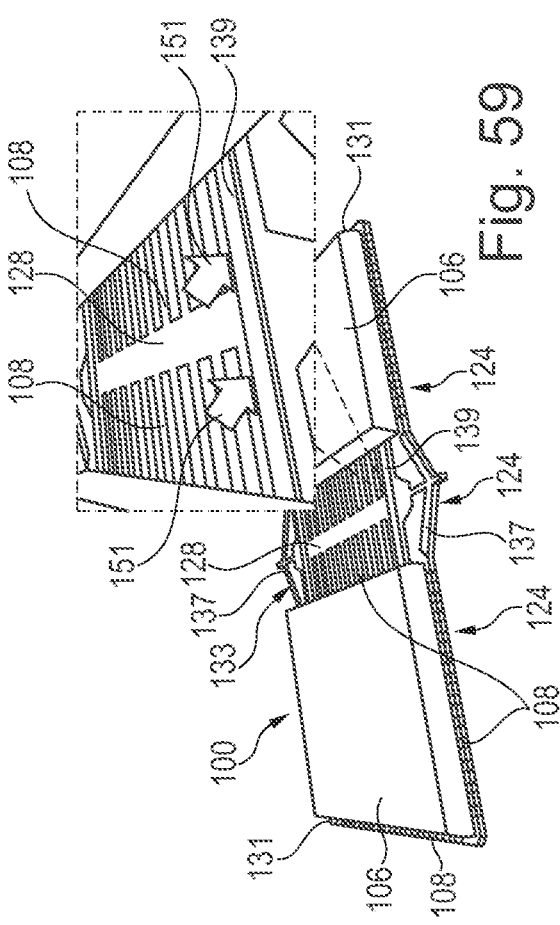
FIG. 60 shows a three-dimensional bottom view of the still integrally connected pre-forms of packages according to FIG. 59.

FIG. 59 shows a three-dimensional top view and a corresponding detail of still integrally connected pre-forms of packages 100 according to still another exemplary embodiment. FIG. 60 shows a three-dimensional bottom view of the still integrally connected pre-forms of packages 100 according to FIG. 59.

According to FIG. 59 and FIG. 60, the encapsulant body 124 and the oblong carrier body 120 as well as a corresponding mold tool are configured so that one or more continuous channels 139 are formed for channeling flowable encapsulant medium between adjacent preforms of packages 100 transverse to the illustrated indentations 133. As shown in FIG. 59, channel 139 is formed at a top side between the packages. Additionally or alternatively, one or more channels 139 may also be formed at a bottom side of the indentation 133. More than one continuous channel 139 between the leads 108 may also be used to channel encapsulant flow. In another embodiment, the channel approach may also be used in combination with top and/or bottom reservoir approaches for allowing the flow of encapsulant medium described in relation to over the reinforcing bar 128 and indentations 133 are formed as per the FIGS. 53-58 embodiments.

Advantageously, the method may comprise using a plurality of continuous channels 139 in spaces between respective leads 108 for channeling flowable encapsulant medium. For creating feature 173 (see for instance FIGS. 72 to 74 below), it may be possible to provide multiple canals or channels 139 utilizing space between leads 108. Four corners at protrusion 137 may also be preferred for utilizing space gained from protrusions 137.

With the mold channel concept according to FIG. 59 and FIG. 60, a through mold gate system can be configured with a channeled mold flow. Through mold gates enable a flow of mold over various selective half etched tie bar features in between leads 108. Hence, according to FIG. 59 and FIG. 60, the mold may flow, during encapsulating, between adjacent packages 100 through the channel(s) 139.

FIG. 61 shows a three-dimensional top view of still integrally connected pre-forms of packages 100 according to yet another exemplary embodiment. FIG. 62 shows a three-dimensional bottom view of the still integrally connected pre-forms of packages 100 according to FIG. 61.

Referring to the embodiment of FIG. 61 and FIG. 62, the encapsulant body 124 may be formed with a continuously planar upper main surface and a continuously planar lower main surface at and between adjacent packages 100 or preforms of packages 100. The foregoing may be achieved by using a mold tool that is shaped accordingly to provide for such an effect. Thus, the mold flow occurs through the full package thickness at and between the packages 100 according to FIG. 61 and FIG. 62. This can be accomplished by implementing an infuse mold gate system with which a mold gate flow is guided from unit to unit. Hence, a mold gate system may be merged with a quad-side package concept according to FIG. 61 and FIG. 62. Singularizing the oblong encapsulant bodies 124 according to FIG. 61 and FIG. 62 along separation lines perpendicular to the mold flow direction indicated with reference sign 151 in FIG. 61 may be executed by sawing through the high encapsulant thickness between adjacent packages. Singularizing along separation lines parallel to the mold flow direction indicated with reference sign 151 in FIG. 61 may be executed by punching.

A final package 100 manufactured in accordance with the embodiment of FIG. 61 and FIG. 62 may have an outline as illustrated in FIG. 64.

FIG. 63 shows a three-dimensional view of a package 100 with four steps 131 at four sides according to an exemplary embodiment. This embodiment may be formed when the infuse cavity molding concept is used in combination with one or more of the following approaches: top reservoir, bottom reservoir and/or channel approach such as the ones illustrated in FIGS. 53-60 and FIGS. 65-70. Hence, FIG. 63 illustrates a final package with top/bottom reservoir or combined top and bottom reservoir, and canal type.

The illustrated leadless package 100 has a quad-flat-no-leads design and comprises a carrier 102 and an electronic component 104 mounted on the carrier 102. Carrier 102 and component 104 are not visible in the molded state according to FIG. 63. A mold compound-type encapsulant 106 encapsulates the electronic component 104 and part of the carrier 102 (as shown for instance in FIG. 54, a bottom surface of the carrier 102 may be exposed with respect to the encapsulant 106 at a bottom side of the package 100 which is not visible in FIG. 63). Leads 108 extend along four sides around the carrier 102, are electrically coupled with the electronic component 104 and extend beyond the encapsulant 106 along all four sides. According to FIG. 63, the encapsulant 106 comprises steps 131 along all four sides so that end portions of said leads 108 are exposed at a top surface, a bottom surface and a lateral surface of each respective step 131. At lateral surfaces of each respective step 131, exposed surfaces of the leads 108 and exposed surfaces of the encapsulant 106 are aligned and form a planar vertical wall section. This is the result of the formation of indentations 133 at an oblong encapsulant body 124 (see FIG. 53) and of a singulation of the package 100 by punching along all four sides.

As will be described in further detail referring to FIG. 66 to FIG. 68, sections of the leads 108 and sections of the encapsulant 106 at a respective step 131 may extend up to different vertical levels at said top surface and/or at said bottom surface. This may be a consequence of reservoirs 135 in regions of indentations 133 and/or channels 139, as explained above with reference to FIG. 53 to FIG. 60. However, the sections of the leads 108 and the sections of the encapsulant 106 are aligned at a lateral surface of the respective step 131 connecting said top surface with said bottom surface. Such a geometry may be obtained as a result of singularizing, for instance by punching.

FIG. 64 shows a three-dimensional view of a package 100 with two steps 131 and two vertical sidewalls 141 at four sides according to an exemplary embodiment where the infused mold gate system is used for molding.

A difference between the package 100 according to FIG. 64 and the package 100 according to FIG. 63 is that, in the embodiment according to FIG. 64, the encapsulant 106 comprises steps 131 along only two opposing of said four sides, whereas the encapsulant 106 has stepless (for instance vertical or slanted) sidewalls 141 at the other two opposing of said four sides. Along the stepped sides, singulation may be accomplished by punching due to the relatively thin encapsulant thickness. This ensures a fast separation process. Along the stepless sides, singulation may be accomplished by sawing due to the relatively large encapsulant thickness present between adjacent units when the infuse mold gate system is used.

Figure 65:
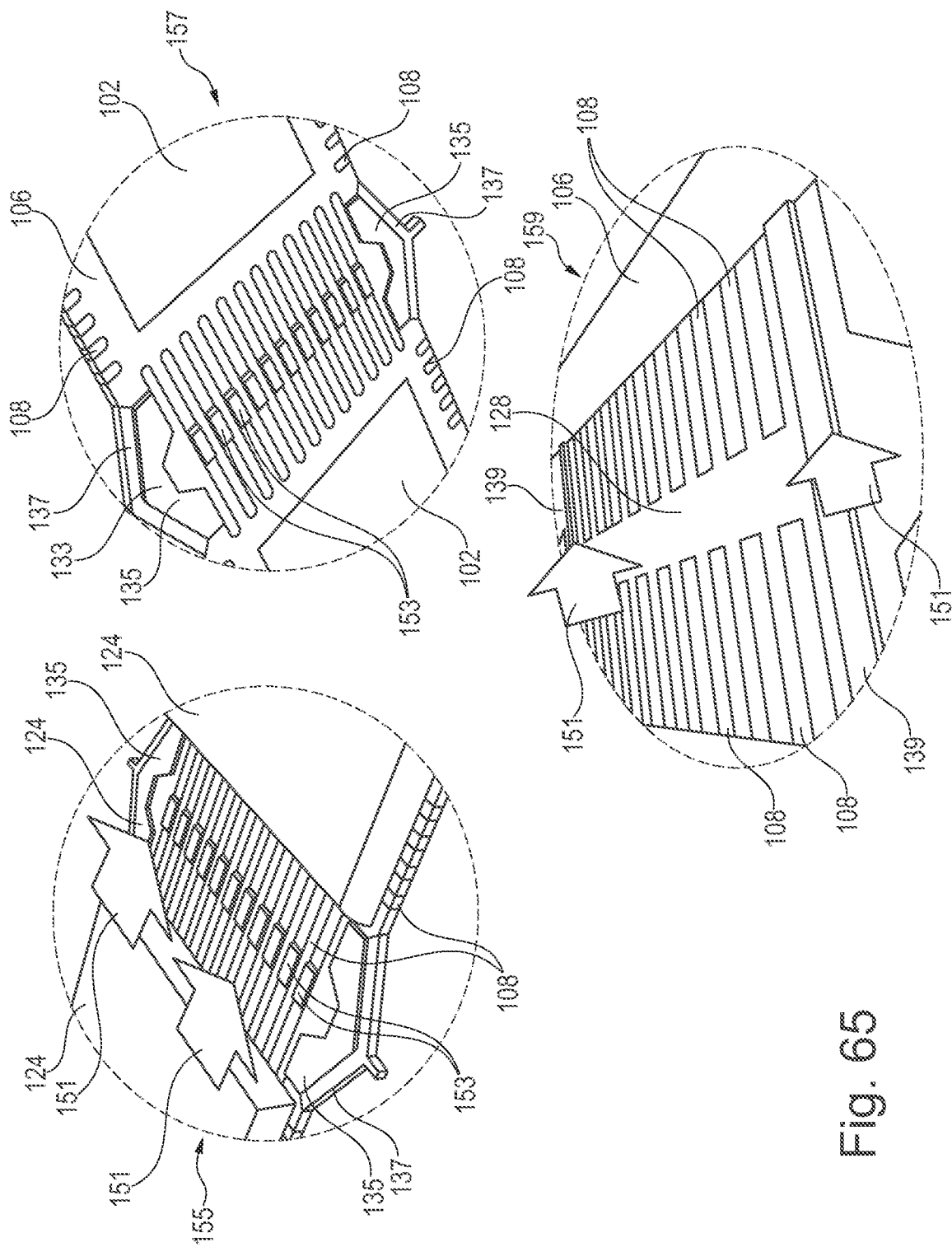
FIG. 65 illustrates details of connection regions between adjacent preforms of packages according to exemplary embodiments.

FIG. 65 illustrates details 155, 157 and 159 of connection regions between adjacent preforms of packages 100 according to an exemplary embodiment. Detail 155 relates to the embodiment of FIG. 53. Detail 157 relates to the embodiment of FIG. 56. Detail 159 relates to the embodiment of FIG. 59.

According to the previously described embodiments, a quad-sided leadless (QFN) semiconductor packaging concept is provided which allows ultra-high density manufacturing of packages 100. In this context, it may be advantageously possible to use a direct mold gate system implementing an infuse cavity molding concept. In an advantageous embodiment, a mold flow may be guided from one package 100 to another via a space between leads 108, forming a multiple entry gate with one or more reservoirs 135. In particular, it may be possible to form one or more reservoirs 135 only on the top side, only on the bottom side, or both on the top side and on the bottom side. In another advantageous embodiment, it may also be possible to guide a mold flow from one package 100 to another via a space between leads 108, forming a multiple entry gate with one or more channels 139. Preferably, each respective channel 139 may have the same thickness as the patterned metal plate 130 (in particular embodied as leadframe).

Figure 66:
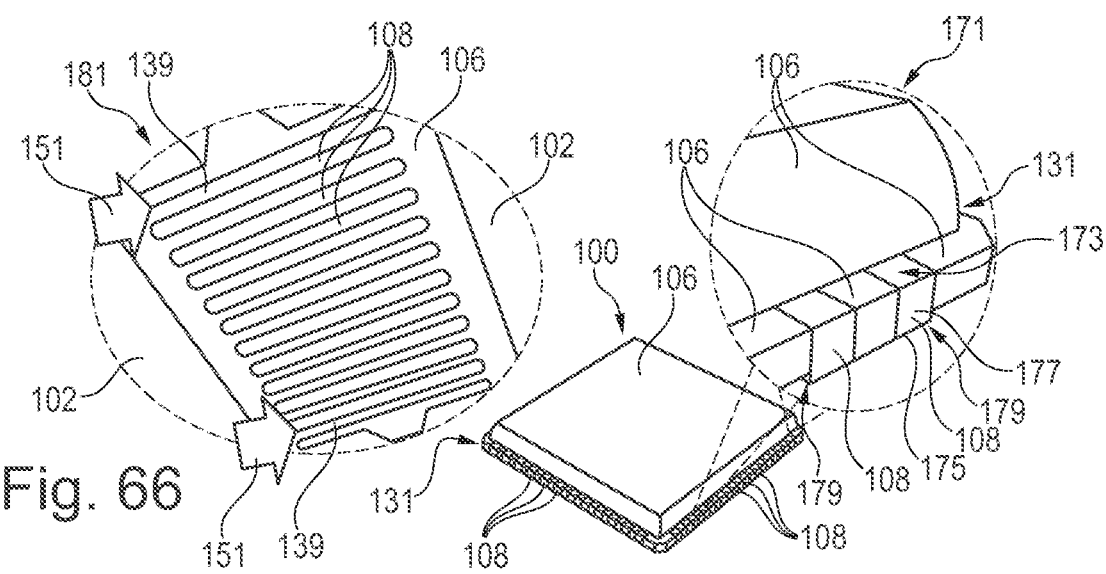
FIG. 66 illustrates a detail of the geometry of a step at an edge of a package according to an exemplary embodiment.

FIG. 66 illustrates a detail 171 of the geometry of a step 131 at an edge of a package 100 according to an exemplary embodiment.

According to FIG. 66 and in particular referring to the illustrated detail 171, the encapsulant 106 comprises steps 131 along all four sides so that end portions of the leads 108 are exposed at a top surface 173, a bottom surface 175 and a lateral surface 177 of each respective step 131. At the step 131 of the package 100 shown in detail 171, sequences of sections of the leads 108 and sequences of the sections of the encapsulant 106 are arranged alternatingly.

At lateral surface 177 of each respective step 131, exposed surfaces of the leads 108 and exposed surfaces of the encapsulant 106 are aligned and form a planar vertical wall section. At top surface 173 of each respective step 131, exposed surfaces of the leads 108 and exposed surfaces of the encapsulant 106 are aligned and form a planar horizontal wall section. This is the result of the formation of indentations 133 at an oblong encapsulant body 124 and of a singulation of the package 100 by punching along all four sides.

As already mentioned, all sections of the leads 108 and all sections of the encapsulant 106 at the illustrated step 131 extend up to the same vertical level at said top surface 173, and all sections of the leads 108 and all sections of the encapsulant 106 at the illustrated step 131 extend up to the same position at said lateral surface 177. However, sections of the encapsulant 106 at the illustrated step 131 extend up to different vertical levels at the bottom surface 175 of the step 131. In the shown embodiment and as illustrated with reference sign 179, two sections of the leads 108 with one section of the encapsulant 106 in between protrude downwardly with respect to adjacent sections of the encapsulant 106. As illustrated with reference sign 181, package 100 according to FIG. 66 has been manufactured by creating bottom-sided channels 139, which contributes to the described geometry. FIG. 67 illustrates a detail 183 of the geometry of a step 131 at an edge of a package 100 according to another exemplary embodiment.

Figure 67:
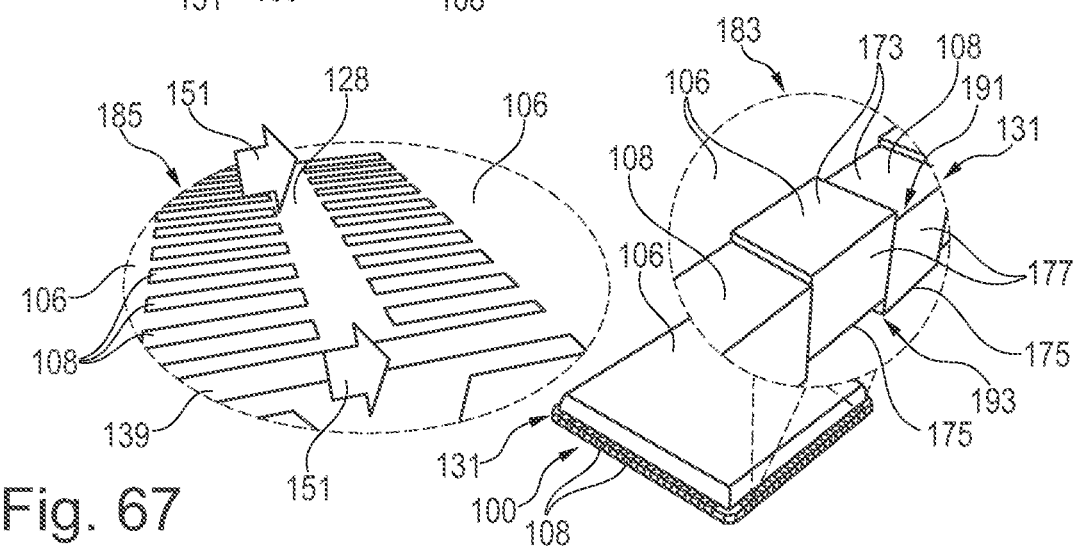
FIG. 67 illustrates a detail of the geometry of a step at an edge of a package according to another exemplary embodiment.

According to FIG. 67 and in particular referring to the illustrated detail 183, the encapsulant 106 comprises steps 131 along all four sides so that end portions of the leads 108 are exposed at a top surface 173, a bottom surface 175 and a lateral surface 177 of each respective step 131. At the step 131 of the package 100, sequences of sections of the leads 108 and sequences of the sections of the encapsulant 106 are arranged alternatingly.

At lateral surface 177 of each respective step 131, exposed surfaces of the leads 108 and exposed surfaces of the encapsulant 106 are aligned and form a planar vertical wall section.

However, sections of the encapsulant 106 at the illustrated step 131 extend up to different vertical levels at the top surface 173 of the step 131. In the shown embodiment and as illustrated with reference sign 191, one section of the encapsulant 106 protrudes upwardly at top surface 173 with regard to two neighbored sections of the leads 108.

Furthermore, sections of the encapsulant 106 at the illustrated step 131 extend up to different vertical levels at the bottom surface 175 of the step 131. As illustrated with reference sign 193, the aforementioned two neighbored sections of the leads 108 protrude downwardly at bottom surface 175 with regard to the aforementioned one section of the encapsulant 106 in between.

As illustrated with reference sign 185, package 100 according to FIG. 67 has been manufactured by creating top-sided channels 139, which contributes to the described geometry.

Figure 68:
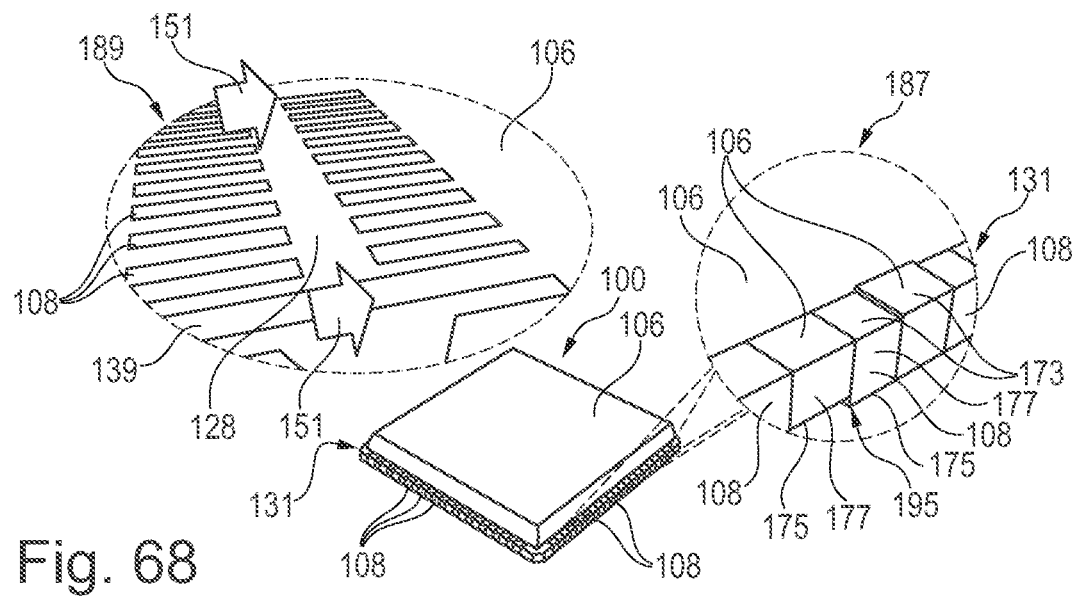
FIG. 68 illustrates a detail of the geometry of a step at an edge of a package according to still another exemplary embodiment.

FIG. 68 illustrates a detail 187 of the geometry of a step 131 at an edge of a package 100 according to still another exemplary embodiment.

According to FIG. 68 and in particular referring to the illustrated detail 187, the encapsulant 106 comprises steps 131 along all four sides so that end portions of the leads 108 are exposed at a top surface 173, a bottom surface 175 and a lateral surface 177 of each respective step 131. At the step 131 of the package 100 shown in detail 187, sequences of sections of the leads 108 and sequences of the sections of the encapsulant 106 are arranged alternatingly.

At lateral surface 177 of each respective step 131, exposed surfaces of the leads 108 and exposed surfaces of the encapsulant 106 are aligned and form a planar vertical wall section. At top surface 173 of each respective step 131, exposed surfaces of the leads 108 and exposed surfaces of the encapsulant 106 are aligned and form a planar horizontal wall section.

However, a section of the encapsulant 106 at the illustrated step 131 extends up to a different vertical level at the bottom surface 175 of the step 131 as compared to neighbored sections of the leads 108. In the shown embodiment and as illustrated with reference sign 195, two sections of the leads 108 between which the one section of the encapsulant 106 is arranged protrude downwardly with respect to said section of the encapsulant 106. As illustrated with reference sign 189, package 100 according to FIG. 68 has been manufactured by creating bottom-sided channels 139, which contributes to the described geometry.

Figure 69:
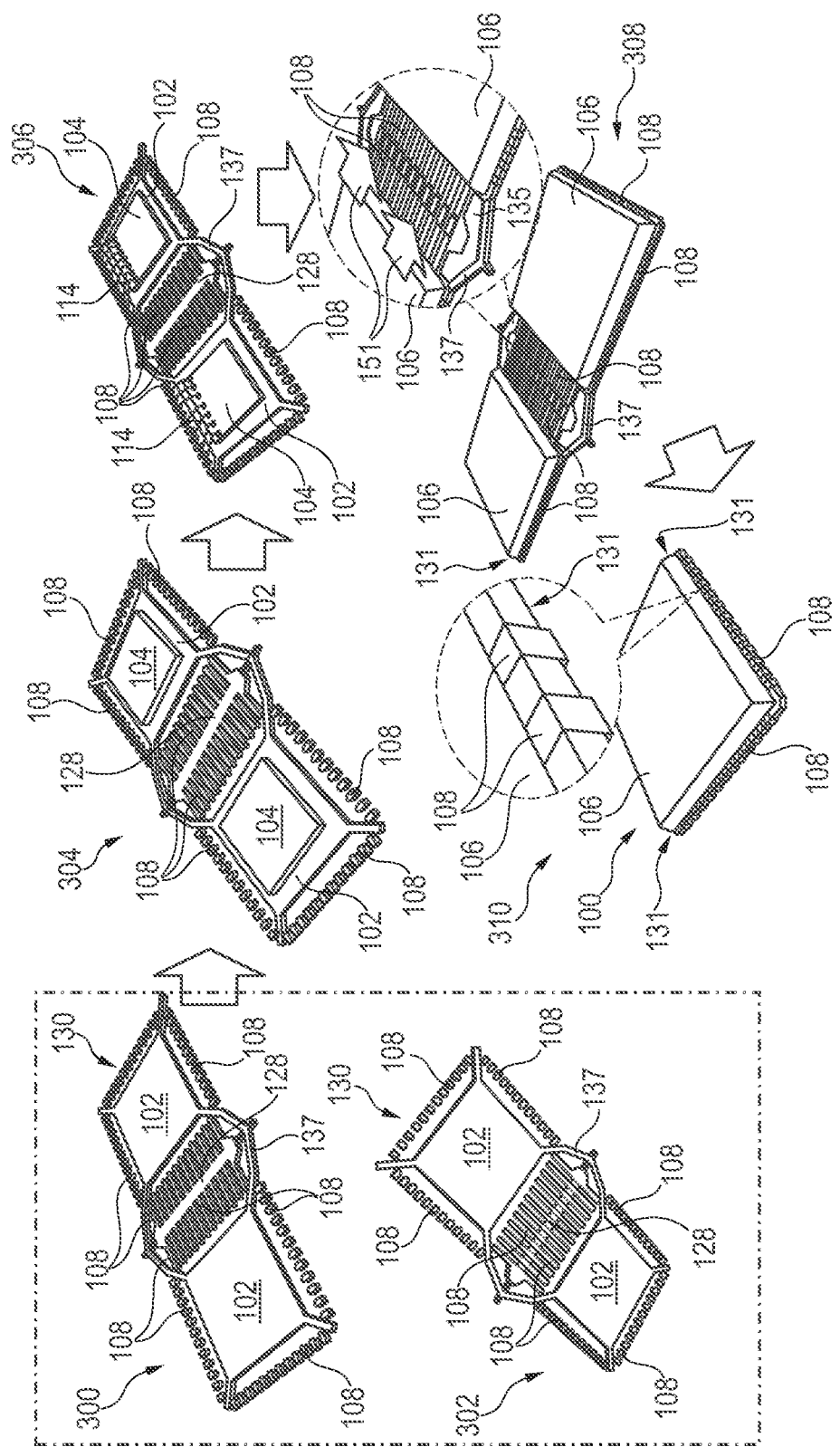
FIG. 69 shows structures obtained during manufacturing packages according to exemplary embodiments of FIG. 53 and FIG. 54.

FIG. 69 shows structures obtained during manufacturing packages 100 according to exemplary embodiments of FIG. 53 and FIG. 54. Reference sign 300 shows a top view and reference sign 302 shows a bottom view of the leadframe-type patterned metal plate 130 shown in FIG. 50. Reference sign 304 relates to a die attach process, i.e. a process of mounting electronic components 104 on a respective carrier 102. In a wire bond process according to reference sign 306, electrically conductive interconnect bodies 114 (bond wires in the shown embodiment) are arranged to connect leads 108 with pads of the respective electronic component 104. Reference sign 308 shows a top side of the obtained preform of packages 100 during encapsulation, here embodied as molding. After singulation as illustrated with reference sign 310, individual packages 100 are obtained. Control of a mold flow during encapsulation is supported by a top reservoir 135 according to FIG. 69.

Figure 70:
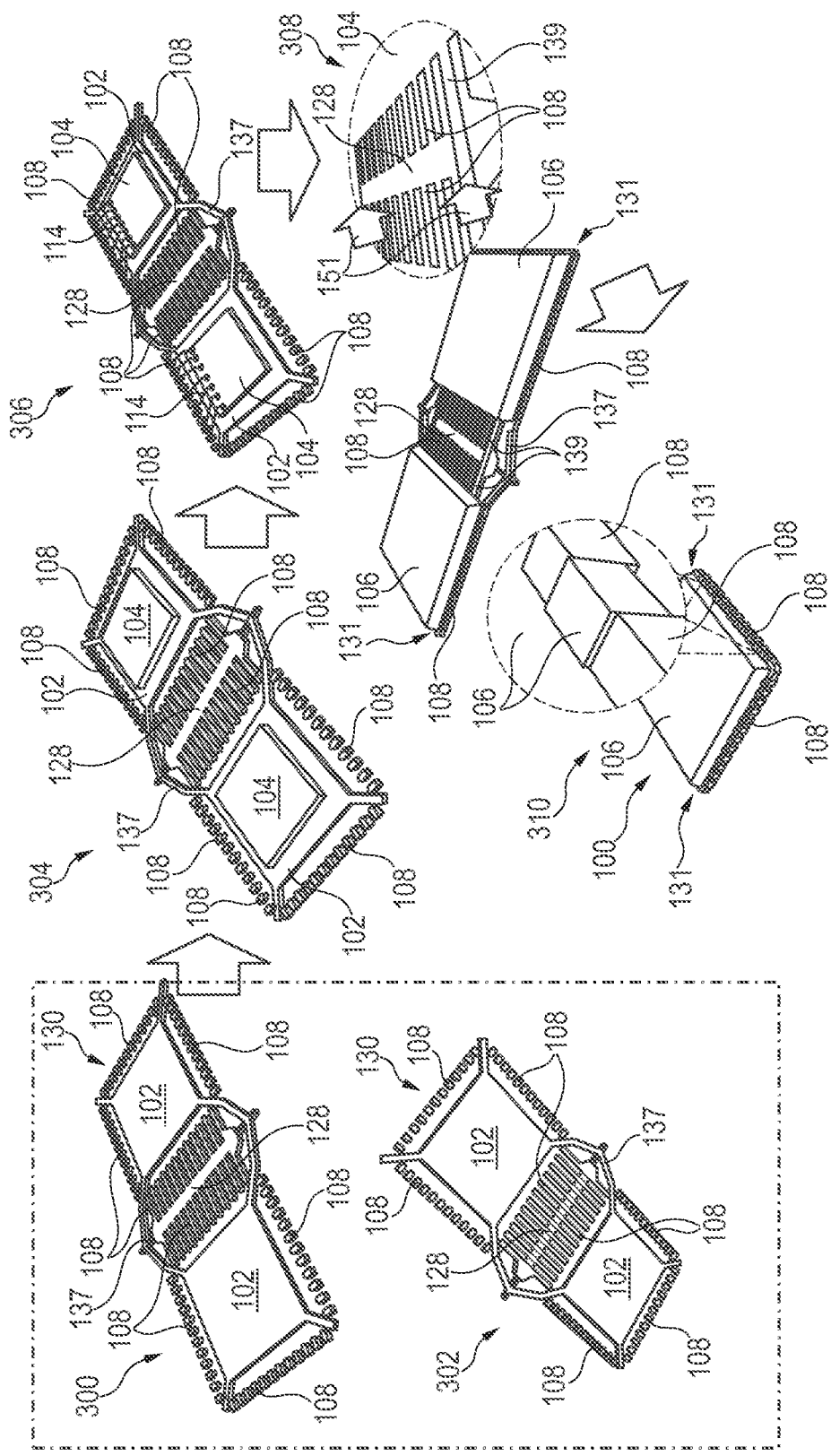
FIG. 70 shows structures obtained during manufacturing packages according to exemplary embodiments of FIG. 59 and FIG. 60.

FIG. 70 shows structures obtained during manufacturing packages 100 according to exemplary embodiments of FIG. 59 and FIG. 60. The structures and processes described referring to FIG. 69 with reference signs 300, 302, 304, 306, 308, 310 apply, mutatis mutandis, also to FIG. 70. However, a top canal or channel 139 is foreseen according to FIG. 70 for controlling a mold-type encapsulation process.

Figure 71:
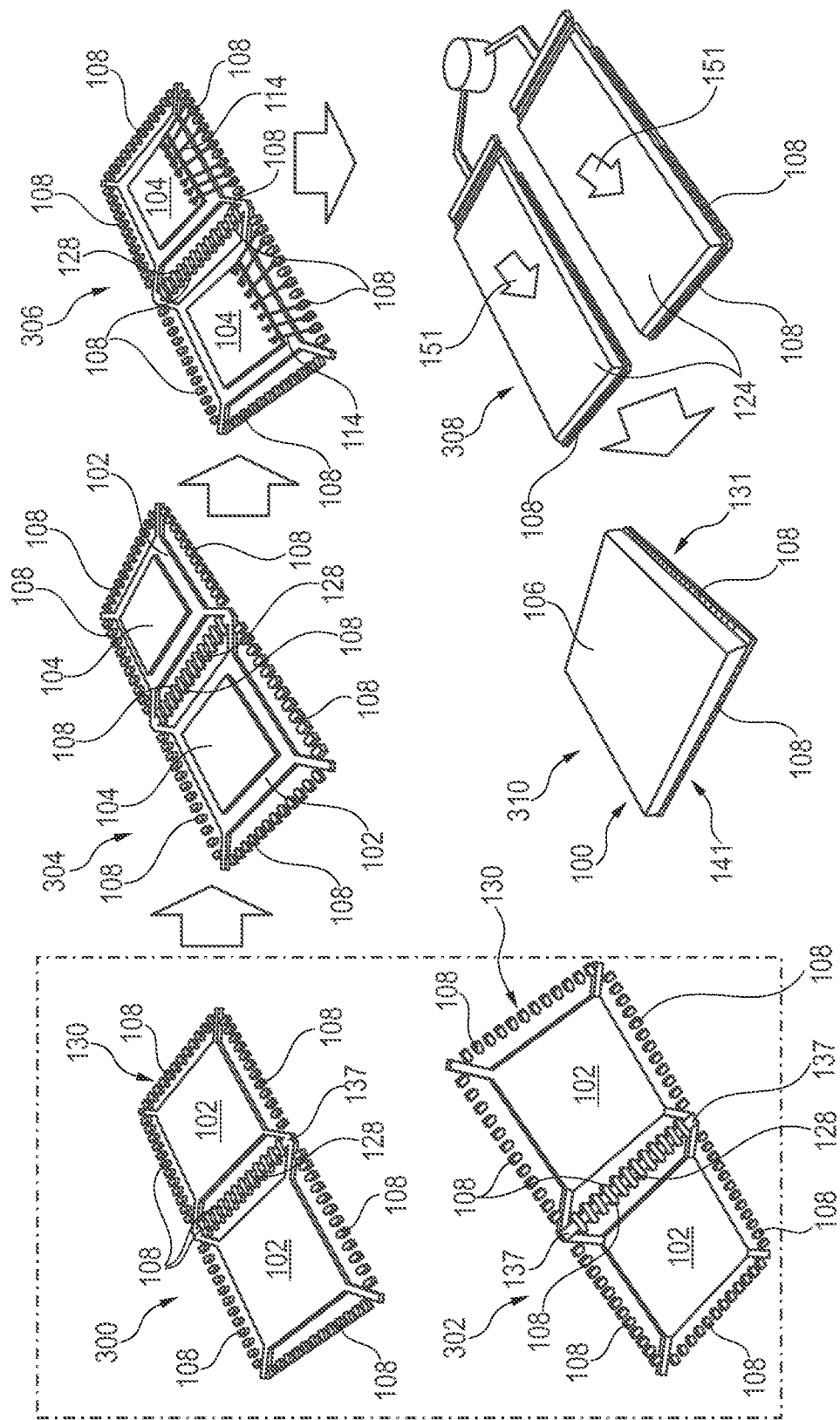
FIG. 71 shows structures obtained during manufacturing packages according to exemplary embodiments of FIG. 61 and FIG. 62.

FIG. 71 shows structures obtained during manufacturing packages 100 according to exemplary embodiments of FIG. 61 and FIG. 62. The structures and processes described referring to FIG. 69 with reference signs 300, 302, 304, 306, 308, 310 apply, mutatis mutandis, also to FIG. 71. However, a mold gate flow from unit to unit is realized according to FIG. 71 during a mold-type encapsulation process. The final package 100 comprises two edges with steps 131 (also denoted as protruding edges) and two edges with vertical sidewalls 141 (also denoted as flat edges). Such a package 100 is formed by punching at steps 131 and sawing at vertical sidewalls 141 during singulation.

FIG. 72 shows a detail 312 of a step 131 at an edge of a package 100 manufactured using a mold reservoir 135 according to an exemplary embodiment.

Illustrated detail 312 relates to a shaping of step 131 created by punch singulation of packages 100 formed with a reservoir-based control of an encapsulation process.

FIG. 73 shows details 314, 316, 318 of a respective step 131 at an edge of a package 100 manufactured using a mold channel 139 according to an exemplary embodiment.

Illustrated detail 314 relates to a shaping of step 131 created by punch singulation of packages 100 formed with a top channel-based control of an encapsulation process. Mold compound is shown between leads 108 and being protruded above both at its lower surface and its upper surface.

Illustrated detail 316 relates to a shaping of step 131 created by punch singulation of packages 100 formed with a bottom channel-based control of an encapsulation process. Mold compound is shown between leads 108 all being protruded downwardly at a bottom side with respect to other sections of the mold compound. At the upper side, all mold and lead sections are aligned.

Illustrated detail 318 relates to a shaping of step 131 created by punch singulation of packages 100 formed with a top and bottom channel-based control of an encapsulation process. The geometry of the obtained mold sections between lead sections is a combination of what is shown in details 314, 316.

FIG. 74 shows details of a step 131 at an edge of a package 100 manufactured using an infuse mold gate according to an exemplary embodiment.

The illustrated package 100 has two opposing flat edges with vertical sidewalls 141 and has two opposing protruding edges with steps 131. A detail 320 illustrates a geometry at a step 131, whereas a detail 322 illustrates a geometry at a vertical sidewall 141.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:
1. A package, comprising:
a dielectric carrier;
an electronic component mounted on the dielectric carrier;
an encapsulant encapsulating at least part of the dielectric carrier and the electronic component,
an electrically conductive layer exposed beyond the encapsulant, such that each sidewall and a bottom surface of the electrically conductive layer are uncovered by the encapsulant, and the electrically conductive layer is connected with the electronic component, and at least one lead electrically coupled with the electronic component and extending beyond the encapsulant wherein the dielectric carrier is an electrically insulating tape, and wherein the electronic component is in direct contact with the electrically insulating tape.

2. The package of claim 1, wherein the package is configured as a tie bar-less package.

3. The package of claim 1, further comprising a metallization exposed at a sidewall of the encapsulant and being accessible for lead tip inspection.

4. The package of claim 1, wherein a material of the dielectric carrier is thermally conductive.

5. The package of claim 1, wherein the dielectric carrier is completely free of any metal or other electrically conductive structure.

6. The package of claim 1, wherein the dielectric carrier consists of dielectric or electrically insulating material.

7. A package, comprising:
an electronic component;
an encapsulant encapsulating at least part of the electronic component;
an electrically conductive layer exposed beyond the encapsulant, such that each sidewall and a bottom surface of the electrically conductive layer are uncovered by the encapsulant, and the electrically conductive layer is connected with the electronic component; and
at least one lead electrically coupled with the electronic component and extending beyond the encapsulant.

8. The package of claim 7, wherein the package is configured as a tie bar-less package.

9. The package of claim 7, further comprising a metallization exposed at a sidewall of the encapsulant and being accessible for lead tip inspection.

10. The package of claim 7, wherein the electrically conductive layer forms a carrier on which the electronic component is mounted, the package further comprising:

a plurality of leads extending along four sides around the carrier, being electrically coupled with the electronic component and extending beyond the encapsulant along all four sides.

11. The package of claim 10, wherein the encapsulant comprises steps along at least two opposing ones of the four sides so that portions of the leads are exposed at a top surface, a bottom surface, and a lateral surface of each respective step.

12. The package of claim 11, wherein sections of the leads and sections of the encapsulant at a respective step extend up to different vertical levels with respect to the leads at the top surface and/or at the bottom surface.

13. The package of claim 7, wherein the electrically conductive layer partially covers the encapsulant.

14. A package, comprising:
an electronic component;
an encapsulant encapsulating at least part of the electronic component;
a plurality of leads electrically coupled with the electronic component and extending beyond two opposing sides of the encapsulant; and
a lead tip inspection metallization exposed beyond the encapsulant on at least one sidewall of the encapsulant,
wherein the lead tip inspection metallization is exposed beyond a first main side of the encapsulant and extends uninterrupted along a first plane coplanar with the first main side of the encapsulant onto a second plane coplanar with the at least one sidewall of the encapsulant, and
wherein the at least one sidewall is arranged at another side of the encapsulant than the two opposing sides at which the leads extend beyond the encapsulant.

15. The package of claim 14, wherein the exposed lead tip inspection metallization forms part of a carrier on which the electronic component is mounted.

* * * * *